US012757433B2

(12) United States Patent
Tsai et al.

(10) Patent No.: US 12,757,433 B2
(45) Date of Patent: Oct. 6, 2026

(54) SEMICONDUCTOR DEVICE STRUCTURE WITH BUTTED-CONTACT AND METHODS OF FORMING THE SAME

(71) Applicant: TAIWAN SEMICONDUCTOR MANUFACTURING COMPANY, LTD., Hsinchu (TW)

(72) Inventors: Kuo-Chiang Tsai, Hsinchu (TW); Jeng-Ya Yeh, New Taipei (TW); Mu-Chi Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 517 days.

(21) Appl. No.: 18/206,267

(22) Filed: Jun. 6, 2023

(65) Prior Publication Data

US 2024/0413217 A1 Dec. 12, 2024

(51) Int. Cl.

| | |
|---|---|
| ***H10D 30/62*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ..... *H10D 30/6219* (2025.01); *H10D 84/0186* (2025.01); *H10D 84/0193* (2025.01); *H10D 84/038* (2025.01); *H10D 84/853* (2025.01)

(58) Field of Classification Search

CPC ........... H10D 30/6219; H10D 84/0186; H10D 84/853; H10D 84/038; H10D 84/0193

See application file for complete search history.

(56) References Cited

U.S. PATENT DOCUMENTS

| | | | |
|---|---|---|---|
| 5,955,768 A | 9/1999 | Liaw et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,564,433 B2 | 2/2017 | Liaw | |
| 9,576,814 B2 | 2/2017 | Wu et al. | |
| 9,806,070 B2 | 10/2017 | Liaw | |
| 9,831,183 B2 | 11/2017 | Lin et al. | |
| 9,859,386 B2 | 1/2018 | Ho et al. | |
| 2011/0294292 A1* | 12/2011 | Adetutu | H01L 21/76807 257/E21.585 |
| 2021/0098468 A1* | 4/2021 | Chen | H10D 89/10 |

(Continued)

FOREIGN PATENT DOCUMENTS

| | | |
|---|---|---|
| TW | 202201726 A | 1/2022 |

*Primary Examiner* — Christine A Enad

(74) *Attorney, Agent, or Firm* — NZ Carr Law Office

(57) ABSTRACT

Embodiments of the present disclosure relates to a semiconductor device structure. The structure includes a first source/drain feature, a first interlayer dielectric (ILD) disposed over the first source/drain feature, a first conductive feature extending through the first ILD and in electrical contact with the first source/drain feature, and a gate electrode layer extending through the first ILD and disposed adjacent the first conductive feature, wherein a top surface of the first conductive feature and a top surface of the gate electrode layer are substantially co-planar.

20 Claims, 44 Drawing Sheets

(56) References Cited

U.S. PATENT DOCUMENTS

| | | | | |
|---|---|---|---|---|
| 2022/0271130 | A1 * | 8/2022 | Su | H10D 64/01 |
| 2023/0121210 | A1 * | 4/2023 | Wang | H10D 84/85 257/774 |

* cited by examiner

SEMICONDUCTOR DEVICE STRUCTURE WITH BUTTED-CONTACT AND METHODS OF FORMING THE SAME

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, the critical dimension (CD) between adjacent contact features becomes smaller. To achieve high performance of integrated circuits (ICs), the higher resistance and parasitic capacitance due to the smaller CD to neighboring metal features in the back-end-of-line (BEOL) has become a critical issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-16A and 18A-24A are cross-sectional side views of various stages of manufacturing the semiconductor device structure of FIG. 4 taken along cross-section A-A, in accordance with some embodiments.

FIGS. 5B-16B and 18B-24B are cross-sectional side views of various stages of manufacturing the semiconductor device structure of FIG. 4 taken along cross-section B-B, in accordance with some embodiments.

FIGS. 9C-15C and 18C-23C are top views of a portion of the semiconductor device structure shown in FIGS. 9B-15B and 18B-23B, respectively.

DETAILED DESCRIPTION

Figure 1:
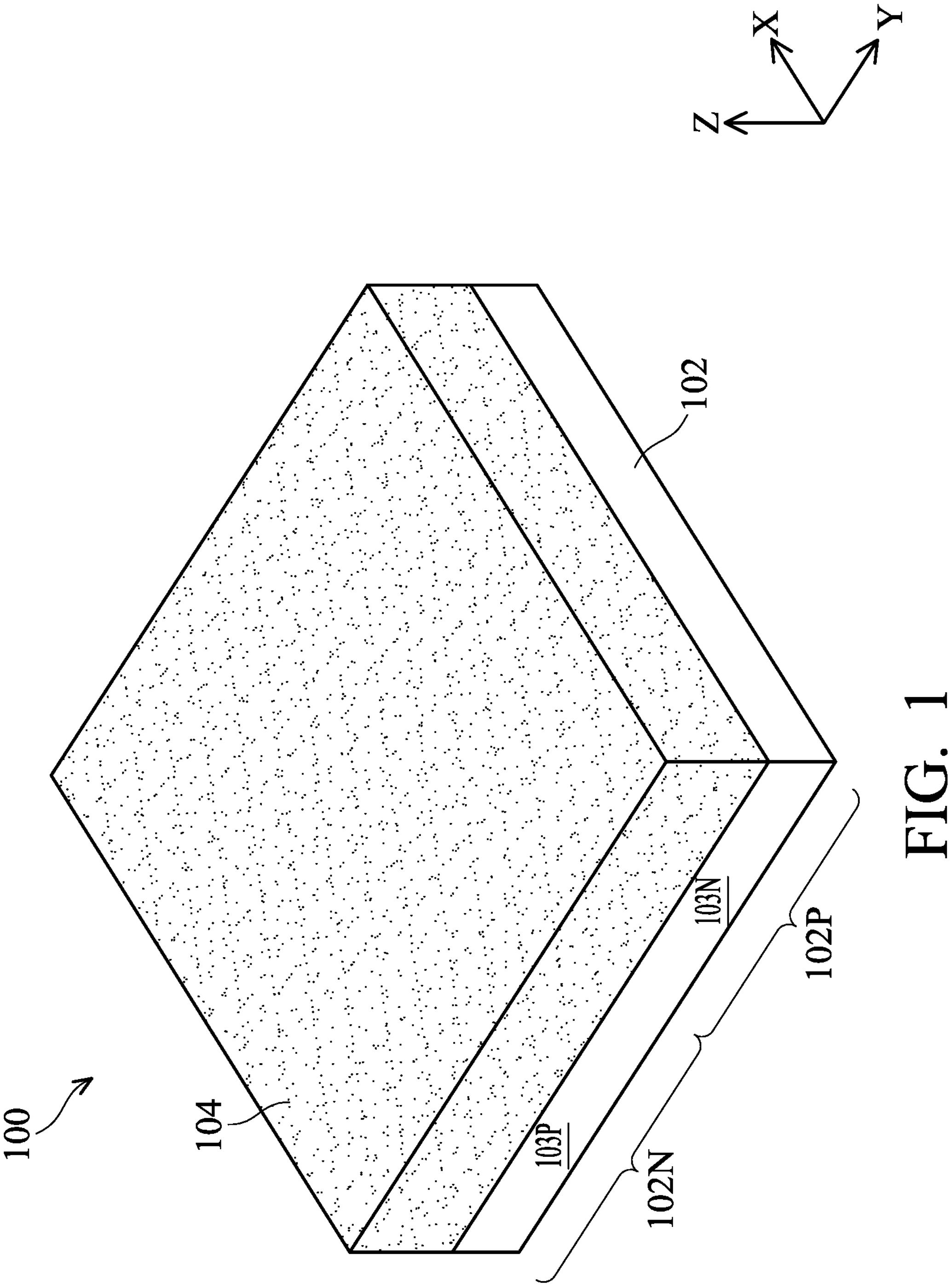
FIGS. 1-4 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-26 illustrate various stages of manufacturing a semiconductor device structure 100 in accordance with various embodiments of this disclosure. It is understood that additional operations can be provided before, during, and after processes shown by FIGS. 1-26 and some of the operations described below can be replaced or eliminated, for additional embodiments of the method. The order of the operations/processes may be interchangeable.

FIGS. 1-4 are perspective views of various stages of manufacturing a semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type region 102P and an N-type region 102N adjacent to the P-type region 102P, and the P-type region 102P and N-type region 102N belong to a continuous substrate 102, in accordance with some embodiments. In some embodiments of the present disclosure, the P-type region 102P is used to form a PMOS device thereon, whereas the N-type region 102N is used to form an NMOS device thereon. In some embodiments, an N-well region 103N and a P-well region 103P are formed in the substrate 102, as shown in FIG. 1. For example, the N-well region 103N may be formed in the substrate 102 in the P-type region 102P, whereas the P-well region 103P may be formed in the substrate 102 in the N-type region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In one exemplary embodiment, the first semiconductor layer 104 is made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (CI-VPE), or any other suitable process.

Figure 2:
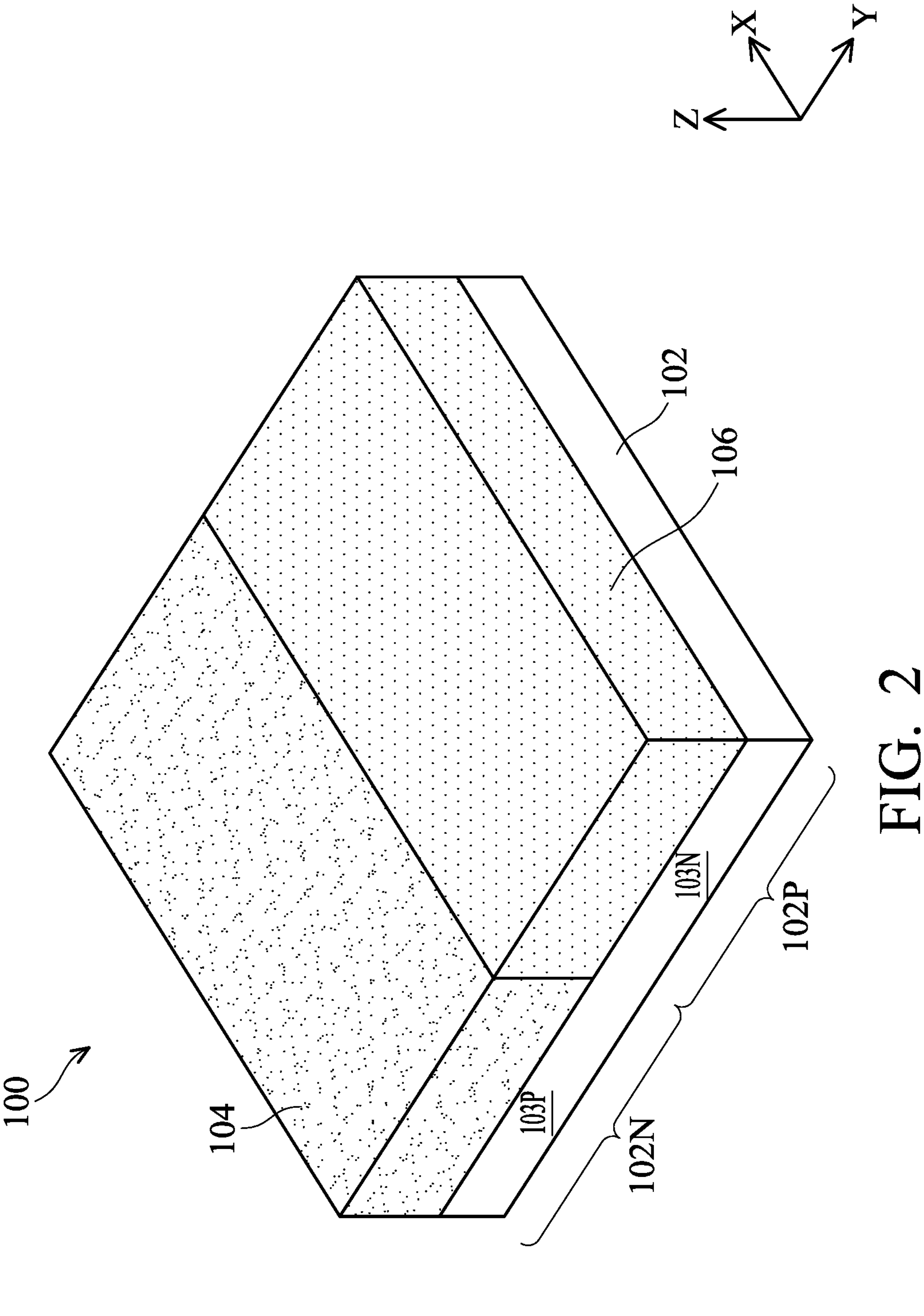

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In one exemplary embodiment, the second semiconductor layer 106 is made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the N-type region 102N, and the second semiconductor layer 106 is disposed over the N-well region 103N in the P-type region 102P.

Portions of the first semiconductor layer 104 may serve as channels in the subsequently formed NMOS device in the N-type region 102N. Portions of the second semiconductor layer 106 may serve as channels in the subsequently formed PMOS device in the P-type region 102P. In some embodiments, the NMOS device and the PMOS device are FinFETs. While embodiments described in this disclosure are described in the context of FinFETs, implementations of some aspects of the present disclosure may be used in other processes and/or in other devices, such as planar FETs, dual-gate FETs, tri-gate FETS, nanosheet channel FETs, forksheet FETs, Horizontal Gate All Around (HGAA) FETs, Vertical Gate All Around (VGAA) FETs, complementary FETs, negative-capacitance FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
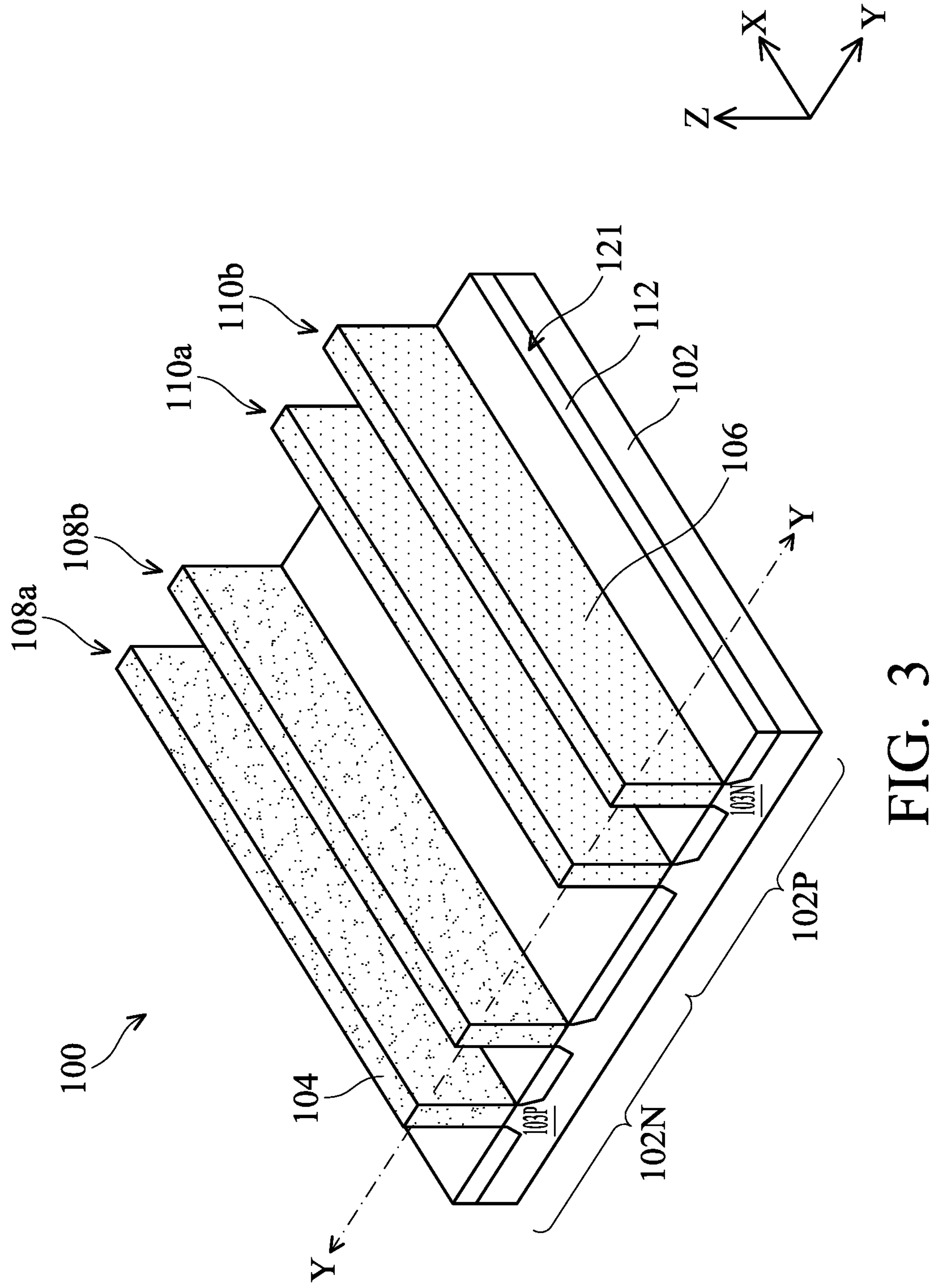

In FIG. 3, a plurality of fins 108*a*, 108*b*, 110*a*, 110*b* are formed from the first and second semiconductor layers 104, 106, respectively, and STI regions 121 are formed. The fins 108*a*, 108*b*, 110*a*, 110*b* may be patterned by any suitable method. For example, the fins 108*a*, 108*b*, 110*a*, 110*b* may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108*a*, 108*b* may each include the first semiconductor layer 104, and a portion of the first semiconductor layer 104 may serve as an NMOS channel. Each fin 108*a*, 108*b* may also include the P-well region 103P. Likewise, the fins 110*a*, 110*b* may each include the second semiconductor layer 106, and a portion of the second semiconductor layer 106 may serve as a PMOS channel. Each fin 110*a*, 110*b* may also include the N-well region 103N. A mask (not shown) may be formed on the first and second semiconductor layers 104, 106, and may remain on the fins 108*a-b* and 110*a-b*.

Once the fins 108*a-b*, 110*a-b* are formed, an insulating material 112 is formed between adjacent fins 108*a-b*, 110*a-b*. The insulating material 112 may be first formed between adjacent fins 108*a-b*, 110*a-b* and over the fins 108*a-b*, 110*a-b*, so the fins 108*a-b*, 110*a-b* are embedded in the insulating material 112. A planarization process, such as a chemical-mechanical polishing (CMP) process may be performed to expose the top of the fins 108*a-b*, 110*a-b*. In some embodiments, the planarization process exposes the top of the mask (not shown) disposed on the fins 108*a-b* and 110*a-b*. The insulating material 112 are then recessed by removing a portion of the insulating material 112 located on both sides of each fin 108*a-b*, 110*a-b*. The insulating material 112 may be recessed by any suitable removal process, such as dry etch or wet etch that selectively removes the insulating material 112 but does not substantially affect the semiconductor materials of the fins 108*a-b*, 110*a-b*. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD). The insulating material 112 may be shallow trench isolation (STI) region, and is referred to as STI region 121 in this disclosure.

In some alternative embodiments, instead of forming first and second semiconductor layers 104, 106 over the substrate 102, the fins 108*a-b*, 110*a-b* may be formed by first forming isolation regions (e.g., STI regions 121) on a bulk substrate (e.g., substrate 102). The formation of the STI regions may include etching the bulk substrate to form trenches, and filling the trenches with a dielectric material to form the STI regions. The portions of the substrate between neighboring STI regions form the fins. The top surfaces of the fins and the top surfaces of the STI regions may be substantially level with each other by a CMP process. After the STI regions are formed, at least top portions of, or substantially entireties of, the fins are removed. Accordingly, recesses are formed between STI regions. The bottom surfaces of the STI regions may be level with, higher, or lower than the bottom surfaces of the STI regions. An epitaxy is then performed to separately grow first and second semiconductor layers (e.g., first and second semiconductor layers 104, 106) in the recesses created as a result of removal of the portions of the fins, thereby forming fins (e.g., fins 108*a-b*, 110*a-b*). A CMP is then performed until the top surfaces of the fins and the top surfaces of the STI regions are substantially co-planar. In some embodiments, after the epitaxy and the CMP, an implantation process is performed to define well regions (e.g., P-well region 103P and N-well region 103N) in the substrate. Alternatively, the fins are in-situ doped with impurities (e.g., dopants having P-type or N-type conductivity) during the epitaxy. Thereafter, the STI regions are recessed so that fins of first and second semiconductor layers (e.g., fins 108*a-b*, 110*a-b*) are extending upwardly over the STI regions from the substrate, in a similar fashion as shown in FIG. 3.

In some alternative embodiments, one of the fins 108*a-b* (e.g., fin 108*a*) in the N-type region 102N is formed of the second semiconductor layer 106, and the other fin 108*b* in the N-type region 102N is formed of the first semiconductor layer 104. In such cases, the subsequent epitaxial S/D features 152 formed on the fins 108*a* and 108*b* in the N-type region 102N may be Si or SiP; the subsequent epitaxial S/D features 152 formed on the fins 110*a* and 110*b* in the P-type region 102P may be SiGe. In some alternative embodiments, the fins 108*a-b* and 110*a-b* are formed directly from a bulk substrate (e.g., substrate 102), which may be doped with P-type or N-type impurities to form well regions (e.g., P-well region 103P and N-well region 103N). In such cases, the fins are formed of the same material as the substrate 102. In one exemplary embodiment, the fins and the substrate 102 are formed of silicon.

Figure 4:
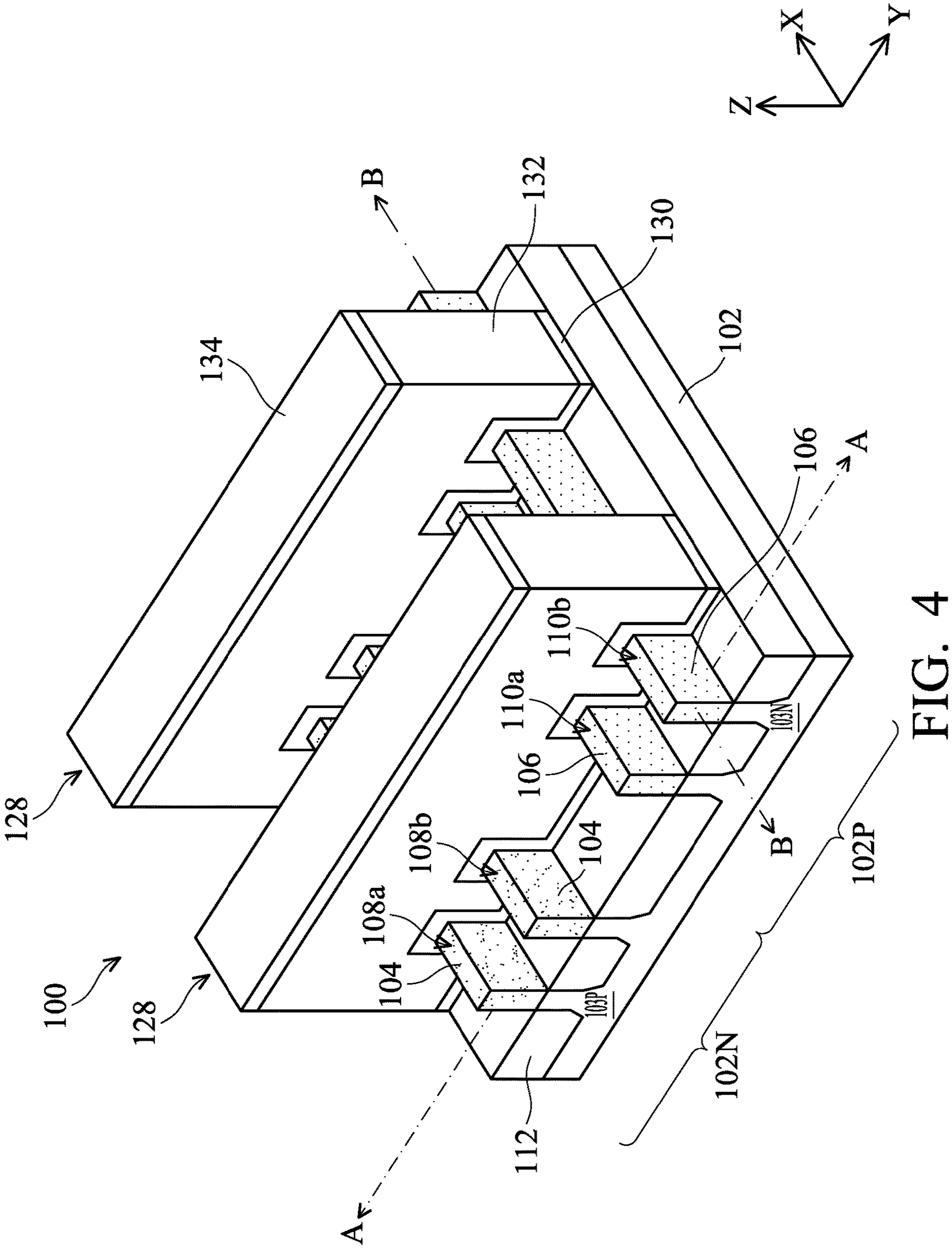

In FIG. 4, one or more sacrificial gate stacks 128 are formed on a portion of the fins 108*a-b*, 110*a-b*. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch, wet etch, other etch methods, and/or combinations thereof. By patterning the sacrificial gate stacks 128, the fins 108*a-b*, 110*a-b* are partially exposed on opposite sides of the sacrificial gate stacks 128. While two sacrificial gate stacks 128 are shown in FIG. 4, it can be appreciated that they are for illustrative purpose only and any number of the sacrificial gate stacks 128 may be formed.

FIGS. 5A-16A and 18A-24A are cross-sectional side views of various stages of manufacturing the semiconductor device structure 100 of FIG. 4 taken along cross-section A-A, in accordance with some embodiments. FIGS. 5B-16B and 18B-24B are cross-sectional side views of various stages of manufacturing the semiconductor device structure 100 of FIG. 4 taken along cross-section B-B, in accordance with some embodiments. Cross-section B-B is in a plane of the fin 110*b* along the X direction. Cross-section A-A is in a plane perpendicular to cross-section B-B and is in the epitaxial S/D features 152 (FIG. 6A) along the Y-direction. FIGS. 9C-15C and 18C-23C are top views of a portion of the semiconductor device structure 100 shown in FIGS. 9B-15B and 18B-23B, respectively. FIGS. 5B-16B and 18B-24B show cross-sectional side views of FIGS. 9C-15C and 18C-23C taken along cross-section B-B.

Figure 5A:
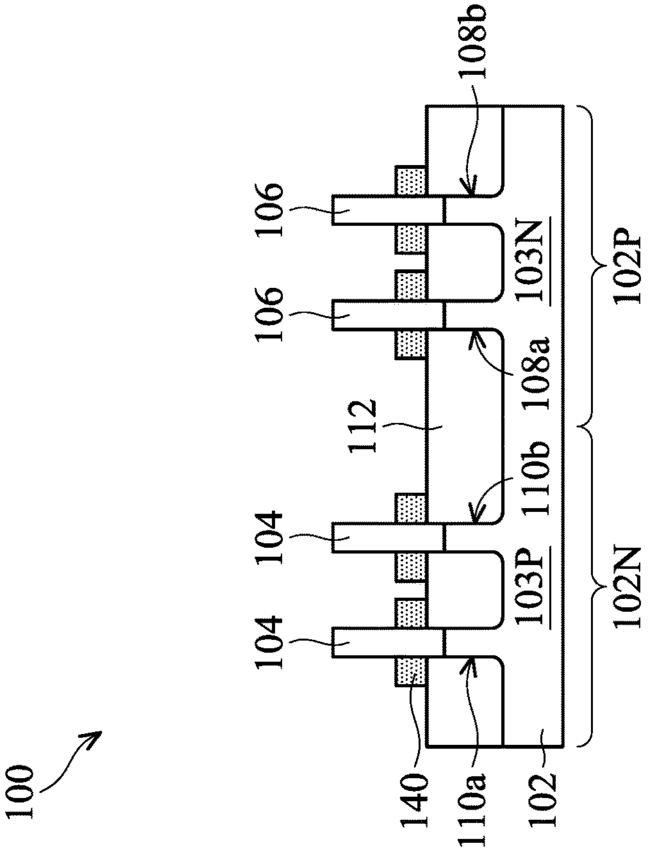
Figure 5B:
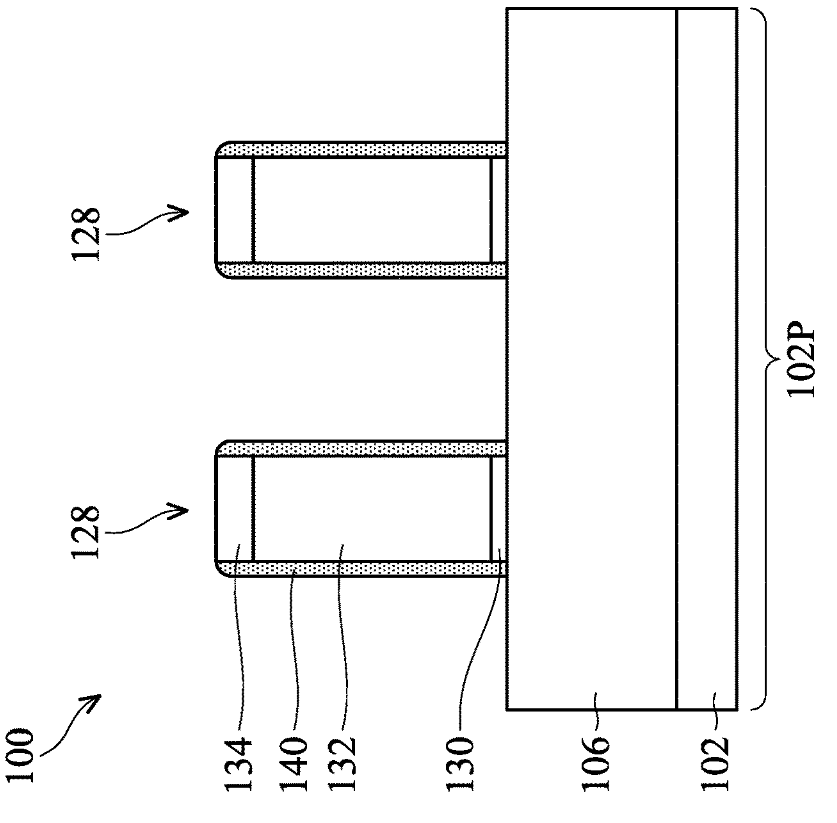

In FIGS. 5A-5B, a gate spacer 140 is formed on the sacrificial gate structures 128 and the exposed portions of the first and second semiconductor layers 104, 106. The gate spacer 140 may be conformally deposited on the exposed surfaces of the semiconductor device structure 100. The conformal gate spacer 140 may be formed by ALD or any suitable processes. An anisotropic etch is then performed on the gate spacer 140 using, for example, reactive ion etching (RIE). During the anisotropic etch process, most of the gate spacer 140 is removed from horizontal surfaces, such as tops of the sacrificial gate structures 128 and tops of the fins 108*a-b*, 110*a-b*, leaving the gate spacer 140 on the vertical surfaces, such as on opposite sidewalls of the sacrificial gate structures 128. The gate spacers 140 may partially remain on opposite sidewalls of the fins 108*a-b*, 110*a-b*, as shown in FIG. 5A. In some embodiments, the gate spacers 140 formed on the source/drain regions of the fins 108*a-b*, 110*a-b* are fully removed.

The gate spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the gate spacer 140 include one or more layers of the dielectric material discussed herein.

Figure 6A:
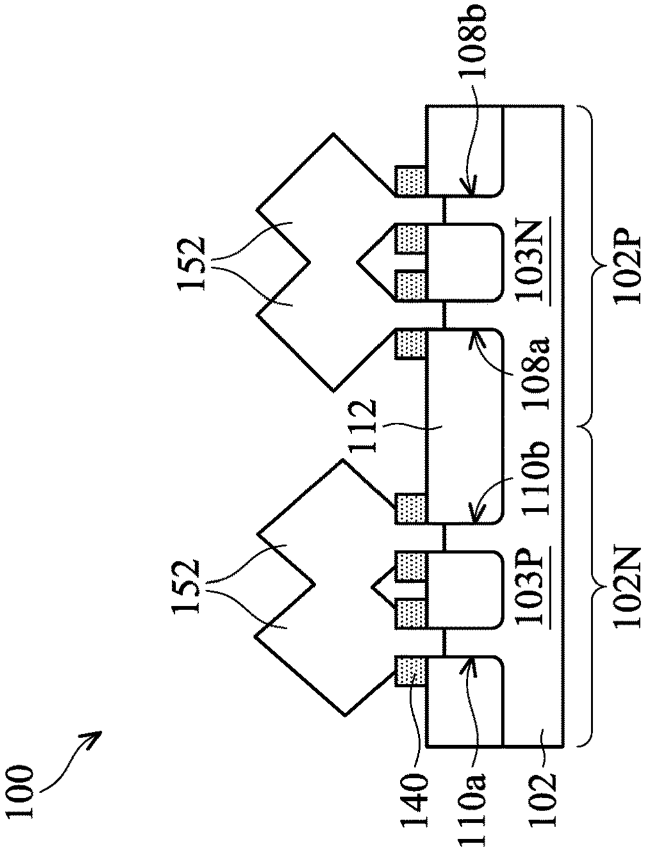
Figure 6B:
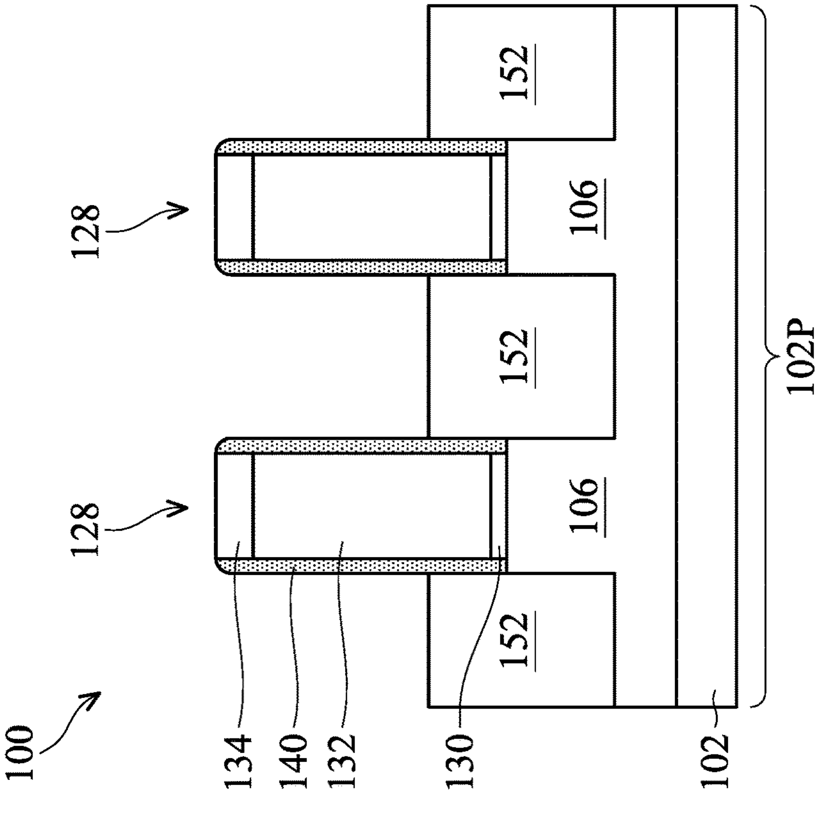

In FIGS. 6A-6B, the first and second semiconductor layers 104, 106 of the fins 108*a-b*, 110*a-b* not covered by the sacrificial gate structures 128 and the gate spacers 140 are recessed, and source/drain (S/D) epitaxial features 152 are formed. For N-channel FETs, the epitaxial S/D features 152 may include one or more layers of Si, SiP. SiC, SiCP, or a group III-V material (InP, GaAs, AlAs, InAs, InAlAs, InGaAs). In some embodiments, the epitaxial S/D features 152 may be doped with N-type dopants, such as phosphorus (P), arsenic (As), etc. for N-type devices. For P-channel FETs, the epitaxial S/D features 152 may include one or more layers of Si, SiGe, SiGeB, Ge, or a group III-V material (InSb, GaSb, InGaSb). In some embodiments, the epitaxial S/D features 152 may be doped with P-type dopants, such as boron (B). The epitaxial S/D features 152 may grow both vertically and horizontally to form facets, which may correspond to crystalline planes of the material used for the substrate 102. The epitaxial S/D features 152 may be formed by an epitaxial growth method using CVD, ALD or MBE.

In some embodiments, the portions of the first semiconductor layer 104 on both sides of each sacrificial gate structure 128 are completely removed, and the epitaxial S/D features 152 are formed on the P-well region 103P of the fins 108*a-b*. The epitaxial S/D features 152 may grow both vertically and horizontally to form facets, which may correspond to crystalline planes of the material used for the substrate 102. In some embodiments, the epitaxial S/D features 152 of the fins 108*a*-108*b* and 110*a*-110*b* are merged, as shown in FIG. 6A. The epitaxial S/D features 152 may each have a top surface at a level higher than a top surface of the first semiconductor layer 104, as shown in FIG. 6B.

Figure 7A:
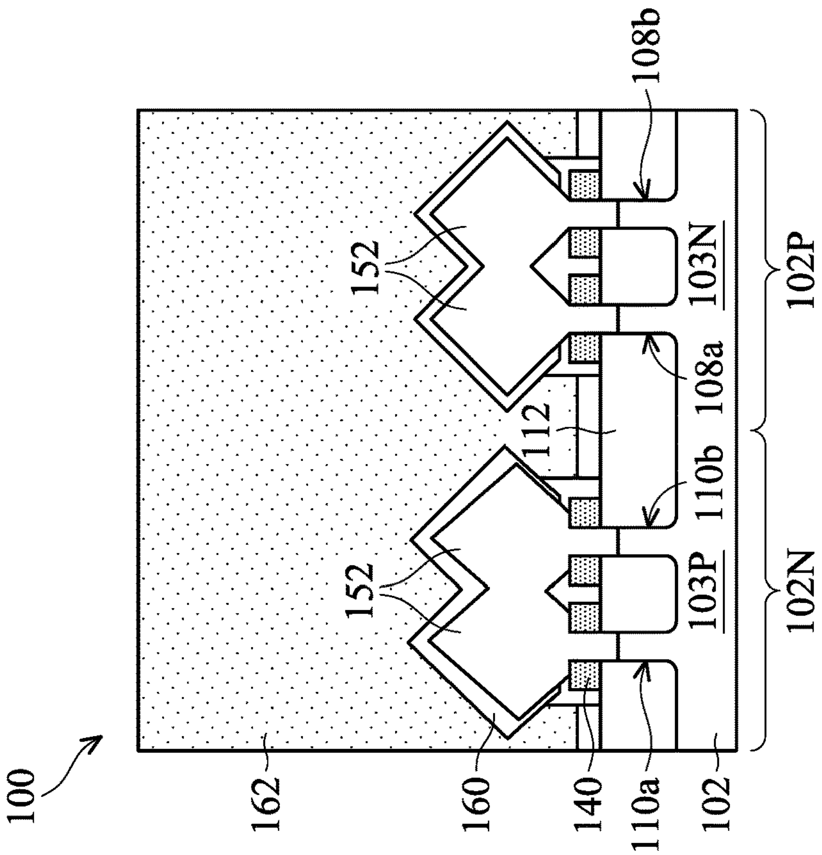
Figure 7B:
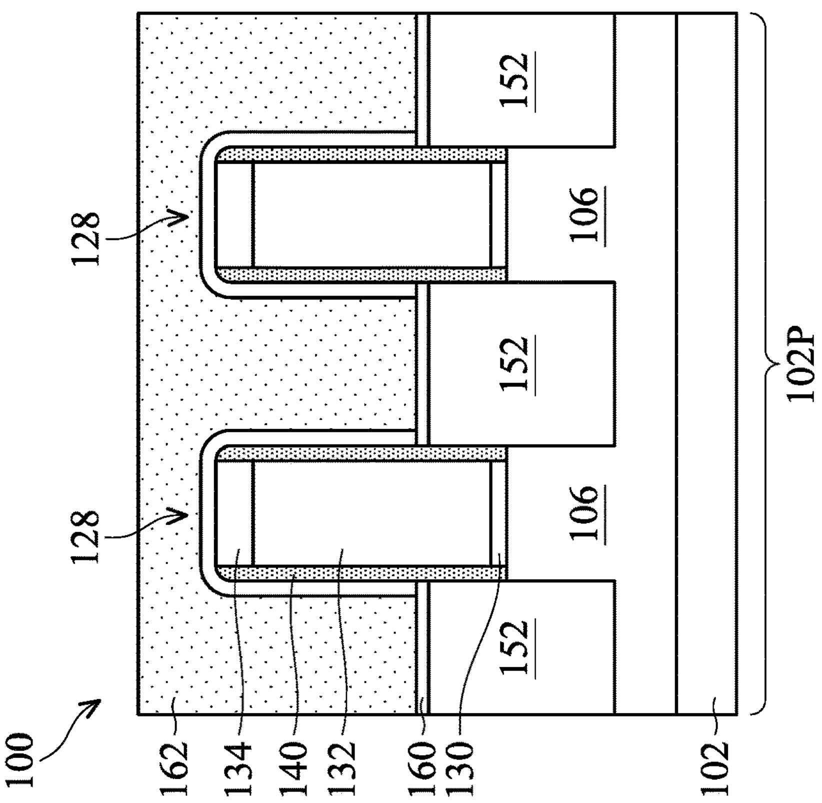

In FIGS. 7A-7B, a first contact etch stop layer (CESL) 160 is conformally formed on the exposed surfaces of the semiconductor device structure 100. The first CESL 160 covers the sidewalls of the sacrificial gate structures 128, the insulating material 112, and the epitaxial S/D features 152. The first CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the first CESL 160. The materials for the first ILD 162 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD 162 may be deposited by a PECVD process or FCVD process or other suitable deposition technique. The first ILD 162 may have a thickness in a range of about 0 nm to 50 nm, such as about 10 nm to about 15 nm. In some embodiments, after formation of the first ILD 162, the semiconductor device structure 100 may be subject to a thermal process to anneal the first ILD 162. After formation of the first ILD 162, a planarization process is performed to expose the sacrificial gate electrode layer 132. The planarization process may be any suitable process, such as a CMP process. The planarization process removes portions of the first ILD 162 and the first CESL 160 disposed on the sacrificial gate structures 128. The planarization process may also remove the mask structure 134.

Figure 8A:
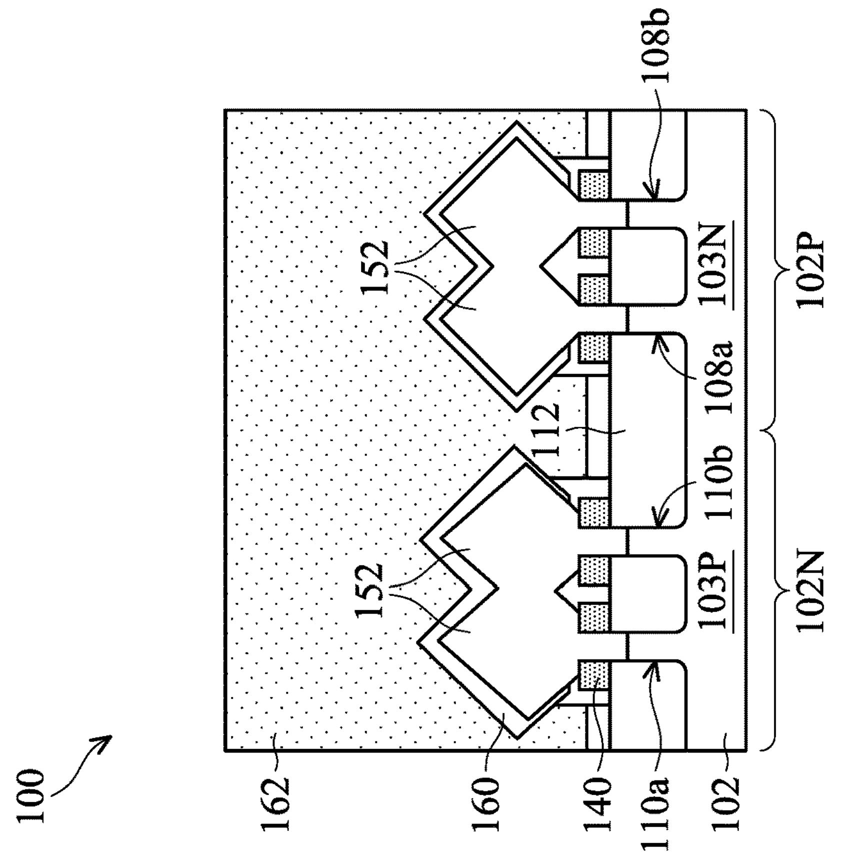
Figure 8B:
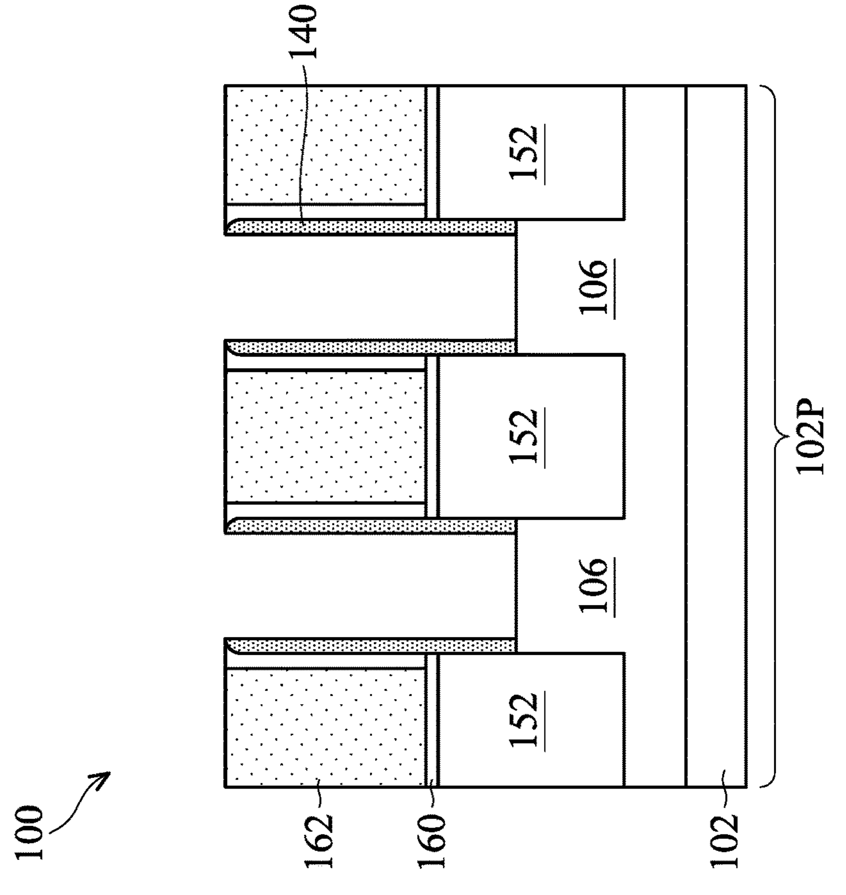

In FIGS. 8A-8B, the mask structure 134 (if not removed during previous CMP process), the sacrificial gate electrode layers 132 (FIG. 7B), and the sacrificial gate dielectric layers 130 (FIG. 7B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the gate spacer 140, the first CESL 160, and the first ILD 162. The removal of the sacrificial gate electrode layers 132 and the sacrificial gate dielectric layers 130 exposes a top portion of the first and second semiconductor layers 104, 106 (only first semiconductor layers 104 can be seen in FIG. 8A) in the channel region.

Figure 9A:
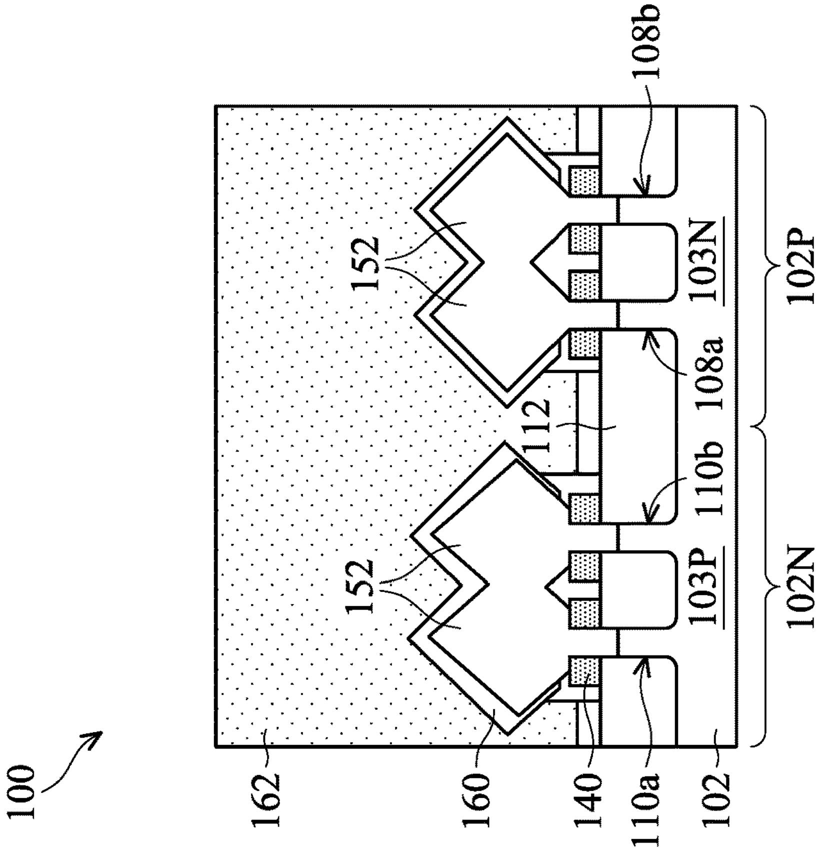
Figure 9B:
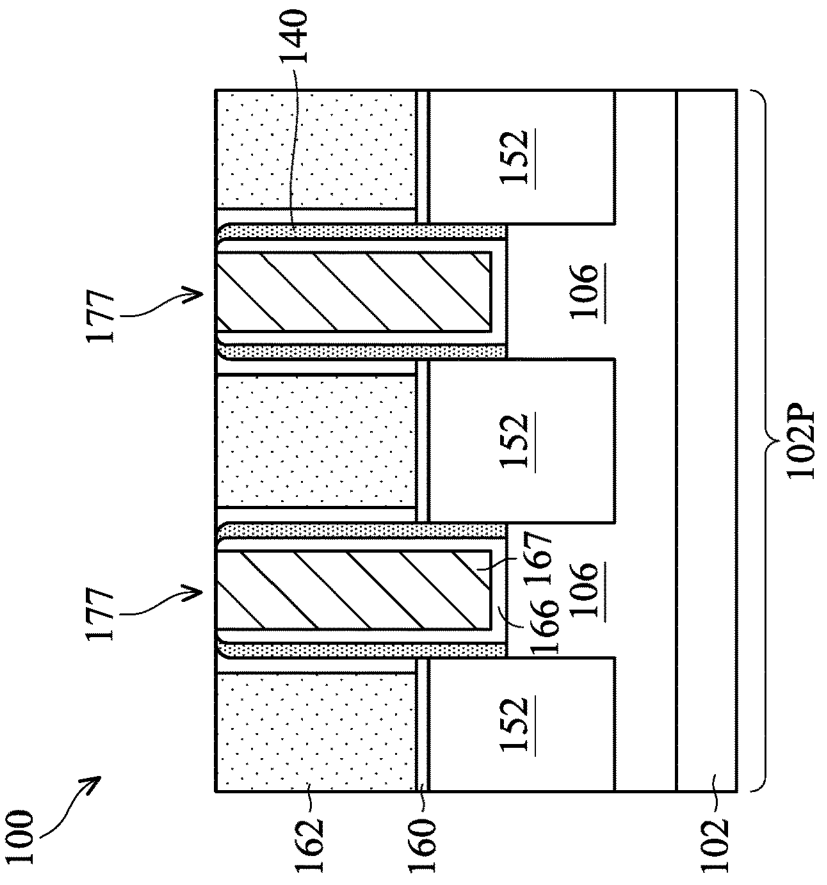
Figure 9C:
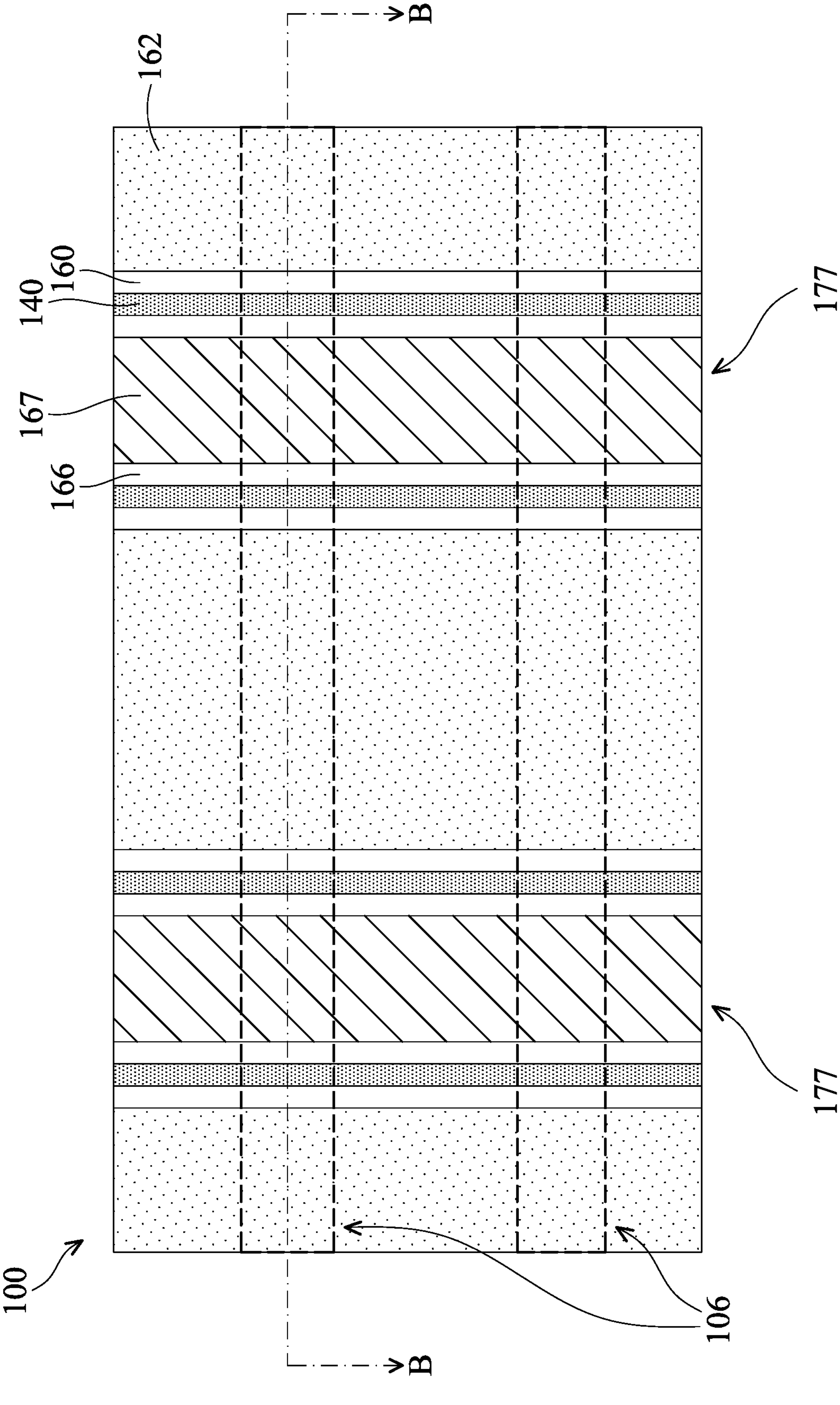

In FIGS. 9A-9C, replacement gate structures 177 are formed. The replacement gate structure 177 may include a gate dielectric layer 166 and a gate electrode layer 167 formed on the gate dielectric layer 166. The gate dielectric layer 166 may include one or more dielectric layers and may include the same material(s) as the sacrificial gate dielectric layer 130.

In some embodiments, the gate dielectric layer 166 is a high-K dielectric material such as metal oxides, metal nitrides, metal silicates, transition metal-oxides, transition metal-nitrides, transition metal-silicates, oxynitrides of metals, metal aluminates, zirconium silicate, zirconium aluminate, or any combination thereof. For example, the gate dielectric layer 166 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$), barium titanium oxide ($BaTiO_3$), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 166 may have a multilayer structure such as one layer of silicon oxide (e.g., interfacial layer) and another layer of high-K material. In some embodiments, the gate dielectric layer 166 may be deposited by one or more ALD processes or other suitable processes.

Depending on the application and/or conductivity type of the devices in the N-type region 102N and the P-type region 102P, the gate electrode layer 167 may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or any combinations thereof. For devices in the N-type region 102N, the gate electrode layer 167 may be AlTiO, AlTiC, or a combination thereof. For devices in the P-type region 102P, the gate electrode layer 167 may be AlTiO, AlTiC, AlTiN, or a combination thereof. The gate electrode layers 167 may be formed by PVD, CVD, ALD, electro-plating, or other suitable method.

Figure 10A:
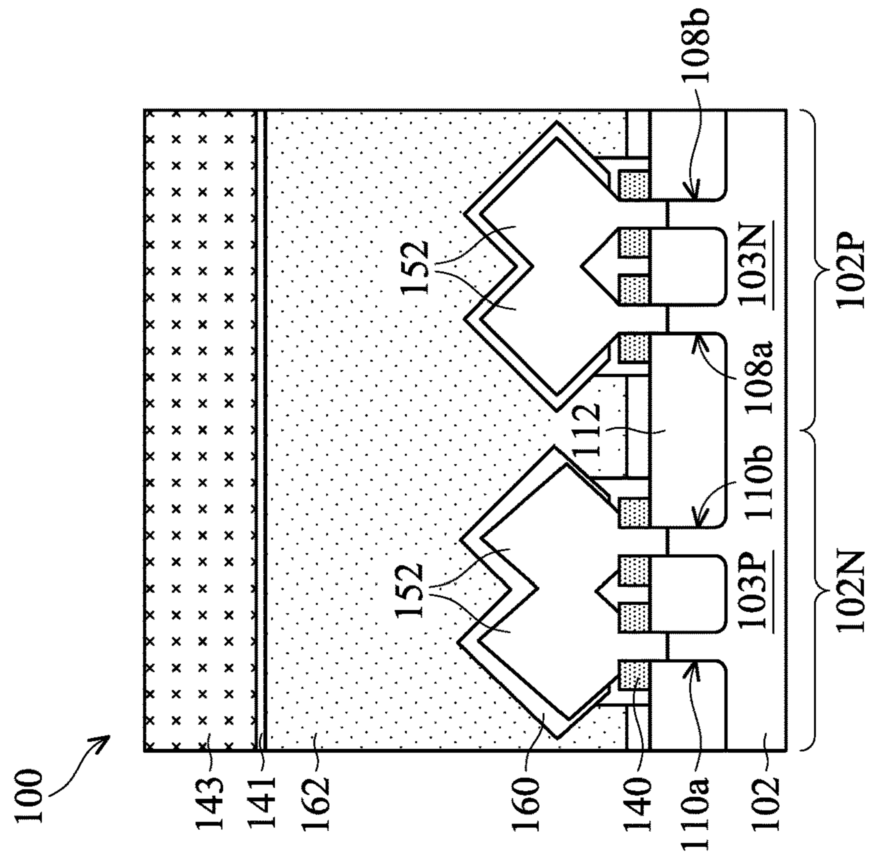
Figure 10B:
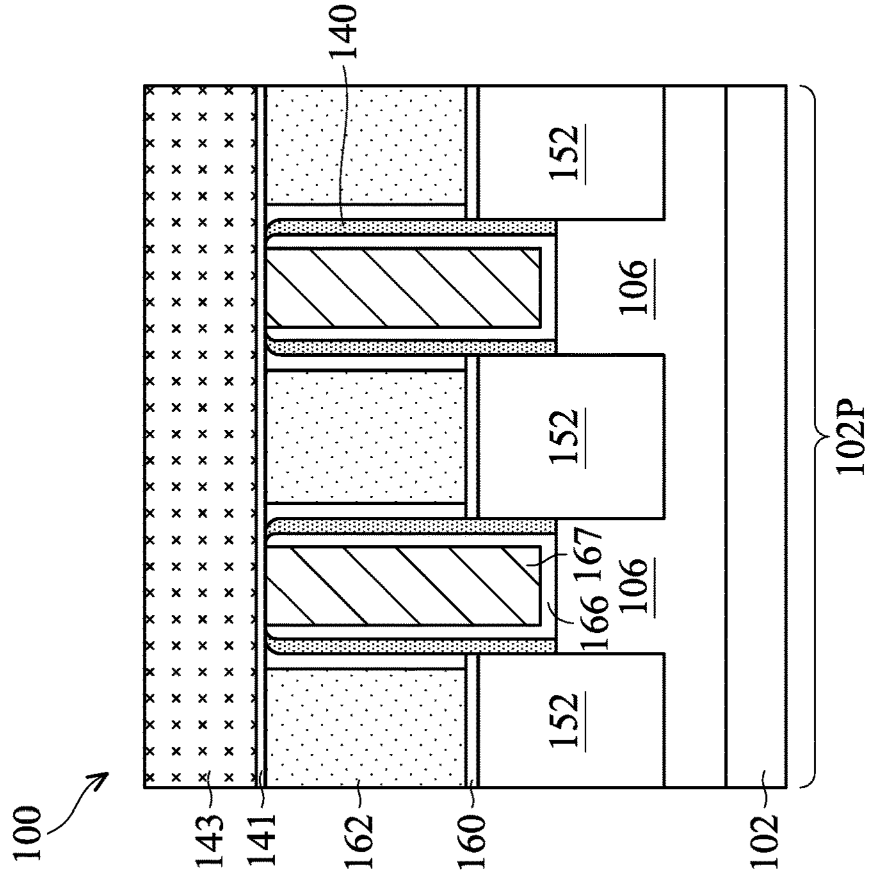
Figure 10C:
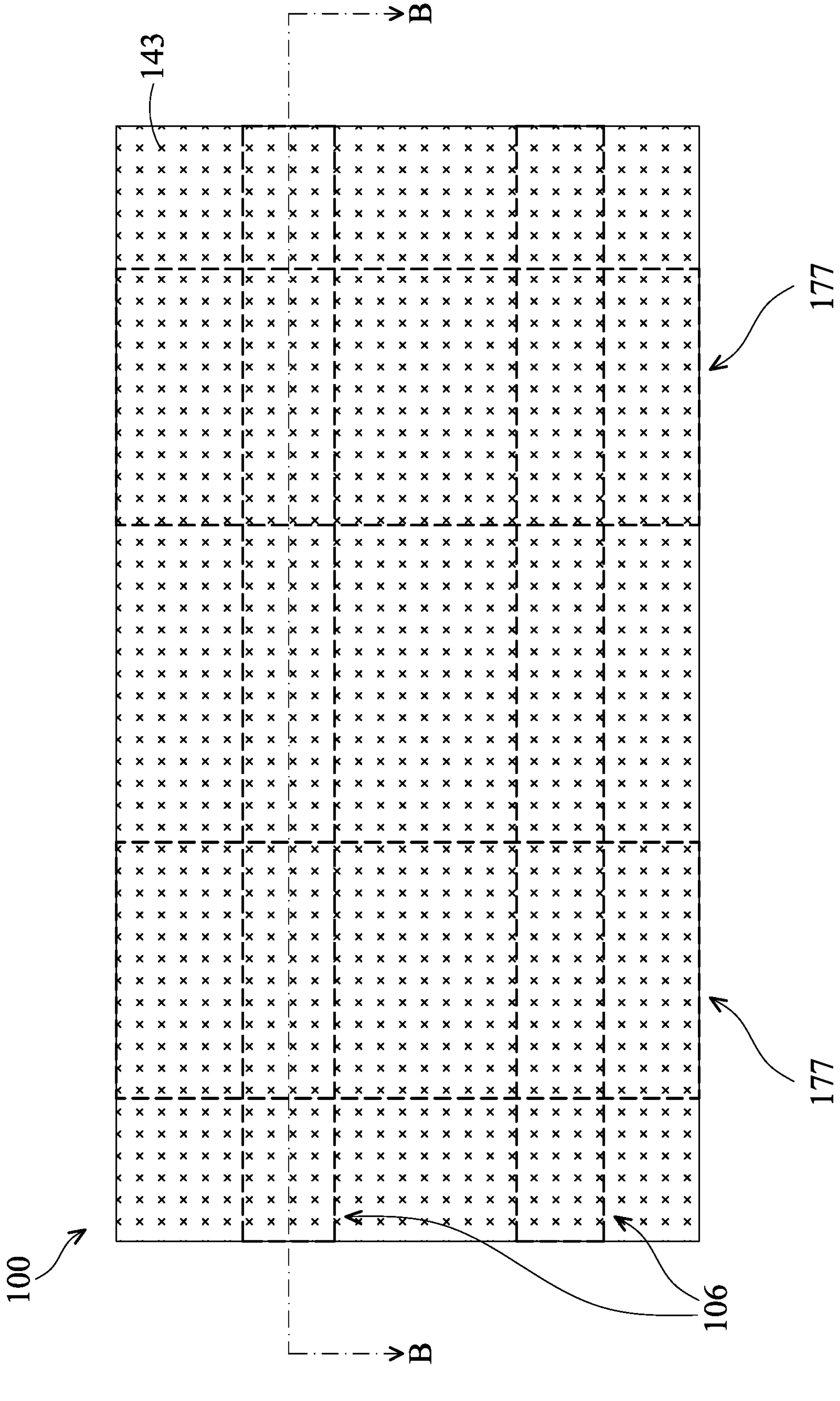

In FIGS. 10A-10C, a second contact etch stop layer (CESL) 141 and a second ILD 143 are sequentially formed over the semiconductor device structure 100. The second CESL 141 may be silicon nitride, silicon carbide, silicon oxycarbide (SiOC), silicon oxycarbonitride (SiOCN), silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. In one embodiment, the second CESL 141 is silicon nitride. The second ILD 143 may include the same material as the first ILD 162 and be deposited using the same fashion as the first ILD 162, as discussed above with respect to FIGS. 7A and 7B. In one embodiment, the first ILD 162 is silicon oxide ($SiO_x$). In some embodiments, the second CESL 141 may have a thickness in a range of about 0 nm to about 20 nm, such as about 1 nm to about 5 nm, and the second ILD 143 may have a thickness in a range of about 0.1 nm to about 50 nm, such as about 20 nm.

Figure 11A:
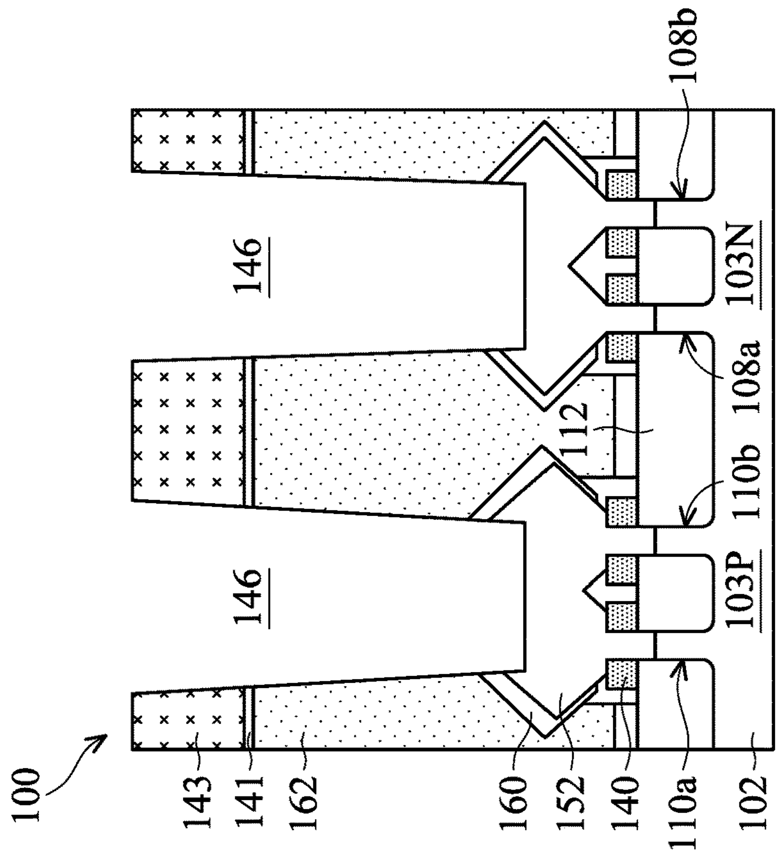
Figure 11B:
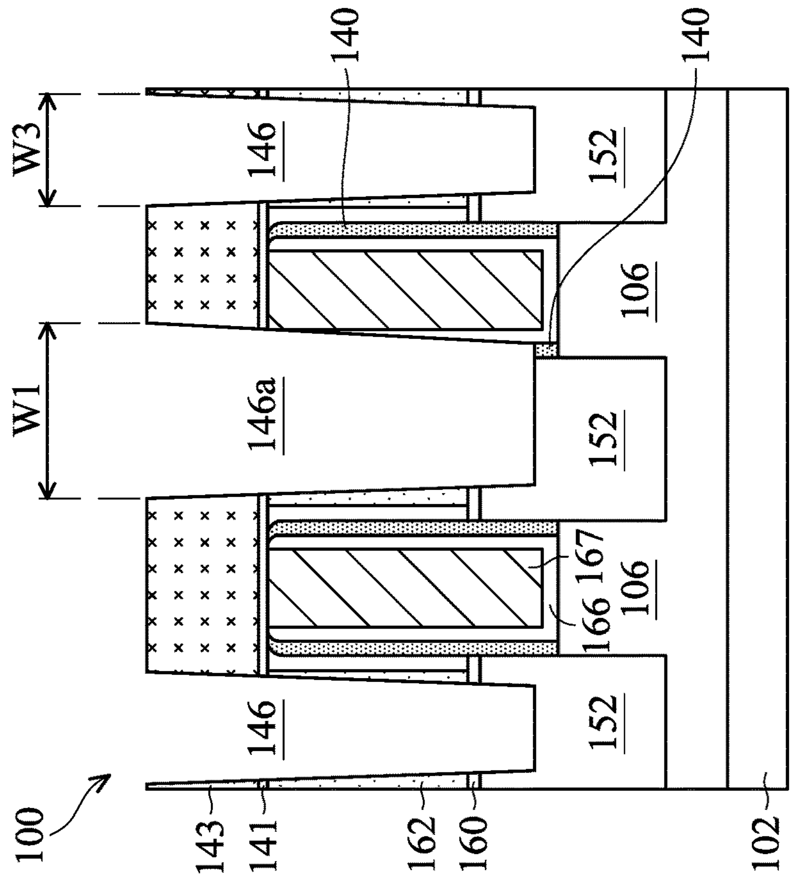
Figure 11C:
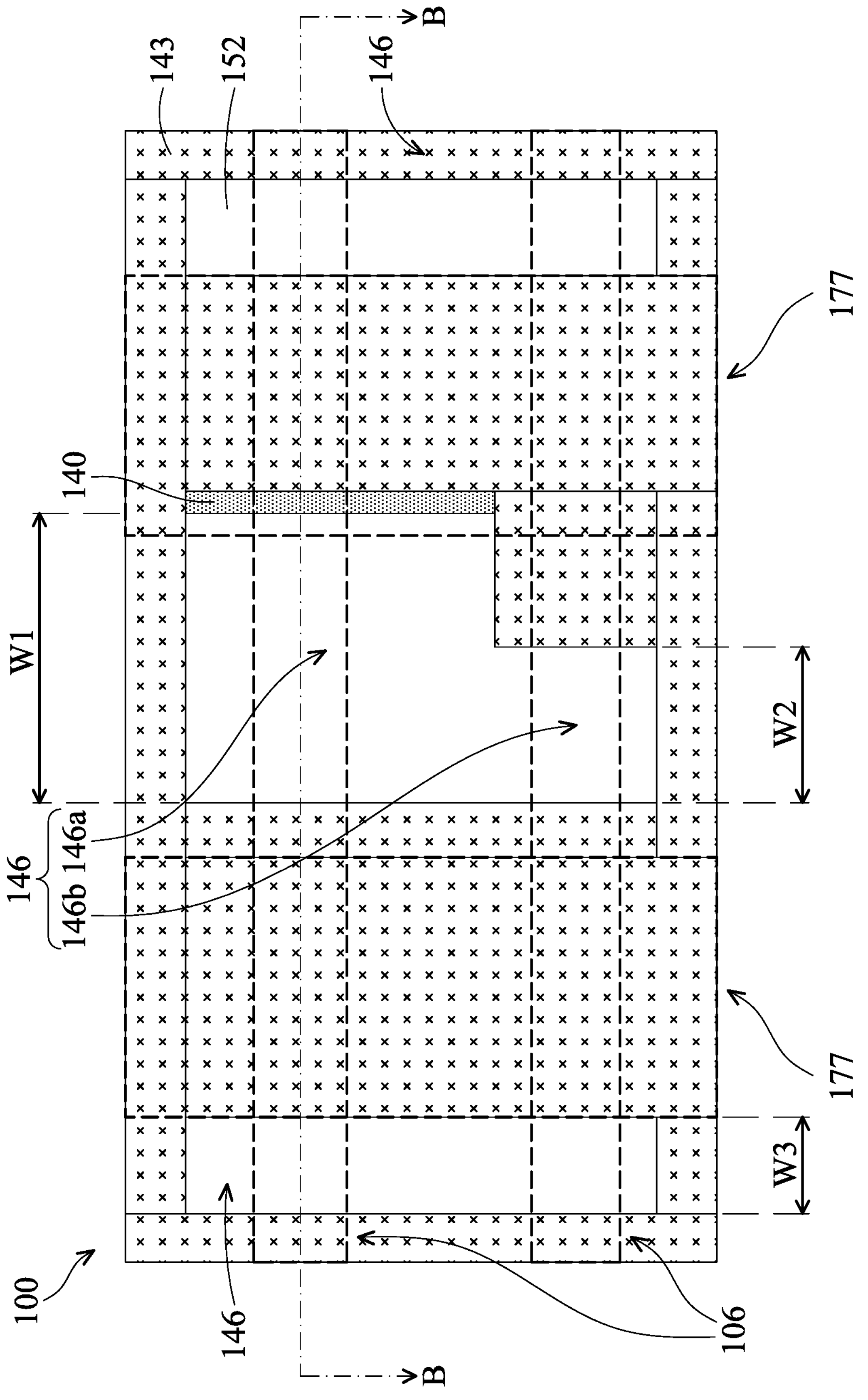

In FIGS. 11A-11C, portions of the second ILD 143, the second CESL 141, the first ILD 162, and the first CESL 160 disposed on both sides of the replacement gate structures 177 are removed. The removal of the portions of the second ILD 143, the second CESL 141, the first ILD 162, and the first CESL 160 forms contact opening 146 exposing the epitaxial S/D features 152. In some embodiments, an upper portion of the exposed epitaxial S/D features 152 is also removed. An etch process, such as a dry etch, a wet etch, or a combination thereof, may be used to form the contact openings 146. The etchants used by the etch process remove portions of the first and second ILD 162, 176, the first CESL 160, and optionally the epitaxial S/D features 152. In some embodiments, a portion of the gate dielectric layer 166 at and/or adjacent L-shaped contact openings 146 may also be removed to expose a portion of the gate electrode layer 167.

The sidewalls of the contact openings 146 may be vertical or slanted. In some embodiments, the contact openings 146 have a sidewall profile in which the dimension at the top is greater than the dimension at the bottom of the contact openings 146. In some embodiments, the contact openings 146 may have different shapes at selected regions. For example, the contact openings 146 may be formed with extended shape/profile at regions where butted contacts are to be formed or regions where source features are not large enough while drain features remain small in size, thereby enlarging contact window for the subsequent S/D contacts. In some embodiments, the contact openings 146 are formed such that the contact openings 146 at a first side of the replacement gate structure 177 may have an L-shape, and the contact openings 146 at a second side of the replacement gate structure 177 may have a rectangular or square shape. In one exemplary embodiment, the contact openings 146 between two immediately adjacent replacement gate structures 177 have an L-shape profile, as shown in FIG. 11C. The L-shaped contact openings 146 allow a conductive material to be filled therein and form S/D contacts with respect to a plain view of the semiconductor device structure. As will be discussed in more detail below, the S/D contacts having an L-shaped profile increases the contact window of the epitaxial S/D features 152 and therefore, an increased surface contact area between the S/D contacts and the subsequent butted contact (179, FIG. 15B). In one exemplary embodiment shown in FIG. 11C, the contact openings 146 between replacement gate structures 177 have an L-shaped profile with respect to a plain view of the semiconductor device structure 100, and the contact openings 146 adjacent the replacement gate structures 177 have a rectangular profile with respect to a plain view of the semiconductor device structure 100.

The contact openings 146 may be formed by a suitable lithography process. The photomask used during the photolithography process may have various pre-defined patterns, such as L-shaped patterns and rectangular-shaped patterns. The contact openings 146 at different regions may be formed at once or through separate lithography processes. During the lithography process, a patterned mask layer (not shown) may be first formed on the second ILD 143. A removal process, such as a dry etch, wet etch, or a combination thereof, may be performed to remove portions of the second ILD 143, the second CESL 141, the first ILD 162, and the first CESL 160. The removal process may expose a portion of the epitaxial S/D features 152, as shown in FIGS. 11A-11C. Depending on the pre-defined patterns in the photomask, the removal process may also remove portions of the gate spacer 140 and the gate dielectric layer 166 at regions where the L-shaped contact openings 146 are to be formed, resulting in L-shaped contact openings each having a first opening **146*a* with a width W1 and a second opening 146*b* with a width W2 that is less than the width W1 (FIG. 11C). The width W1 and the width W2 may be in a ratio (W1:W2) of about 1.5:1 to about 3:1. The contact openings 146** at other regions may have a width W3 that is equal to, greater, or less than the width W2.

Figure 12A:
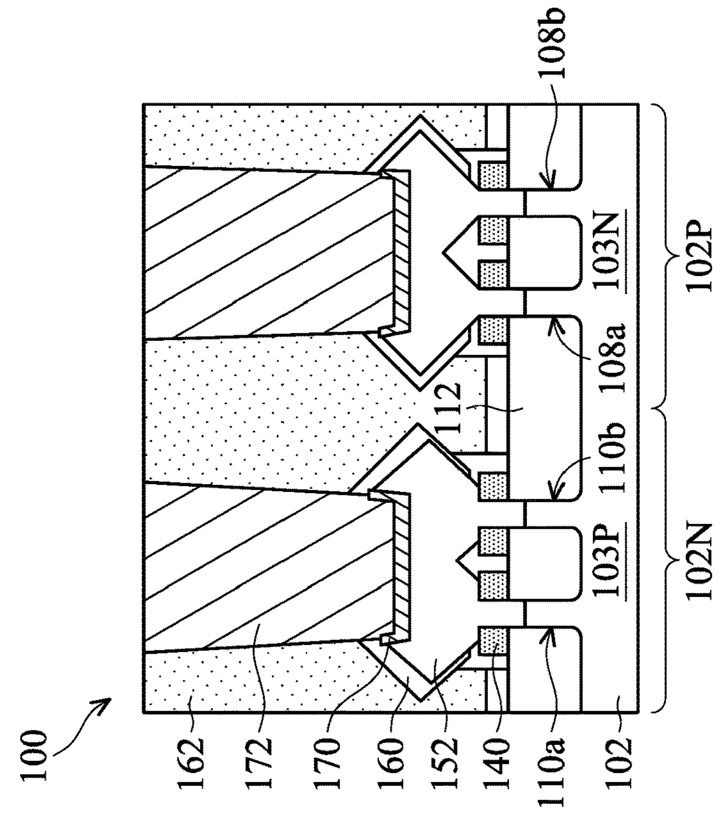
Figure 12B:
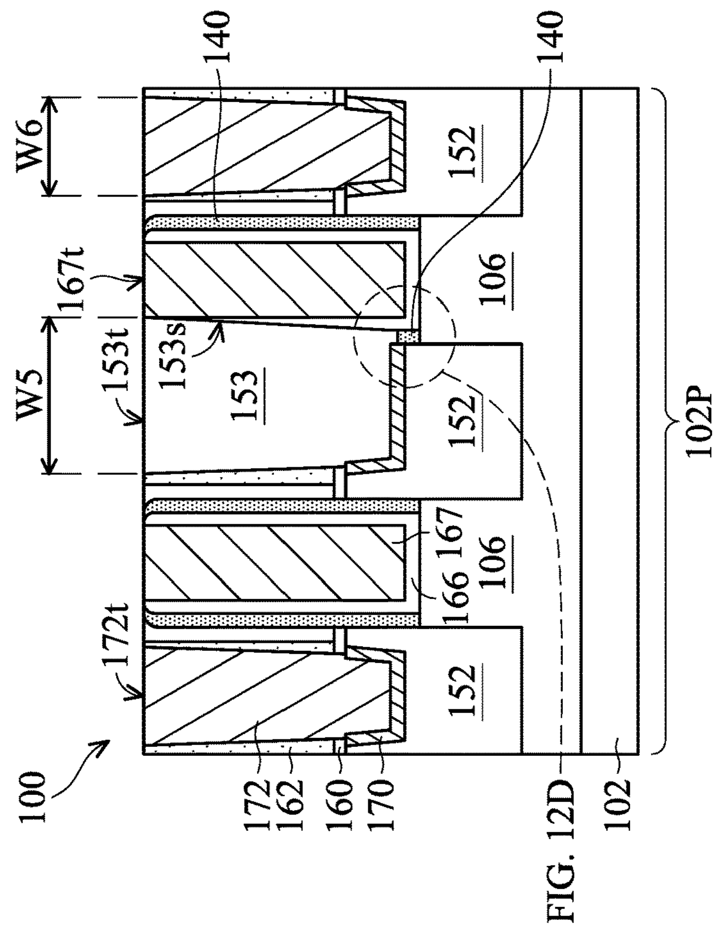
Figure 12C:
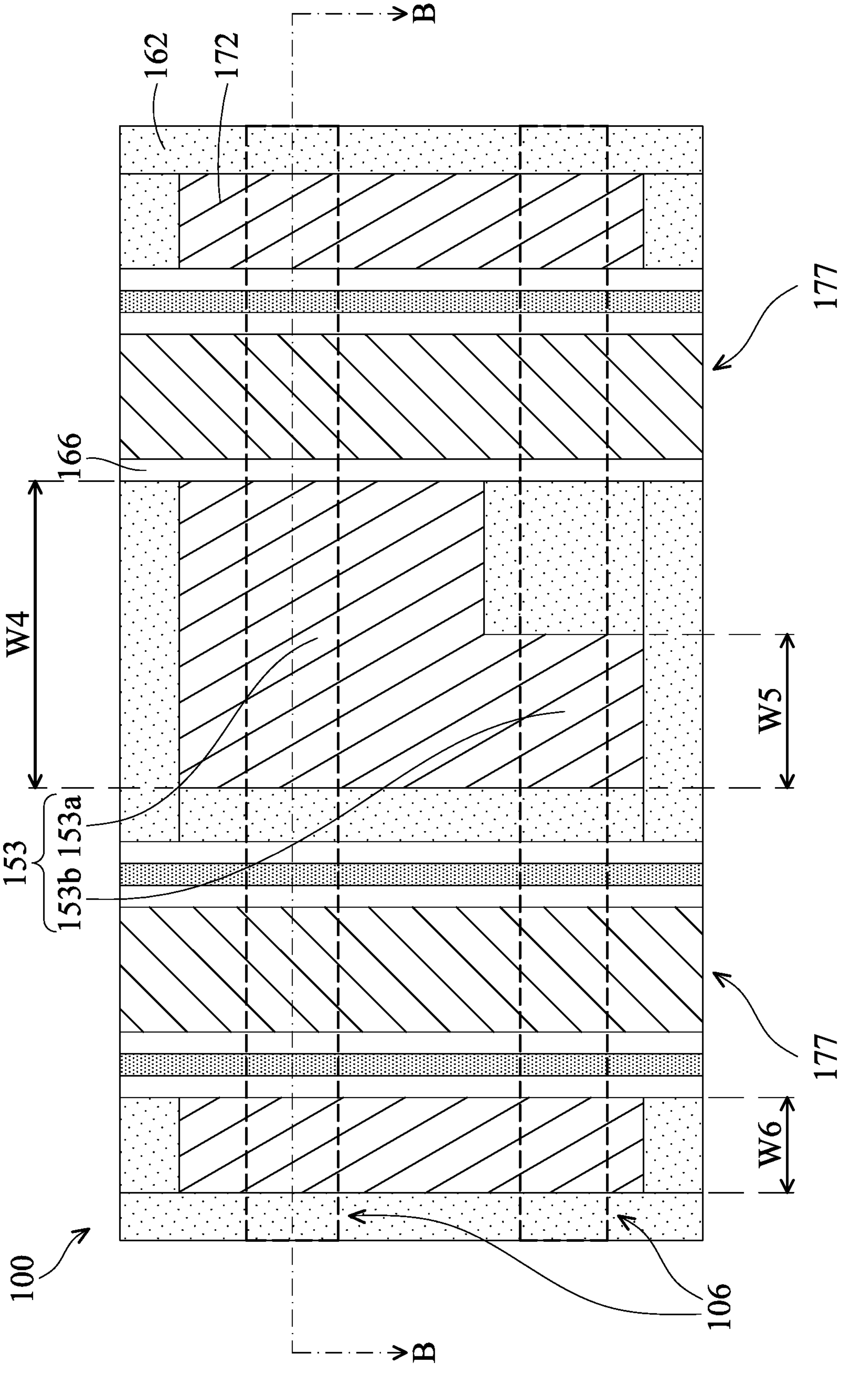

In FIGS. 12A-12C, conductive features 172 are formed over the epitaxial S/D features 152 in the contact openings 146. The conductive features 172 filled in the L-shaped contact openings 146 form L-shaped conductive features 153. The L-shaped conductive features 153 and the conductive features 172 serve as metal contacts (i.e., S/D contacts) for the epitaxial S/D features 152. The L-shaped conductive features 153 and the conductive features 172 may include an electrically conductive material, such as one or more of Ru, Mo, Co, Ni. W, Ti, Ta, Cu, Al, TiN and TaN. The L-shaped conductive features 153 and the conductive feature 172 may be formed by any suitable process, such as PVD, CVD, ALD, electrochemical plating, or other suitable method. A silicide layer 170 may be formed between the epitaxial S/D feature 152 and the L-shaped conductive features 153 and the conductive feature 172, respectively. The silicide layer 170 conductively couples the epitaxial S/D features 152 to the L-shaped conductive features 153 and the conductive feature 172, respectively. The silicide layer 170 is a metal or metal alloy silicide, and the metal may include a noble metal, a refractory metal, a rare earth metal, alloys thereof, or combinations thereof. Once the L-shaped conductive features 153 and the conductive features 172 are formed, a planarization process, such as CMP, is performed on the semiconductor device structure 100 until the top surface of the first ILD 162 is exposed. As a result, the top surface **153*t* of the L-shaped conductive feature 153, the top surface 172*t* of the conductive features 172, the top surface 167*t* of the gate electrode layer 167, and the top surfaces of the gate dielectric layer 166, the gate spacers 140, the CESL 160, and the first ILD 162** are substantially co-planar.

Each L-shaped conductive feature 153 has a first portion **153*a* with a width W4 and a second portion 153*b* with a width W5 that is less than the width W4 (FIG. 12C). The first portion 153*a* is disposed towards and closer to the replacement gate structures 177 than the second portion 153*b*. The width W4 and the width W5 may be in a ratio (W4:W5) of about 1.5:1 to about 3:1. The conductive features 172** at other regions may have a width W6 that is equal to, greater, or less than the width W5.

In some embodiments, a portion of the L-shaped conductive features 153 (e.g., the first portion 153*a*) has a sidewall 153*s* in direct contact with the gate electrode layer 167. In some embodiments, a portion of the L-shaped conductive features 153 is separated from the gate electrode layer 167 by the gate dielectric layer 166.

Figure 12D:
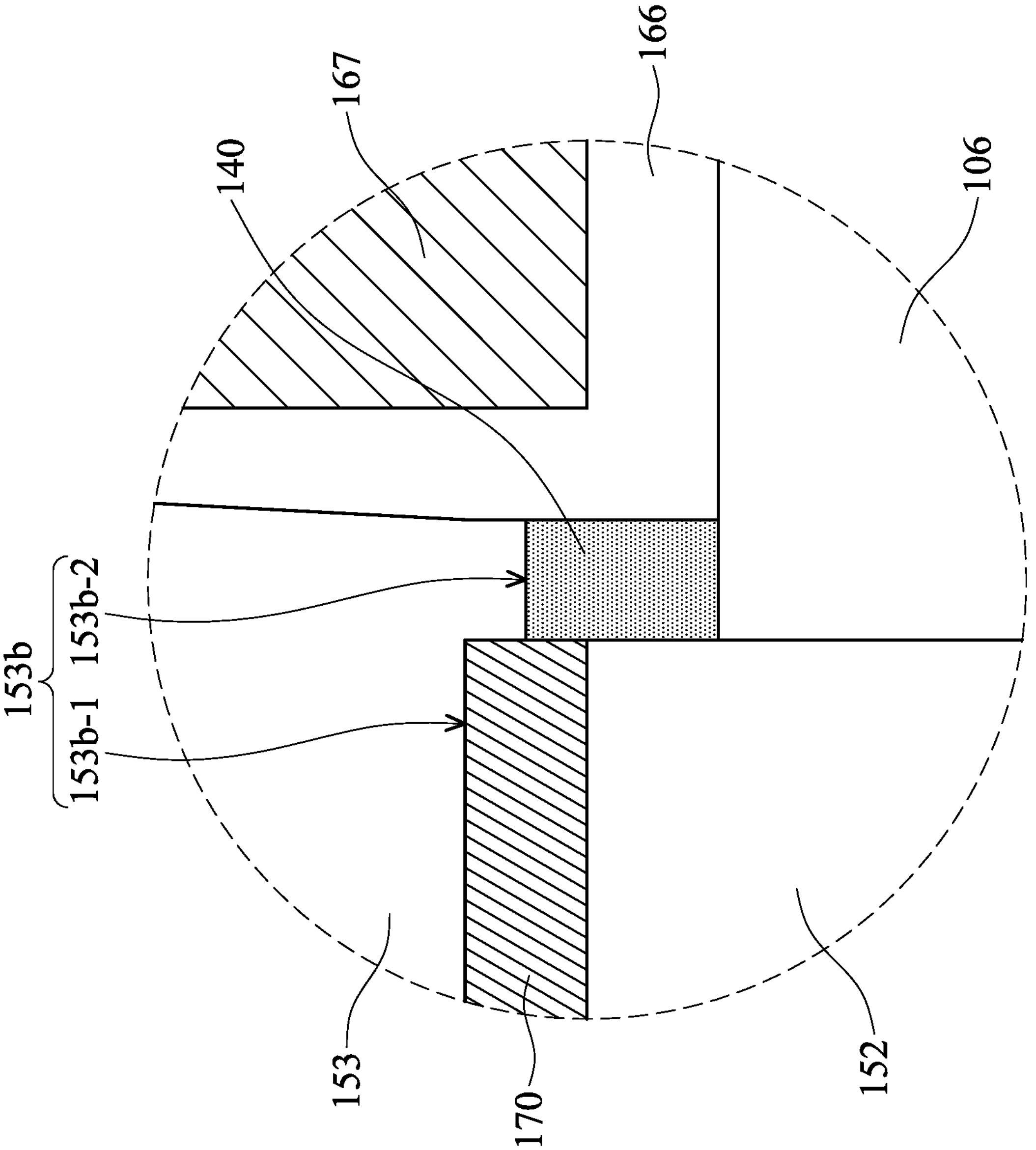
FIG. 12D is an enlarged view of a portion of the semiconductor device structure showing the structural relationship of the L-shaped conductive feature with respect to the surrounding layers, in accordance with some embodiments.

FIG. 12D is an enlarged view of a portion of the semiconductor device structure 100 showing the structural relationship of the L-shaped conductive feature 153 with respect to the surrounding layers, in accordance with some embodiments. As shown in FIG. 12D, a portion of the L-shaped conductive feature 153 is in contact with the silicide layer 170, the gate spacer 140, and the gate dielectric layer 166. In some embodiments, the gate spacer 140 is in contact with the L-shaped conductive feature 153, the gate dielectric layer 166, the second semiconductor layer 106, the epitaxial S/D feature 152, and the silicide layer 170. In some embodiments, a first section 153*b*-1 of the second section 153*b* of the L-shaped conductive feature 153 is at a first elevation and a second section 153*b*-2 of the bottom 153*b* of the L-shaped conductive feature 153 is at a second elevation that is lower than the first elevation. The second section 153*b*-2 is disposed between and in contact with the silicide layer 170 and the gate dielectric layer 166. The top surface of the gate spacer 140 disposed below the L-shaped conductive feature 153 may be at the same or different elevation than the top surface of the epitaxial S/D feature 152.

Figure 13A:
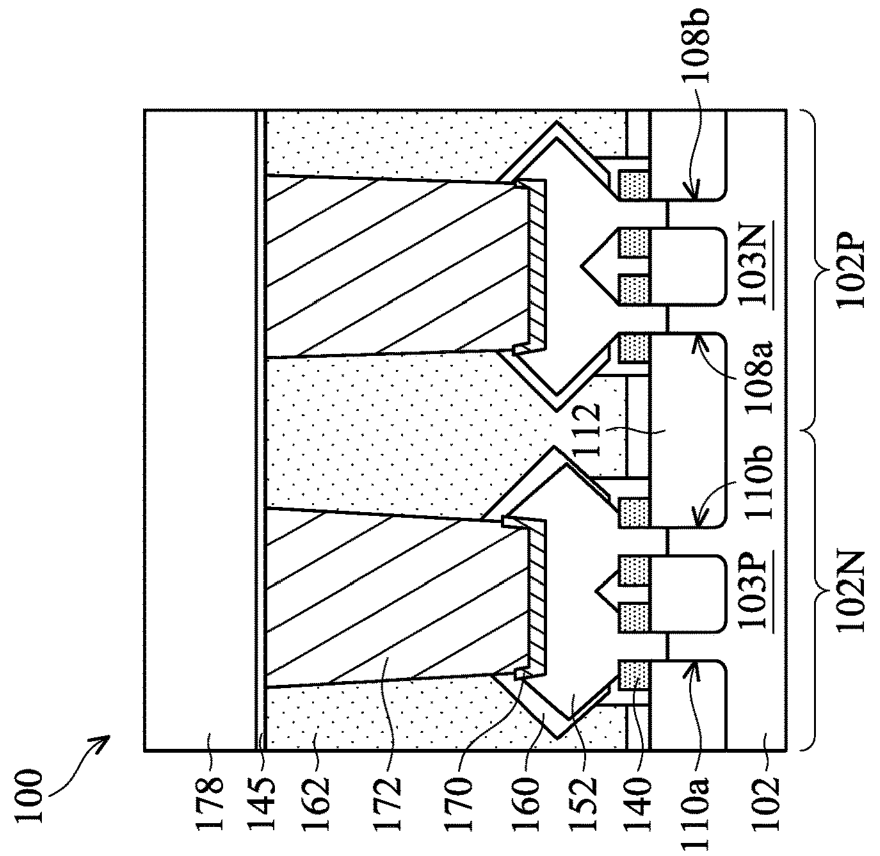
Figure 13B:
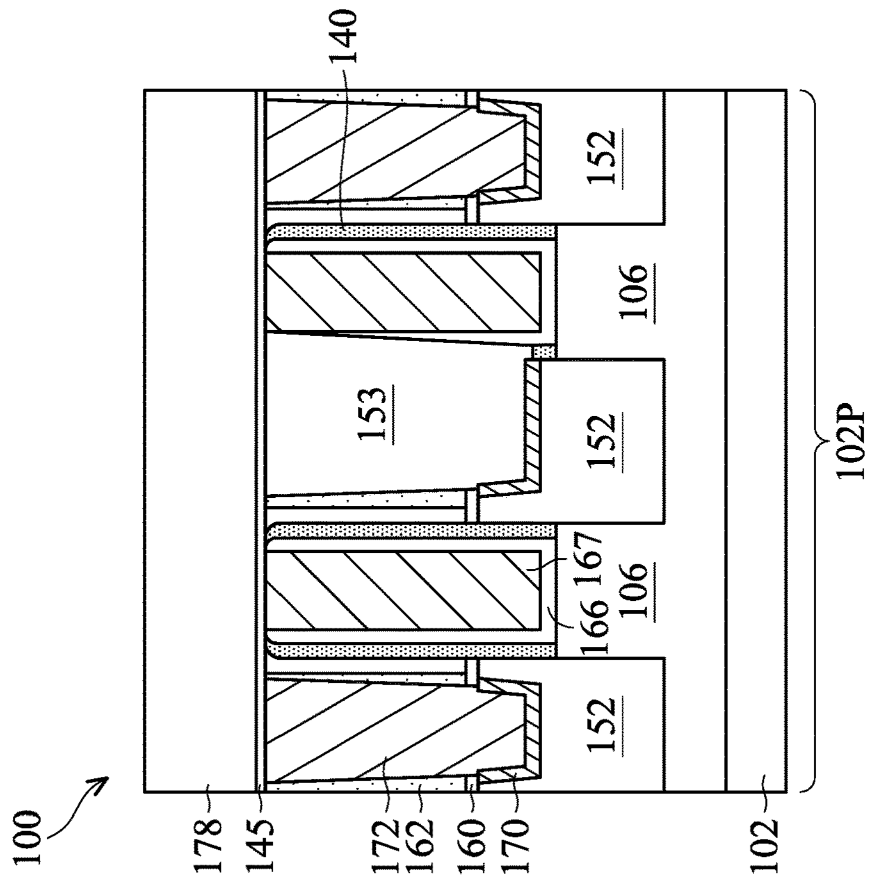
Figure 13C:
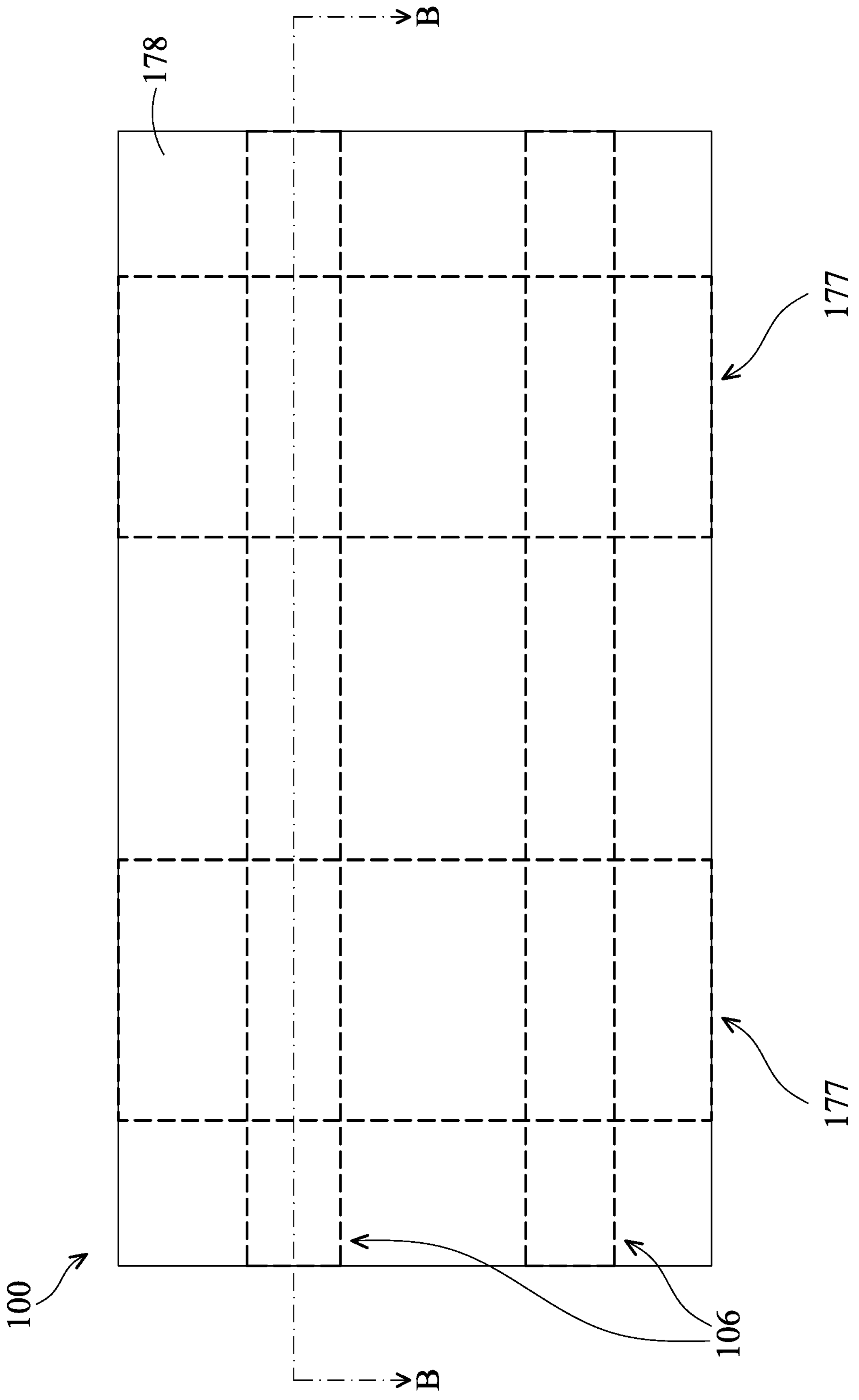

In FIGS. 13A-13C, an etch stop layer 145 and a third ILD 178 are sequentially formed over the semiconductor device structure 100. In some embodiments, the etch stop layer 145 is omitted. The etch stop layer 145 may be silicon nitride, silicon carbide, silicon oxycarbide (SiOC), silicon oxycarbonitride (SiOCN), silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. In one embodiment, the etch stop layer 145 is silicon nitride. The third ILD 178 may include the same material as the first ILD 162 and be deposited using the same fashion as the first ILD 162, as discussed above with respect to FIGS. 7A and 7B. In cases where the etch stop layer 145 is used, the etch stop layer 145 may have a thickness in a range of about 0 nm to about 30 nm, for example about 8 nm to about 15 nm. The third ILD 178 may have a thickness in a range of about 0.1 nm to about 80 nm, for example about 10 nm to about 30 nm.

Figure 14A:
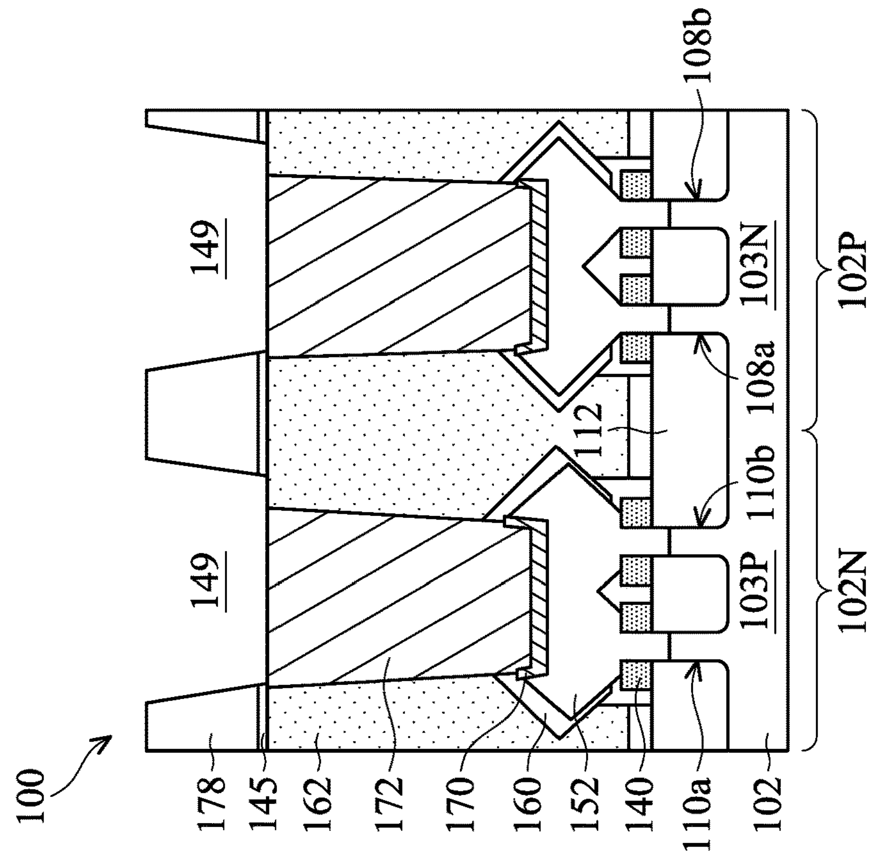
Figure 14B:
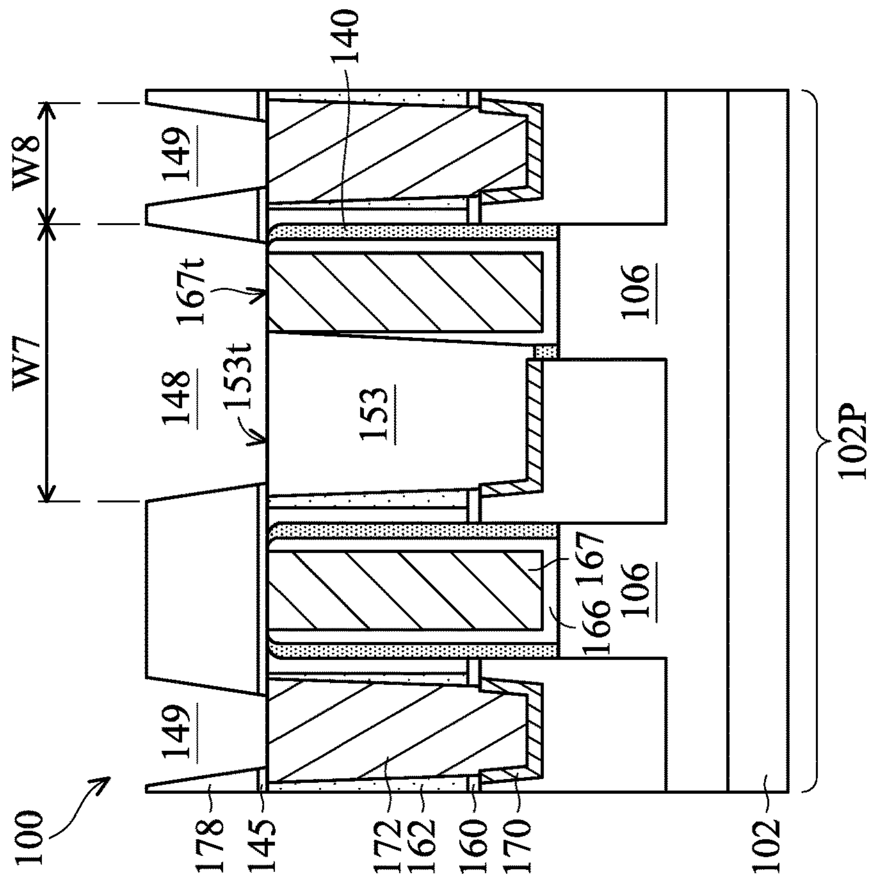
Figure 14C:
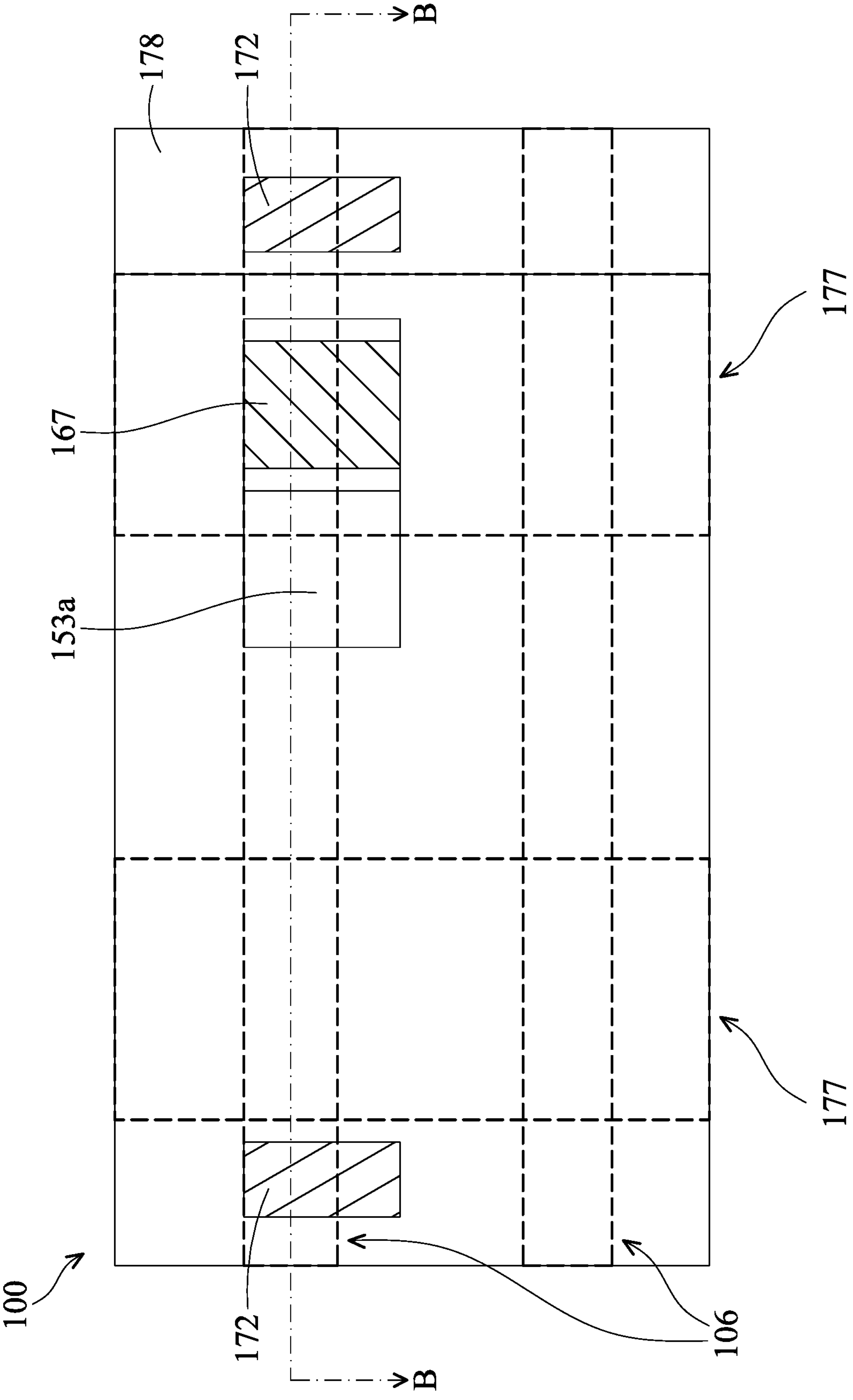

In FIGS. 14A-14C, portions of the third ILD 178 and the etch stop layer 145 (if any) disposed over the L-shaped conductive features 153 and conductive features 172 are removed. The removal of the portions of the third ILD 178 and the etch stop layer 145 forms butted contact openings 148 exposing the L-shaped conductive features 153 and the gate electrode layer 167. The removal of the portions of the third ILD 178 and the etch stop layer 145 also forms via contact openings 149 exposing the conductive features 172. A patterned layer (not shown) may be first formed on portions the third ILD 178. The patterned layer has openings (e.g., via contact openings 149) at locations aligned with the epitaxial S/D features 152. The patterned layer also has openings (e.g., butted contact openings 148) at regions where the butted contacts (179, FIG. 16B) are to be formed. The butted contact openings 148 exposes the top surface 153*t* of the L-shaped conductive contacts 153 and the top surface 167*t* of the gate electrode layers 167. In some embodiments, the butted contact openings 148 and the via contact openings 149 may be formed together or through separate lithography processes.

The removal of the portions of the third ILD 178 and the etch stop layer 145 may be performed, using the patterned layer as a mask, by one or more etch processes, such as a wet etch, dry etch, or a combination thereof. In one embodiment, the portions of the third ILD 178 and the etch stop layer 145 are removed using a dry etch process, such as RIE or other suitable anisotropic etch process. In one exemplary embodiment, a dry etch process utilizing a capacitively coupled plasma (CCP) source, an inductively coupled plasma (ICP) source, or glow discharge plasma (GDP) source driven by an RF power generator or a microwave plasma source may be used. The dry etch process may use a plasma formed from a gas mixture containing one or more etchants, such as a bromide-based gas, a chlorine-based gas, a fluorine-based gas, and/or other suitable etching gas. An inert gas, such as argon (Ar), may be provided with the etchants to increase bombardment effect and thus, enhanced etch rates of the third ILD 178 and the etch stop layer 145. Upon formation of the butted contact openings 148 and via contact openings 149, the patterned layer may be removed using any suitable process, such as an ash process.

The sidewalls of the butted contact openings 148 and the via contact openings 149 may be vertical or slanted. In some embodiments, the butted contact openings 148 and the via contact openings 149 have a sidewall profile in which the dimension at the top is greater than the dimension at the bottom of the butted contact openings 148 and the via contact openings 149, respectively. The butted contact openings 148 may be round-shaped, a rectangular-shaped, a square-shaped, or oval-shaped opening when viewing from top. In one exemplary embodiment, the via contact openings 149 are square-shaped openings, and the butted contact openings 148 are rectangular-shaped openings. In any case, the dimension of the butted contact openings 148 are wide enough such that that the subsequent conductive material can be deposited in the butted contact openings 148 without gap-fill issues. In some embodiments, the butted contact openings 148 have a width W7 and the via contact openings 149 have a width W8 less than the width W7. The width W7 and the width W8 may be in a ratio (W7:W8) of about 2:1 to about 6:1. Depending on the diameter of the L-shaped conductive feature 153 and the gate electrode layer 167, the width W7 may be in a range of about 10 nm to about 120 nm, for example about 25 nm to about 50 nm. In some embodiments, the exposed top surface 153*t* of the L-shaped conductive contacts 153 may have a width in a range of about 1 nm to about 80 nm, and the top surface 167*t* of the gate electrode layers 167 may have a width in a range of about 1 nm to about 80 nm.

Figure 15A:
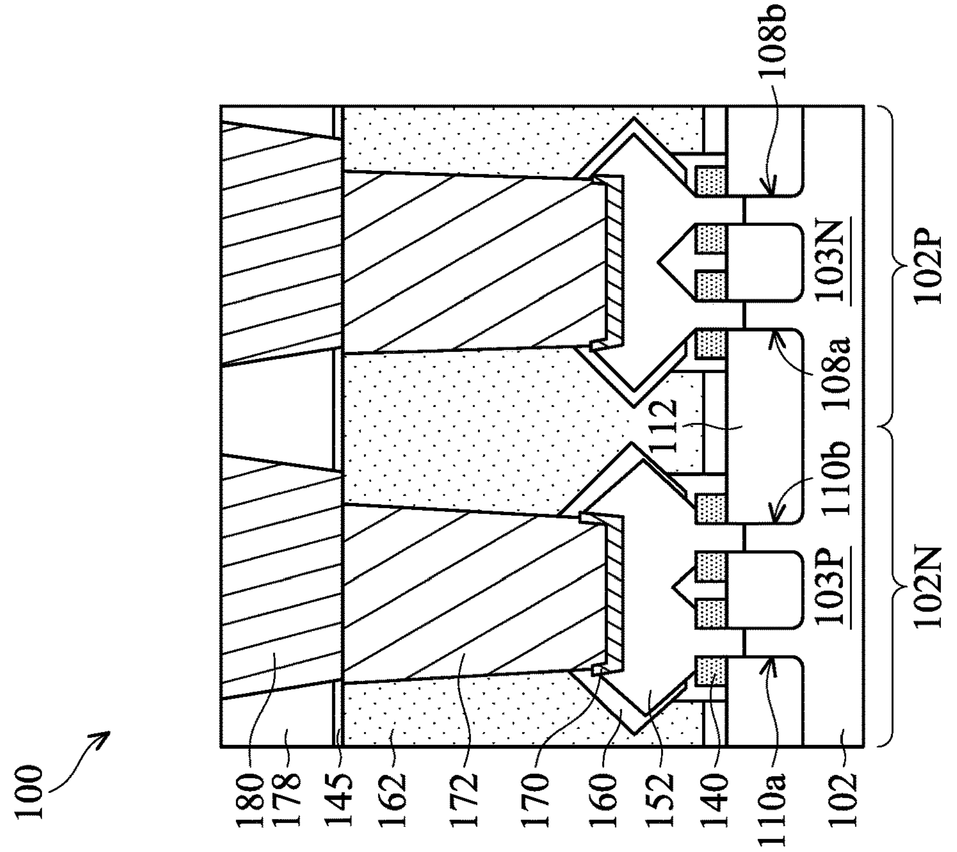
Figure 15B:
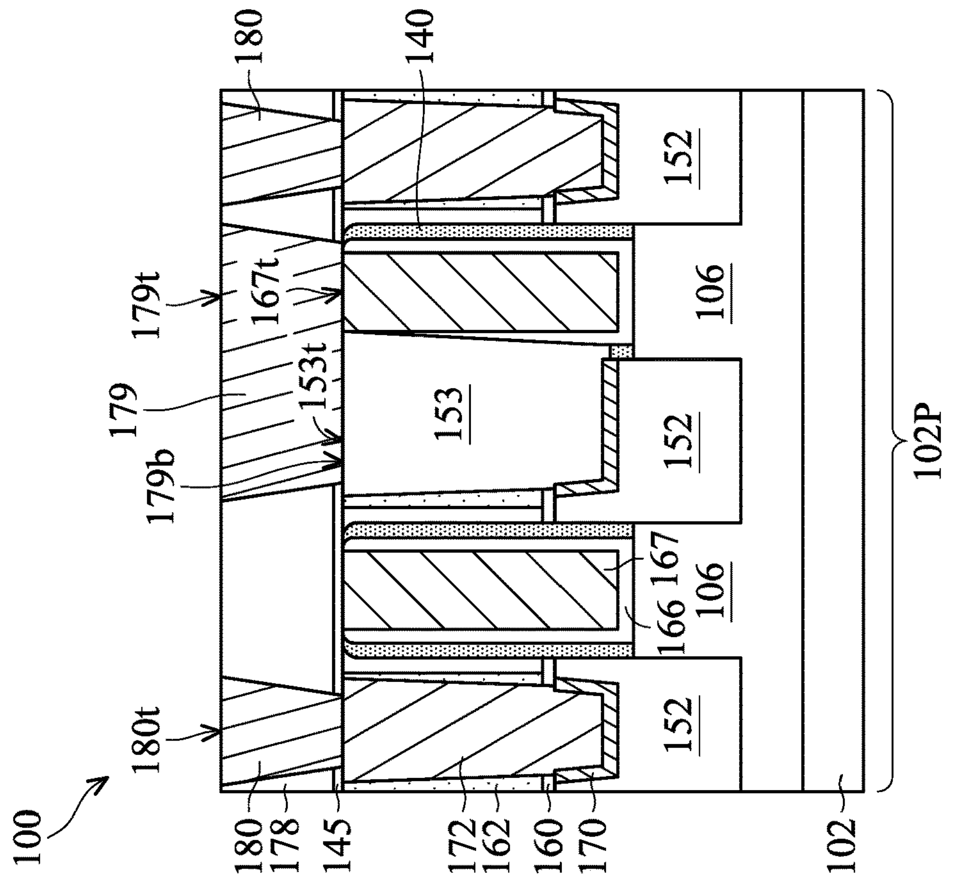
Figure 15C:
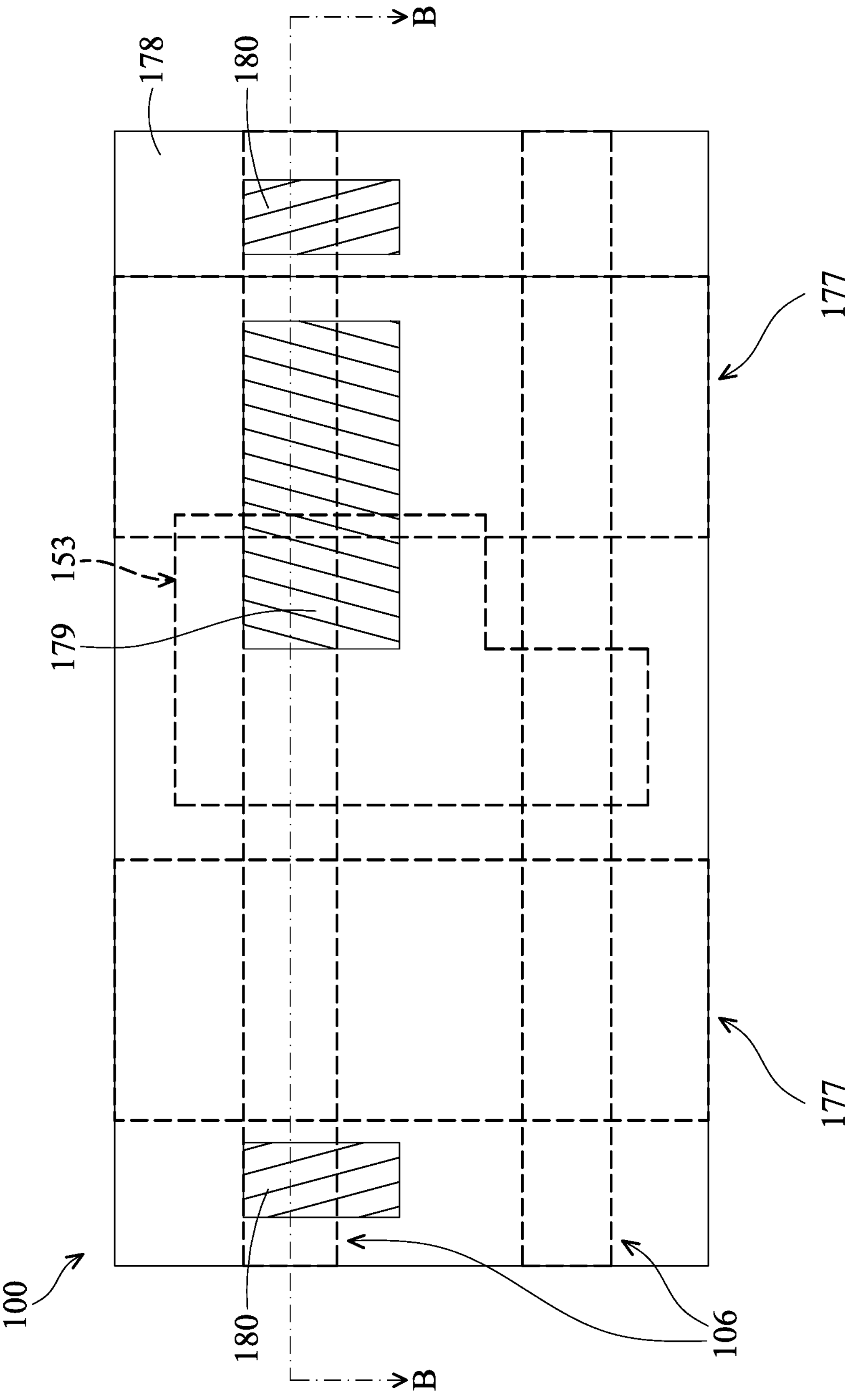

In FIGS. 15A-15C, butted contacts 179 and via contact features 180 are formed in the butted contact openings 148 and via contact openings 149 (FIG. 14B), respectively. Once the butted contacts 179 and via contact features 180 are formed, a planarization process, such as CMP, is performed on the semiconductor device structure 100 until the top surface of the third ILD 178 is exposed. The butted contacts 179 electrically connect the L-shaped conductive features 153 (e.g., S/D contacts for the epitaxial S/D features 152) to the gate electrode layer 167. The via contact features 180 serve as metal contacts for connecting to the epitaxial S/D features 152 through S/D contacts (e.g., conductive features 172). The butted contacts 179 rides across two conductive regions of the semiconductor device structure 100, such as a source/drain region of a first transistor and a gate region of a second transistor. The butted contact 179 abuts two conductive regions and can significantly reduce the number of contacts needed. The butted contacts 179 can be used in making electrical connections to a die area where high device density is desired, such as an embedded SRAM and DRAM cell area, thus, reducing the die area and enhancing device reliability.

Each of the butted contacts 179 has a bottom surface 179*b* landing on the top surface 153*t* of the L-shaped conductive features 153 and the top surface 167*t* of the gate electrode layer 167, respectively. The bottom surface 179*b* of the butted contact 179, the top surface 153*t* of the L-shaped conductive features 153, and the top surface 167*t* of the gate electrode layer 167 are co-planar. Likewise, the top surface 179*t* of the butted contact 179 and the top surface 180*t* of the via contact features 180 are co-planar. Therefore, the butted contacts 179 and the via contact features 180 are at same height. The butted contacts 179 and the L-shaped conductive features 153 enlarge contact surface area of the S/D contacts, which leads to reduced S/D contact resistance. In addition, since the top surface 153*t* of the L-shaped conductive features 153 and the top surface 167*t* of the gate electrode layer 167 are co-planar, the parasitic capacitance between the L-shaped conductive features 153 and the gate electrode layer 167 is reduced.

The butted contacts 179 and the via contact features 180 may include the same material as the conductive features 172, such as one or more of W, Co, Al, Pt, Ni, Ag, Ru, Cu, Ti, Ta, TiN, TaN, RuCo, Ru-alloy, Cu-alloy, W-alloy, Mo-alloy, or any suitable low-R metal. In some embodiments, the butted contacts 179 and the via contact features 180 include a material chemically different from each other. In some embodiments, a conductive barrier layer may be disposed prior to forming the butted contacts 179. Therefore, the conductive barrier layer is in contact with the butted contacts 179, the third ILD 178, the optional etch stop layer 145, the L-shaped contact features 153, the gate dielectric layer 166, and the gate spacer 140. In such cases, the barrier layer may include W, Mo, or other suitable material listed for the butted contacts 179. The barrier layer may include a material chemically different than the butted contacts 179. The butted contacts 179 and via contact feature 180 may be formed by any suitable process, such as PVD, CVD, ALD, electrochemical plating, or other suitable method. In some embodiments, the via contact features 180 and the butted contacts 179 are deposited by different deposition technique. For example, the via contact features 180 may be deposited in a bottom-up fashion (e.g., an ALD-based deposition process) and the butted contacts 179 may be deposited in a CVD-based deposition process.

Figure 16A:
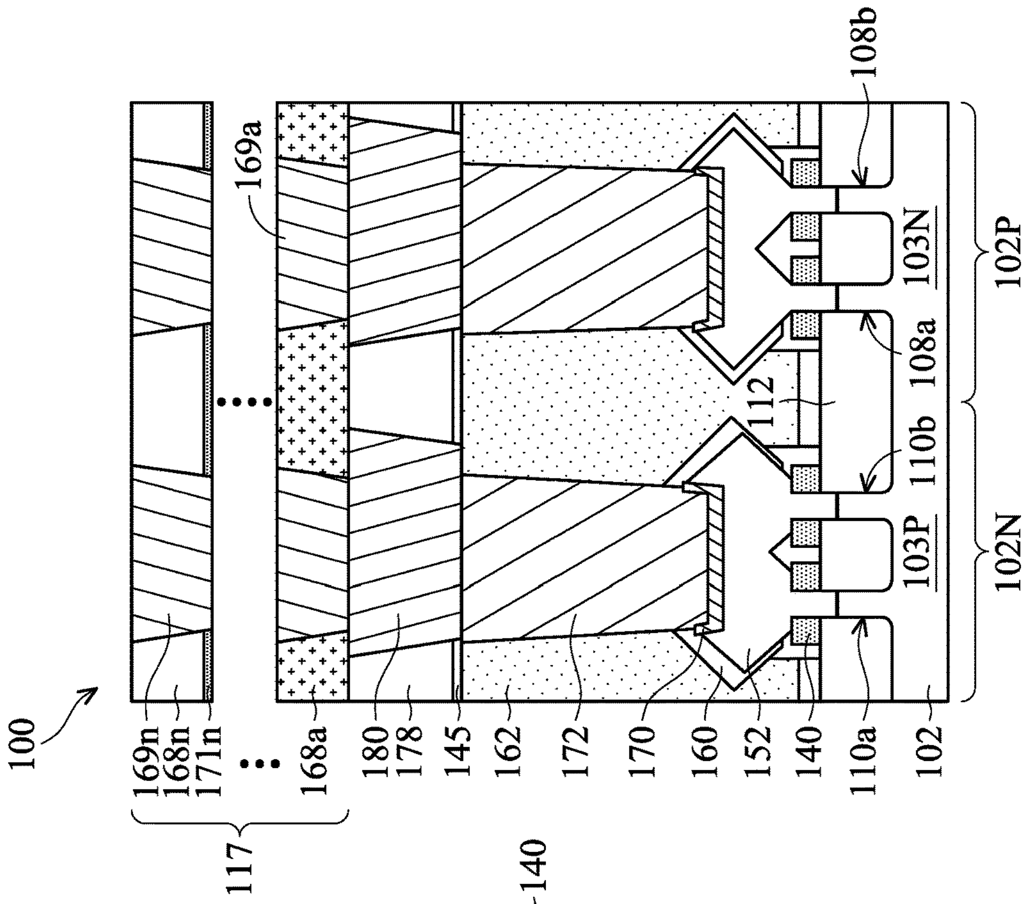
Figure 16B:
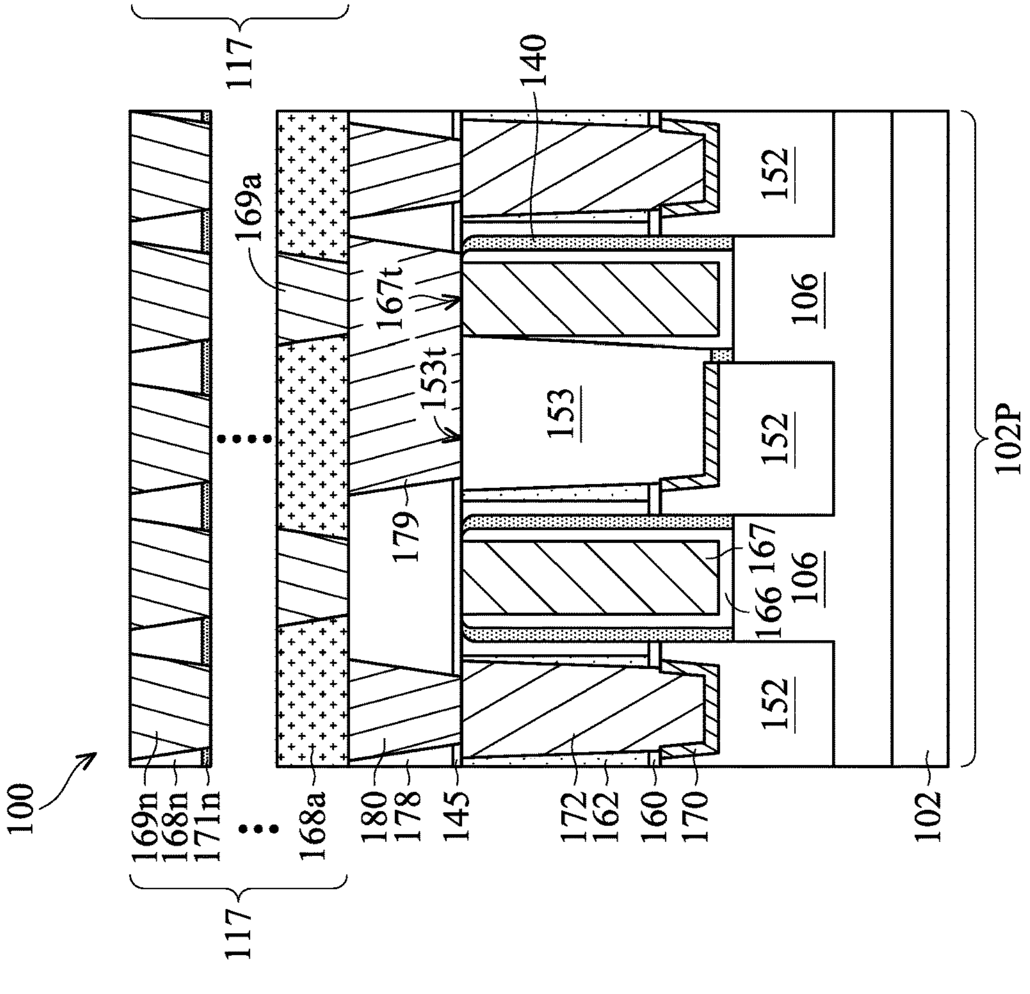

In FIGS. 16A-16B, an interconnect structure 117 is formed over the semiconductor device structure 100. In some embodiments, the interconnect structure 117 comprises a plurality of intermetal dielectric (IMD) layers 168*a*-168*n*, a plurality of conductive features 169*a*-169*n* embedded in the plurality of IMD layers, and a plurality of etch stop layers 171*a*-171*n* disposed between ILD and IMD layer (e.g., the third ILD 178 and the first IMD layer 168*a*) and between IMD layers (e.g., the first IMD 168*a* and the second IMD layer (not shown)). The IMD layers, the conductive features, and the etch stop layers may repeat until a desired number of the IMD layer 168*n* (e.g., topmost IMD layer in the interconnect structure 117), a desired number of the etch stop layer 171*n*, and a desired number of the conductive features 169*n* (e.g., topmost conductive features in the interconnect structure 117) embedded in the IMD layer 168*n* is achieved. Conductive features (e.g., conductive vias and conductive lines) may be formed using any suitable formation process (e.g., lithography with etching, damascene, dual damascene, or the like). In some embodiments, the steps for forming the conductive features may include forming openings in the respective dielectric layers, depositing a conductive layer in the openings, and subsequently performing a planarization process, such as a CMP process, to remove excess materials of the conductive material overfilling the openings. The conductive layer may be deposited by CVD, PVD, sputtering, electroplating, electroless plating, or other suitable deposition technique.

The IMD layers 168*a-n* may include or be formed of any suitable dielectric material, such as silicon oxide, a low dielectric constant (low-k) material, or a combination thereof. The low-k material may include fluorinated silica glass (FSG), phosphosilicate glass (PSG), borophosphosilicate glass (BPSG), amorphous fluorinated carbon, Parylene, BCB (bis-benzocyclobutenes), polyimide, SiOxCyHz, or SiOxCy, where x, y and z are integers or non-integers, and/or other future developed low-k dielectric materials. The IMD layers 168*a-n* may be deposited by a plasma-enhanced CVD (PECVD) process or other suitable deposition technique. The material of the etch stop layers 171*a-n* is chosen such that etch rates of the etch stop layers 171*a-n* are less than etch rates of the IMD layers 168*a-n*. In some embodiments, the etch stop layers 171*a-n* may include the same material as the etch stop layer 145 described above. The conductive vias/lines (e.g., conductive features 169*a-n*) may include or be formed of any suitable electrically conductive material, such as W, Ru, Co, Cu, Ti, TiN, Ta, TaN, Mo, Ni, or combinations thereof.

In some embodiments, one or more etch stop layers may be omitted. For example, the IMD layer 168*a* may be in direct contact with the third ILD 178, as shown in FIG. 16B. This may be advantageous in some cases because the etch stop layer has high dielectric constant. Having fewer etch stop layers can lower the overall capacitance of the device.

Figure 17A:
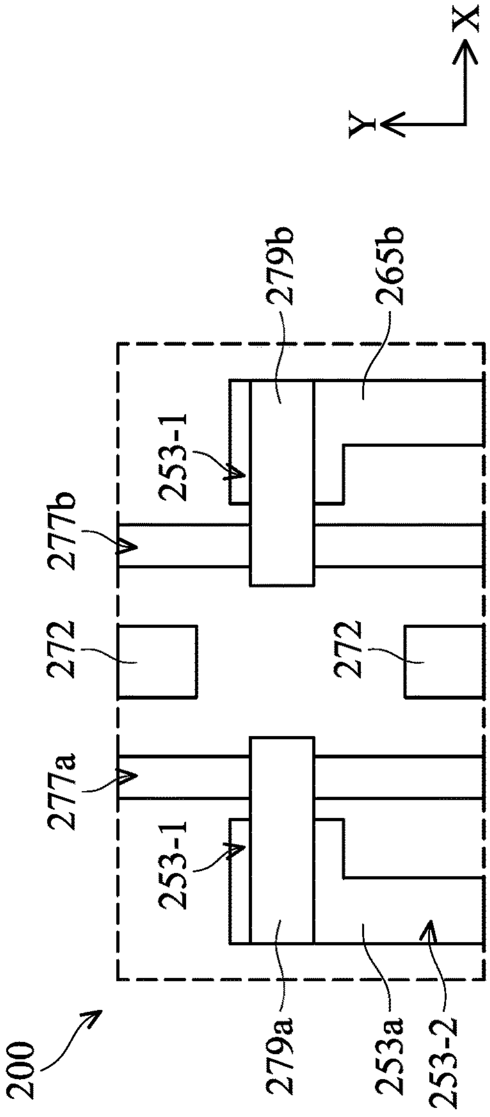
FIGS. 17A-17I illustrate layout views of a portion of a semiconductor device structure, in accordance with some alternative embodiments.

FIGS. 17A-17I illustrate layout views of a portion of a semiconductor device structure 200, in accordance with some alternative embodiments. The semiconductor device structure 200 is substantially identical to the semiconductor device structure 100 except that the arrangement/configuration of S/D contacts and butted contacts are proposed. In FIG. 17A, replacement gate structures 277*a*, 277*b* (collectively referred to as replacement gate structures 277), such as the replacement gate structures 177, are parallelly arranged along the Y-direction. L-shaped conductive features 253*a*, 253*b* (collectively referred to as L-shaped conductive features 253), such as the L-shaped conductive features 153, are disposed at one side of the respective replacement gate structure 277. Each L-shaped conductive feature 253 has a first portion 253-1 and a second portion 253-2 protruding from one end of the first portion 253-1. The second portion 253-2 of the L-shaped conductive features 253 are arranged parallelly with respect to the replacement gate structure 277. The first portion 253-1 extends towards the replacement gate structure 277 (e.g., replacement gate structure 277*a*) and has a squared shape. The L-shaped conductive feature 253*a* may serve as a S/D contact for a source/drain feature of a first transistor, and the L-shaped conductive feature 253*b* may serve as a S/D contact for a source/drain feature of a second transistor. In one exemplary embodiment, the L-shaped conductive features 253*a*, 253*b* are symmetrically arranged. Conductive features 272, such as the conductive features 172, may serve as a S/D contact for a source/drain feature of a transistor disposed between the replacement gate structures 277. Butted contacts 279*a*, 279*b* (collectively referred to as butted contacts 279) are arranged to electrically connect the L-shaped conductive features 253 to the respective replacement gate structures 277. For example, the butted contact 279*a* electrically connects the L-shaped conductive feature 253*a* to the replacement gate structure 277*a* through the first portion 253-1 of the L-shaped conductive feature 253*a*, while the butted contact 279*b* electrically connects the L-shaped conductive feature 253*b* to the replacement gate structure 277*b* through the first portion 253-1 of the L-shaped conductive feature 253*b*.

Figure 17B:
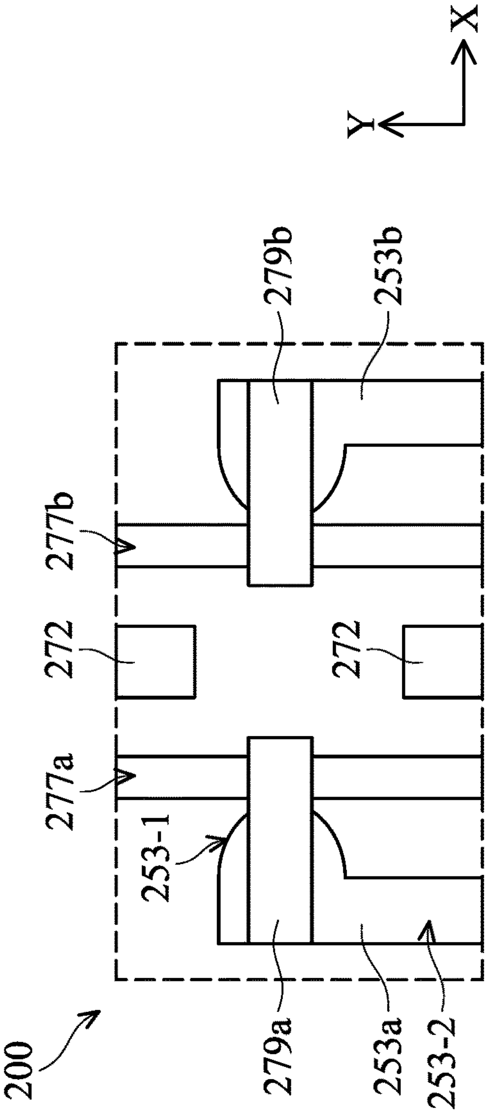

In FIG. 17B, the embodiment is substantially identical to the embodiment of FIG. 17A except for the first portion 253-1 of the L-shaped conductive feature 253 being a rounded shape.

Figure 17C:
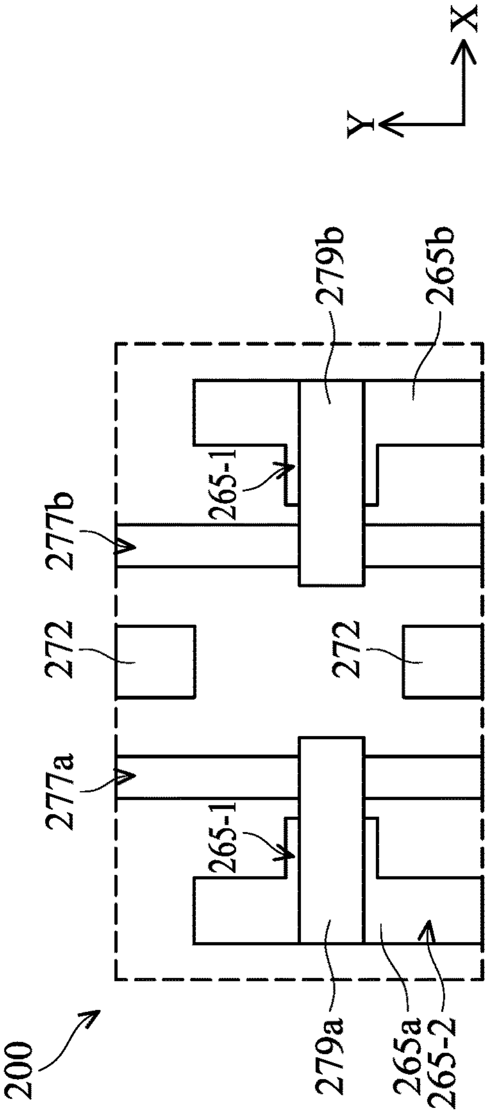

In FIG. 17C, the embodiment is similar to the embodiment of FIG. 17A except that the L-shaped conductive features 253 is being replaced by T-shaped conductive features 265*a*, 265*b* (collectively referred to as T-shaped conducive features 265). Each T-shaped conductive feature 265 has a first portion 265-1 and a second portion 265-2 protruding from the middle of the first portion 265-1. Likewise, the butted contact 279*a* electrically connects the T-shaped conductive feature 265*a* to the replacement gate structure 277*a* through the first portion 265-1 of the T-shaped conductive feature 265, while the butted contact 279*b* electrically connects the T-shaped conductive feature 265*b* to the replacement gate structure 277*b* through the first portion 265-1 of the T-shaped conductive feature 265*b*.

Figure 17D:
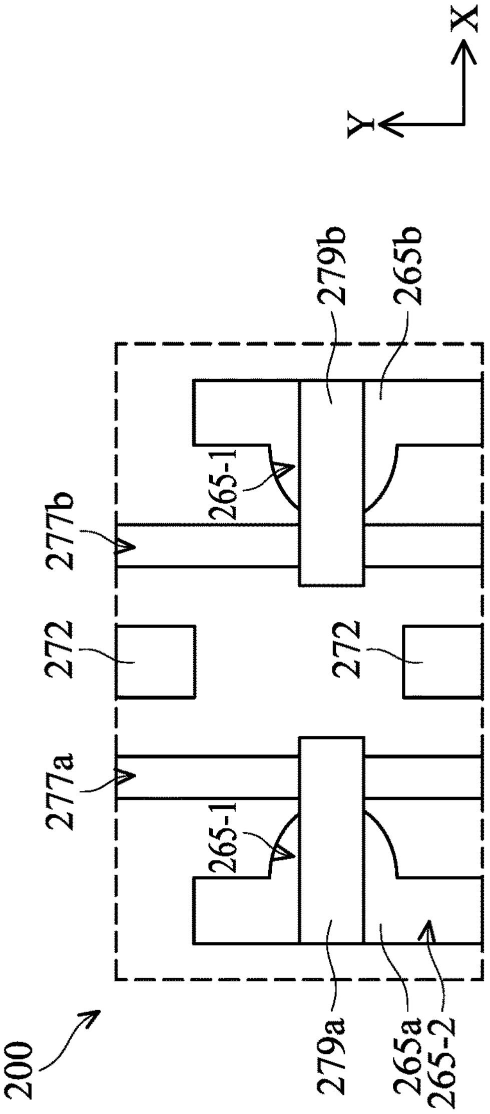

In FIG. 17D, the embodiment is similar to the embodiment of FIG. 17C except for the first portion 265-1 of the T-shaped conductive feature 265 being a rounded shape.

Figure 17E:
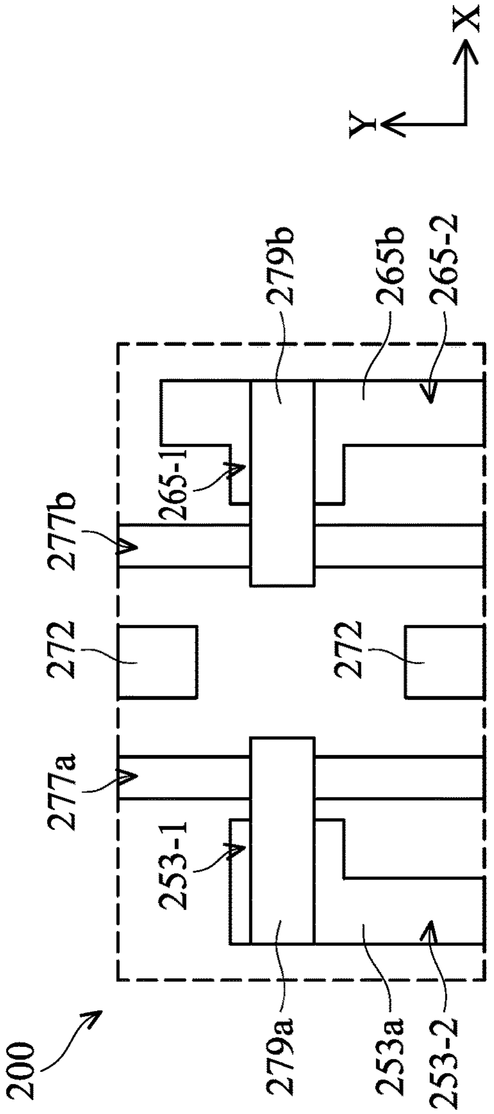

In FIG. 17E, the embodiment is similar to the embodiments of FIGS. 17A and 17C except that different profiles of S/D features are adapted. Particularly, an L-shaped conductive feature (e.g., the L-shaped conductive feature 253*a*) and a T-shaped conductive feature (e.g., the T-shaped conductive feature 265*b*) are used as metal contacts (i.e., S/D contacts) for the epitaxial S/D features 152. In this embodiment, the butted contact 279*a* electrically connects the L-shaped conductive feature 253*a* to the replacement gate structure 277*a* through the first portion 253-1 of the L-shaped conductive feature 253*a*, while the butted contact 279*b* electrically connects the T-shaped conductive feature 265*b* to the replacement gate structure 277*b* through the first portion 265-1 of the T-shaped conductive feature 265*b*.

Figure 17F:
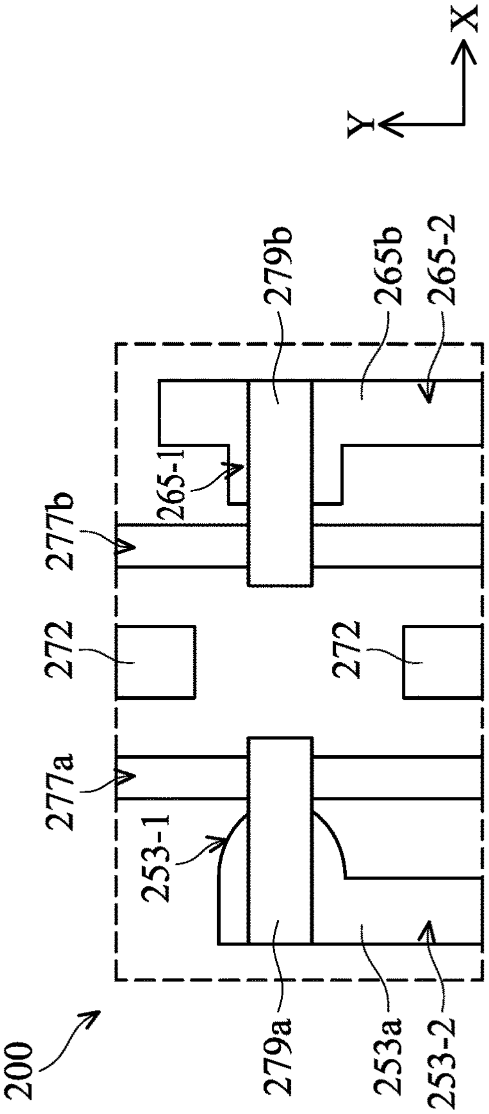

In FIG. 17F, the embodiment is similar to the embodiment of FIG. 17E except for the first portion 253-1 of the L-shaped conductive feature 253 being a rounded shape.

Figure 17G:
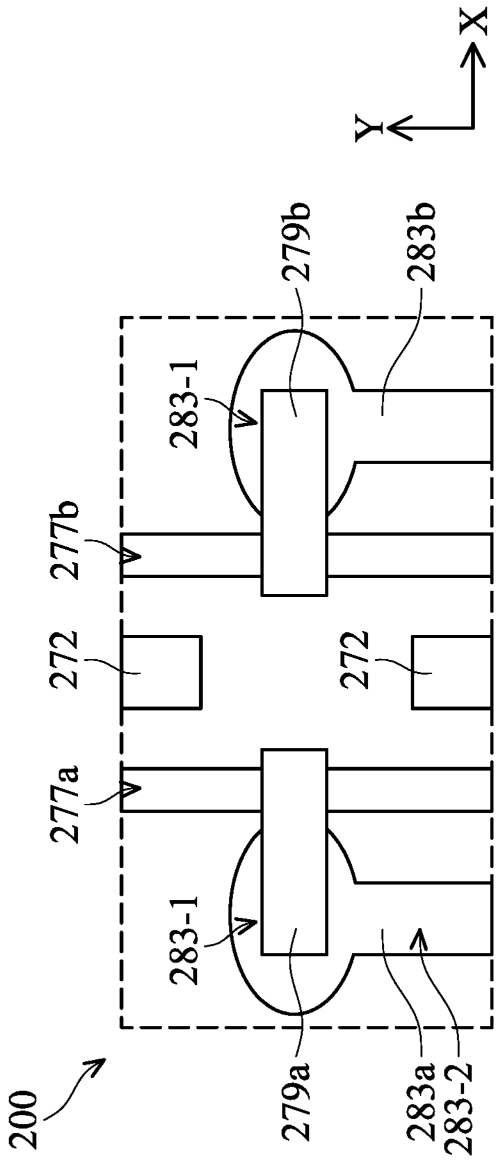

In FIG. 17G, the embodiment is similar to the embodiment of FIG. 17D except that different profiles of S/D features are adapted. In this embodiment, T-shaped conductive features 283*a*, 283*b* (collectively referred to as T-shaped conductive features 283) are used as metal contacts (i.e., S/D contacts) for the epitaxial S/D features 152. The T-shaped conductive features 283*a*, 283*b* are oriented differently than the T-shaped conductive features 265*a*, 265*b* shown in FIG. 17D. Each T-shaped conductive features 283*a*, 283*b* includes a first portion 283-1 and a second portion 283-2 protruding from the middle of the first portion 283-1. The second portion 283-2 of the T-shaped conductive features 283 is arranged parallelly with respect to the replacement gate structures 277. Particularly, the first portion 283-1 has a rounded-shape or oval-shaped profile. Likewise, the butted contact 279*a* electrically connects the T-shaped conductive feature 283*a* to the replacement gate structure 277*a* through the first portion 283-1 of the T-shaped conductive feature 283*a*, while the butted contact 279*b* electrically connects the T-shaped conductive feature 283*b* to the replacement gate structure 277*b* through the first portion 283-1 of the T-shaped conductive feature 283*b*.

Figure 17H:
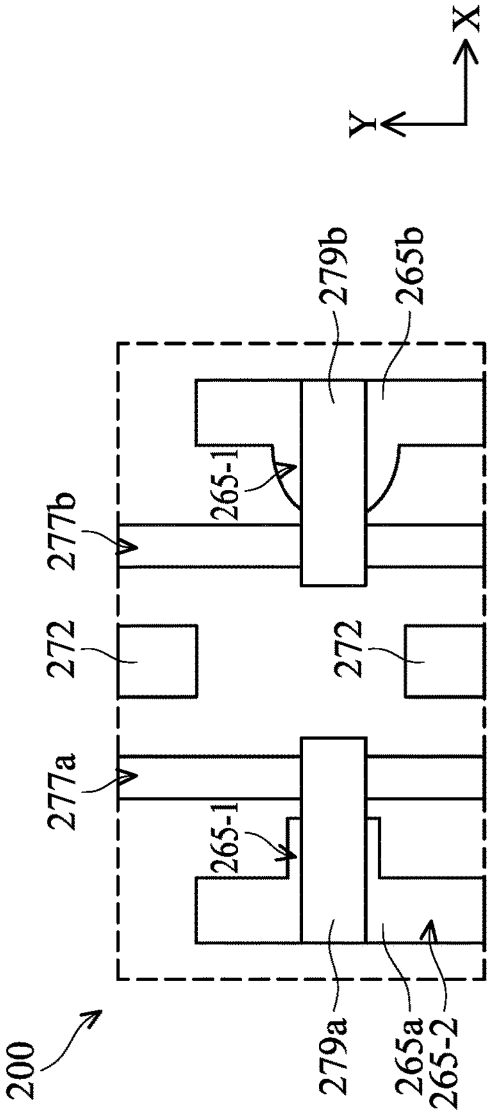

In FIG. 17H, the embodiment is similar to the embodiments of FIGS. 17C and 17D except that different profiles of S/D features are adapted. Particularly, a T-shaped conductive feature (e.g., the T-shaped conductive feature 265*a* shown in FIG. 17C) and a T-shaped conductive feature (e.g., the T-shaped conductive feature 265*b* shown in FIG. 17D) are used as metal contacts (i.e., S/D contacts) for the epitaxial S/D features 152. In this embodiment, the butted contact 279*a* electrically connects the T-shaped conductive feature 265*a* to the replacement gate structure 277*a* through the first portion 265-1, which has a squared-shape, while the butted contact 279*b* electrically connects the T-shaped conductive feature 265*b* to the replacement gate structure 277*b* through the first portion 265-1, which has a rounded-shape.

Figure 17I:
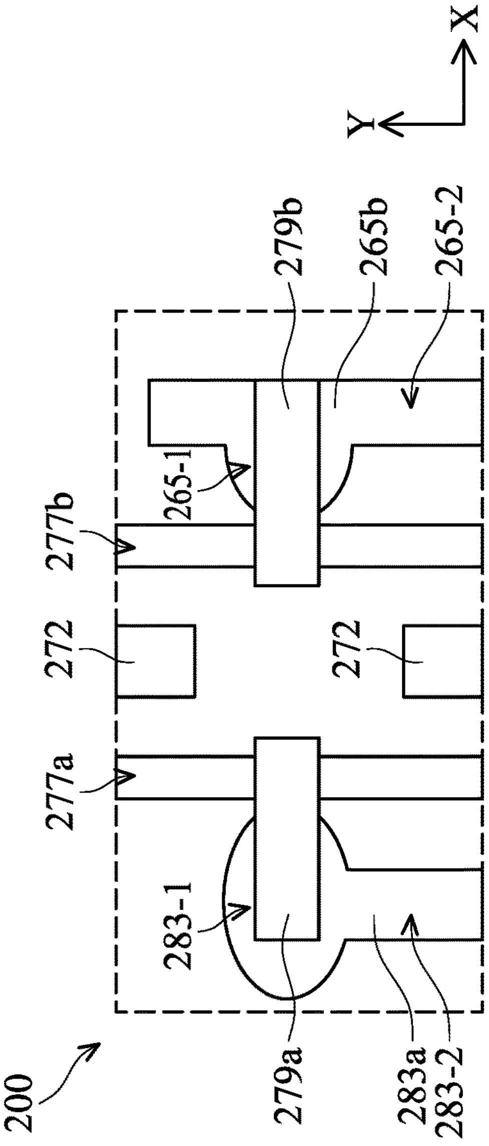

In FIG. 17I, the embodiment is similar to the embodiments of FIGS. 17G and 17H except that different profiles of S/D features are adapted. Particularly, a T-shaped conductive feature (e.g., the T-shaped conductive feature 283*a* shown in FIG. 17G) and a T-shaped conductive feature (e.g., the T-shaped conductive feature 265*b* shown in FIG. 17D) are used as metal contacts (i.e., S/D contacts) for the epitaxial S/D features 152. In this embodiment, the butted contact 279*a* electrically connects the T-shaped conductive feature 283*a* to the replacement gate structure 277*a* through the first portion 283-1, which has a rounded-shape, while the butted contact 279*b* electrically connects the T-shaped conductive feature 265*b* to the replacement gate structure 277*b* through the first portion 265-1, which also has a rounded-shape. However, the orientation of the T-shaped conductive features 283*a*, 265*b* are different from each other.

Figure 18A:
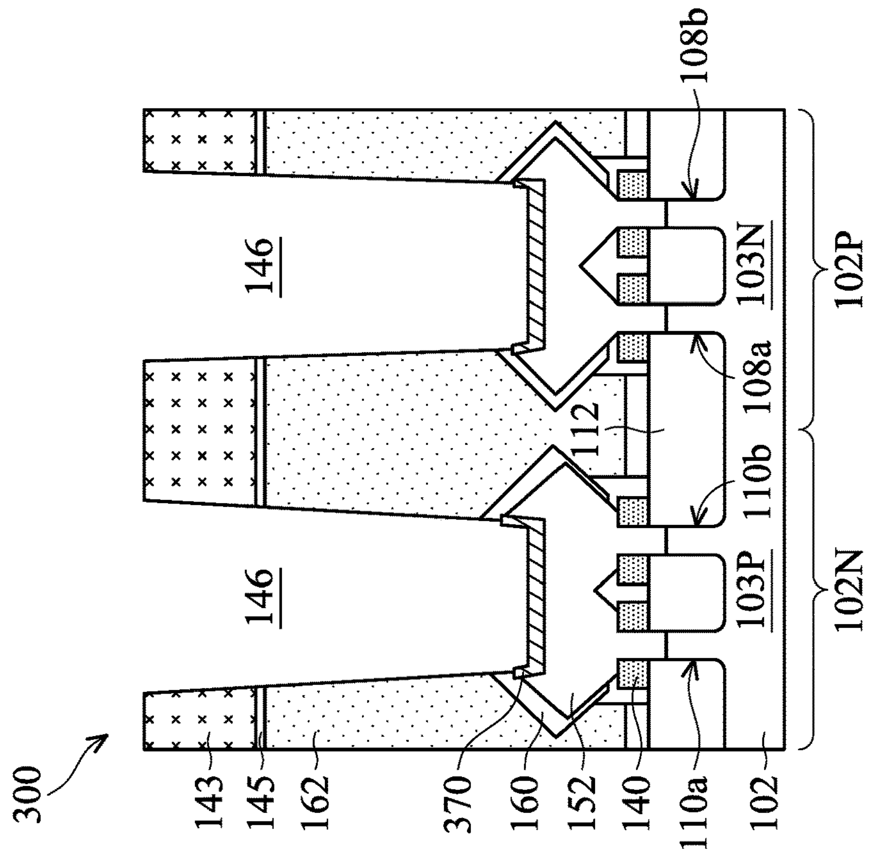
Figure 18B:
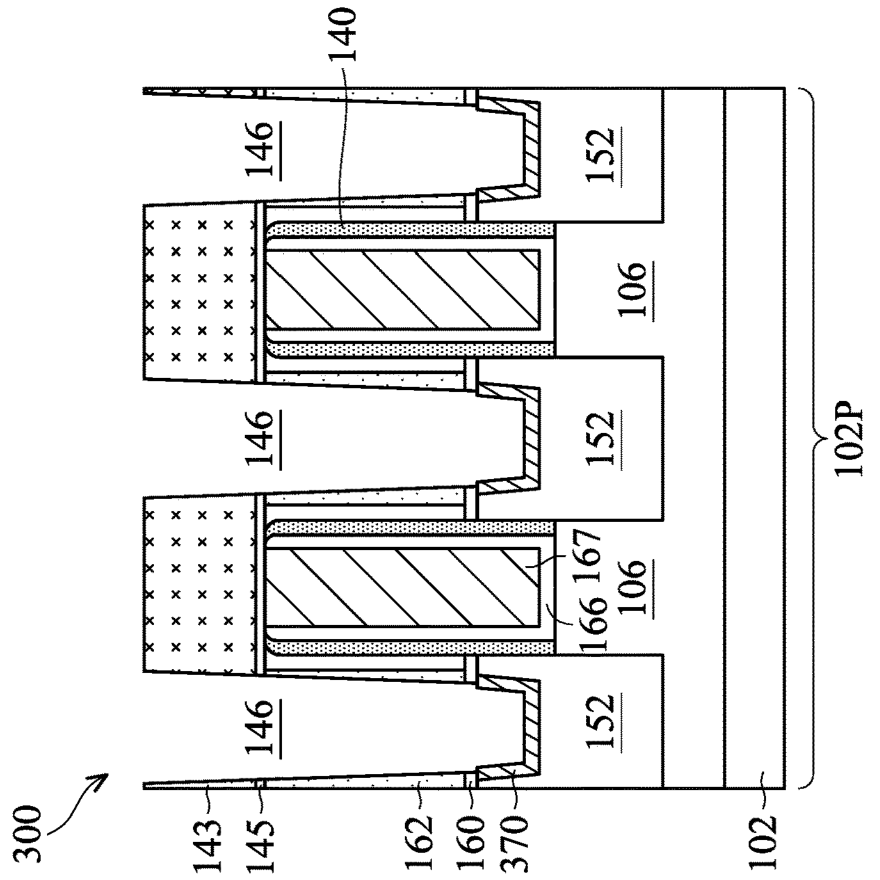
Figure 18C:
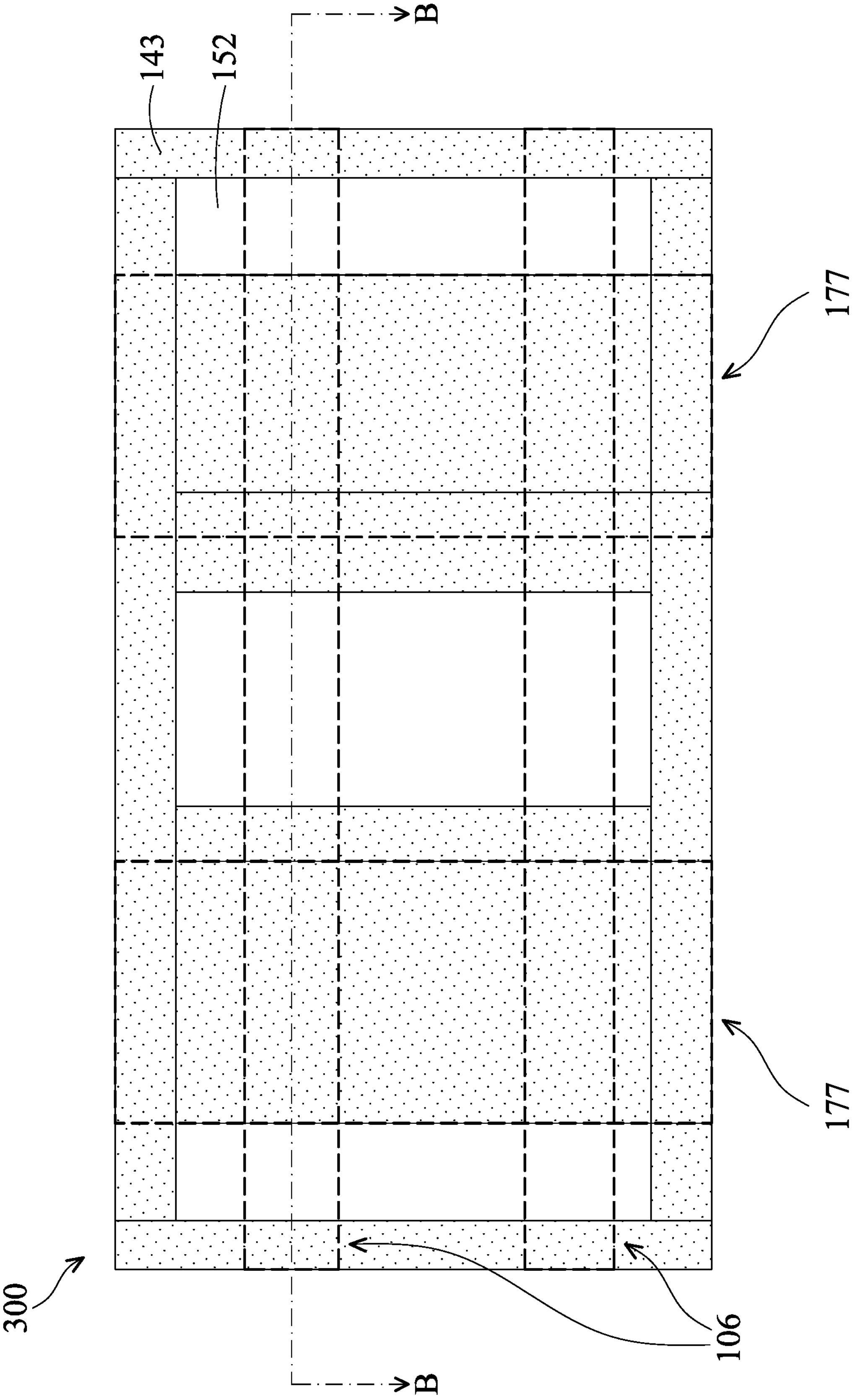

FIGS. 18A-18C to FIGS. 24A-24B illustrate various stages of manufacturing a semiconductor device structure 300, in accordance with some embodiments. This embodiment is similar to the embodiments shown in FIG. 15B except that a rectangular-shaped S/D contact is used at regions where butted contacts are to be formed. This embodiment is useful when one single patterning process is used to form butted contacts that have a small gap disposed therebetween, which can be challenging for some lithography processes due to formation of unwanted bridging between the butted contacts. In FIGS. 18A-18C, after the second CESL 141 and the second ILD 143 are formed, portions of the second ILD 143, the second CESL 141, the first ILD 162, and the first CESL 160 disposed on both sides of the replacement gate structures 177 are removed. The removal of the portions of the second ILD 143, the second CESL 141, the first ILD 162, and the first CESL 160 forms contact opening 146 exposing the epitaxial S/D features 152. In some embodiments, an upper portion of the exposed epitaxial S/D features 152 is also removed. An etch process, such as a dry etch, a wet etch, or a combination thereof, may be used to form the contact openings 146. Likewise, the sidewalls of the contact openings 146 may be vertical or slanted. The contact openings 146 have a rectangular-shaped profile when viewing from top and may be formed at once by any suitable lithography process.

Figure 19A:
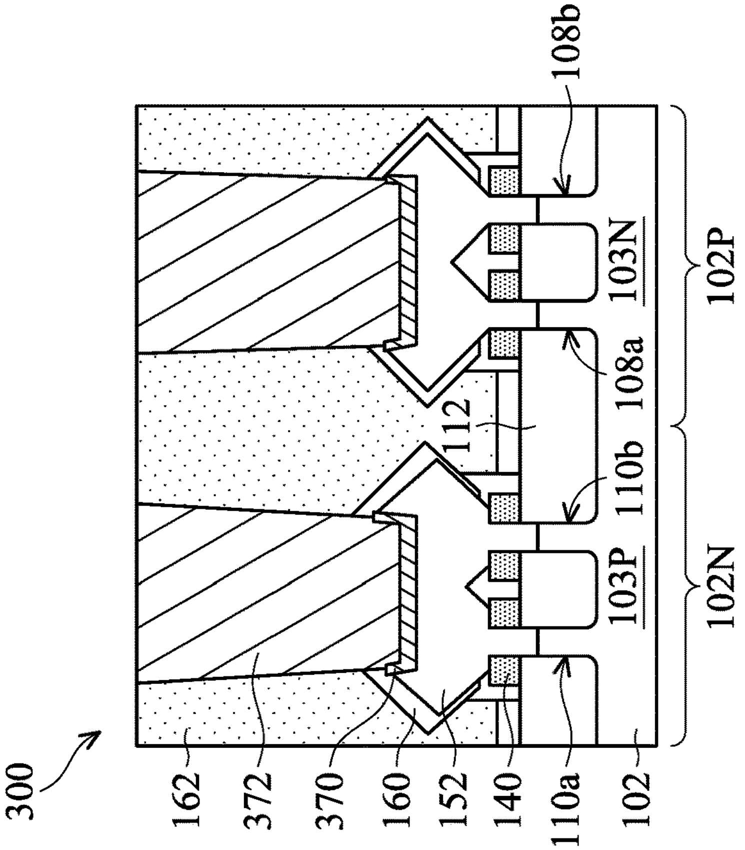
Figure 19B:
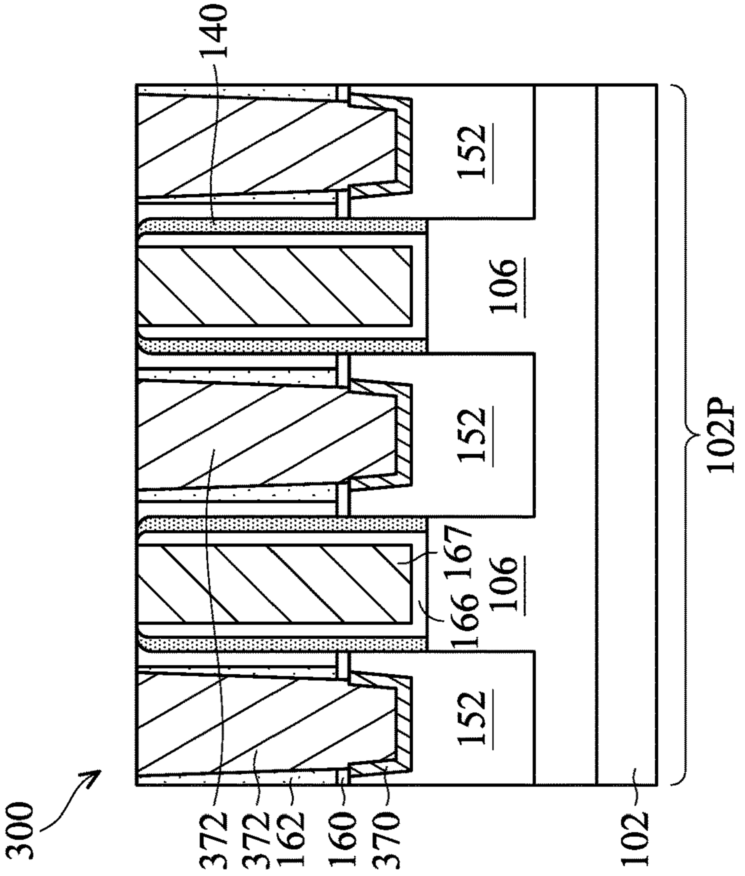
Figure 19C:
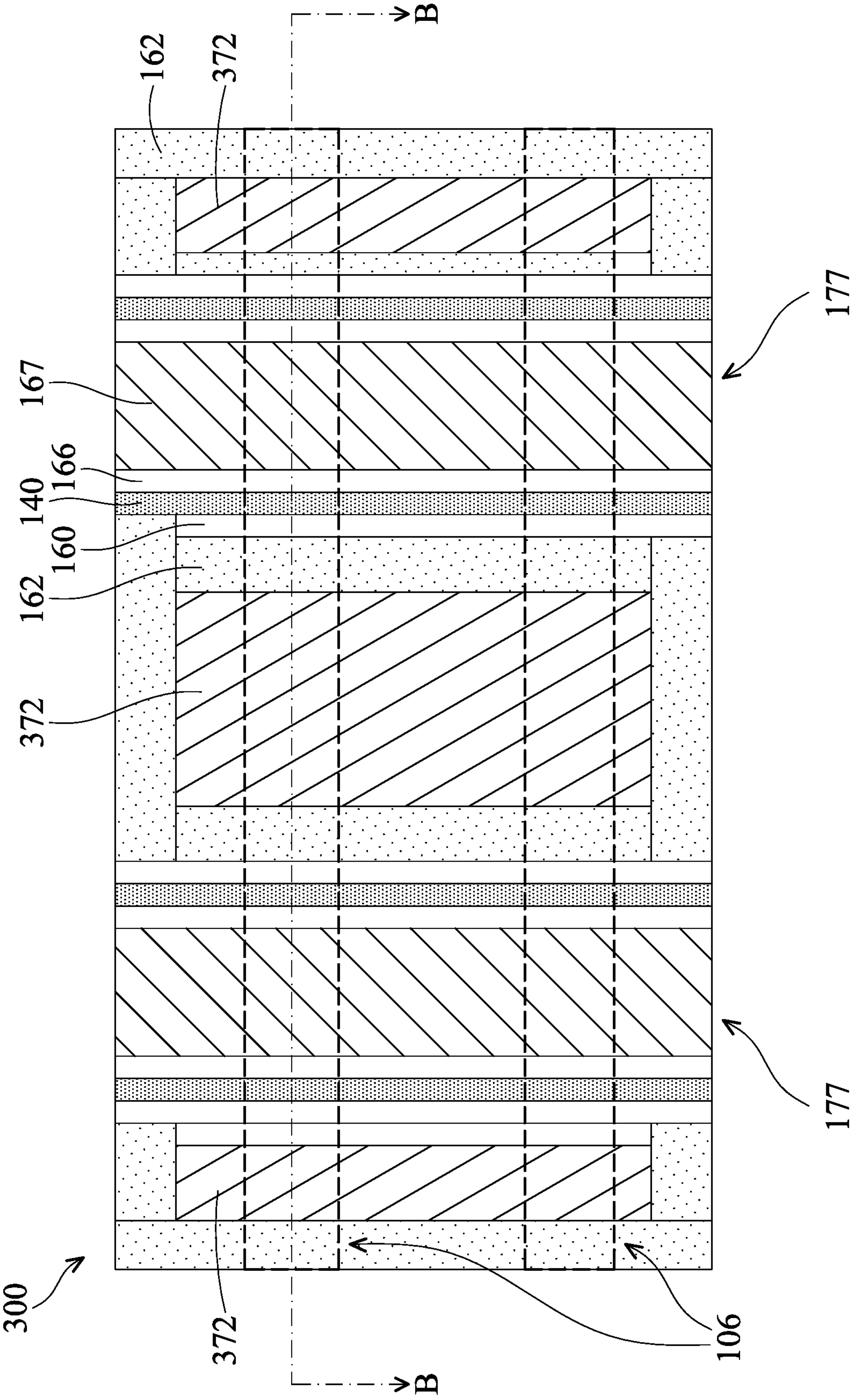

In FIGS. 19A-19C, conductive features 372 are formed over the epitaxial S/D features 152 in the contact openings 146. The conductive features 372 serve as S/D contacts for the epitaxial S/D features 152. The conductive features 372 may include the same material as the conductive features 172. A silicide layer 370, such as the silicide layer 170, may be formed between the S/D epitaxial feature 152 and the conductive feature 372. Once the conductive features 372 are formed, a planarization process, such as CMP, is performed on the semiconductor device structure 300 until the top surface of the first ILD 162 is exposed. As a result, the top surfaces of the conductive feature 372, the gate electrode layer 167, the gate dielectric layer 166, the gate spacers 140, the CESL 160, and the first ILD 162 are substantially co-planar.

Figure 20A:
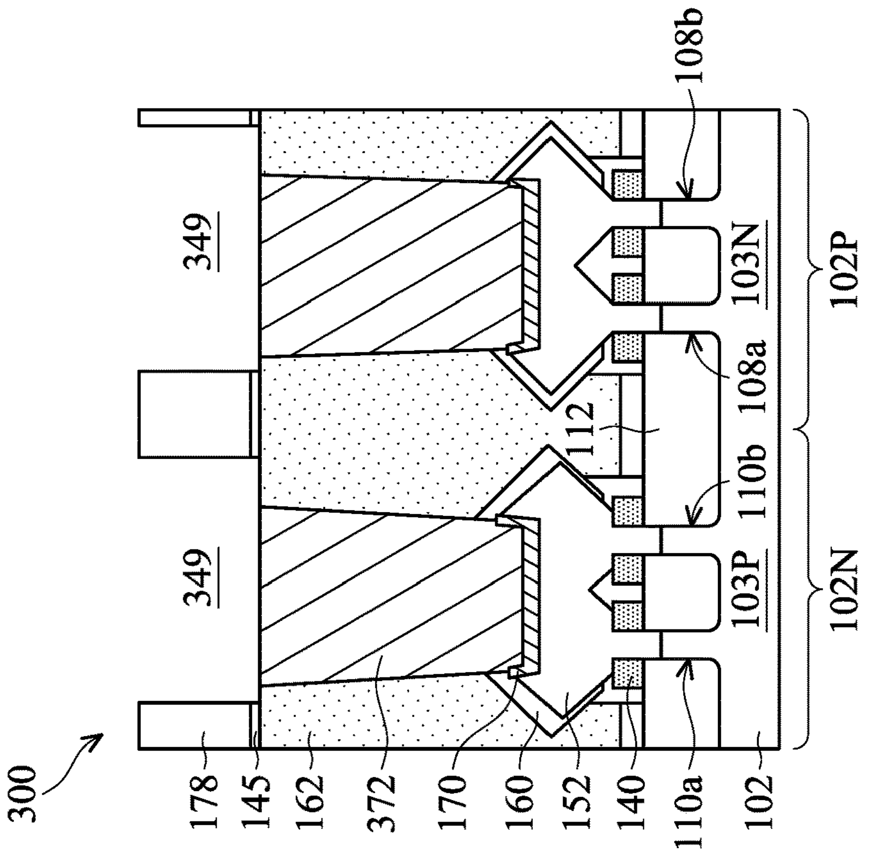
Figure 20B:
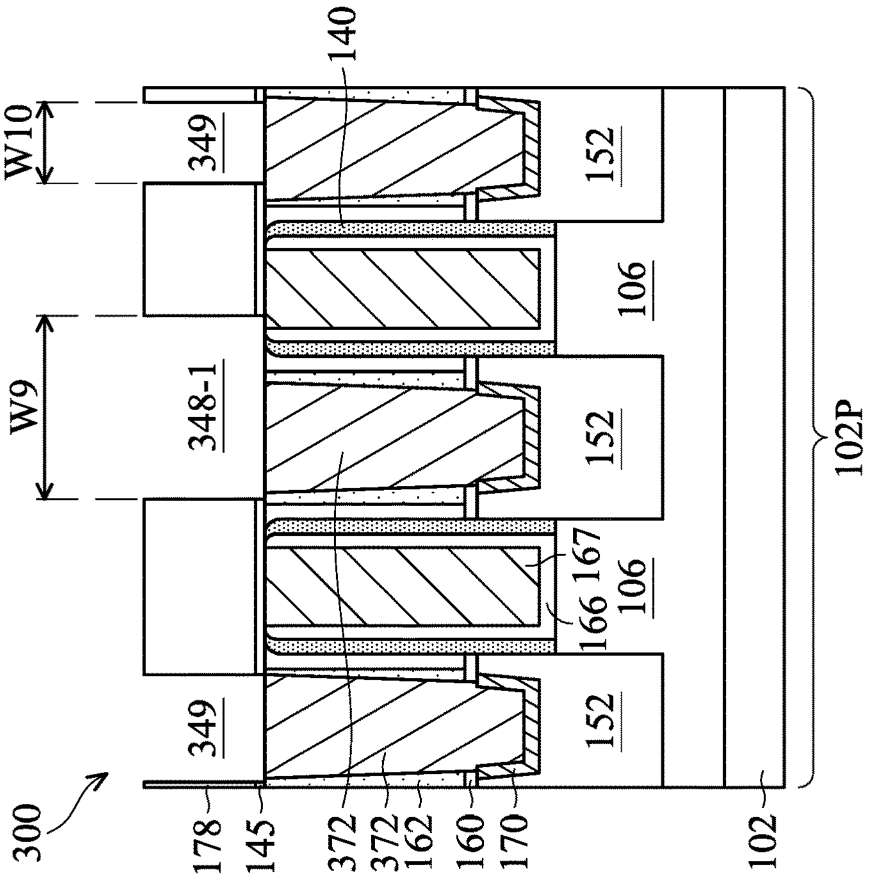
Figure 20C:
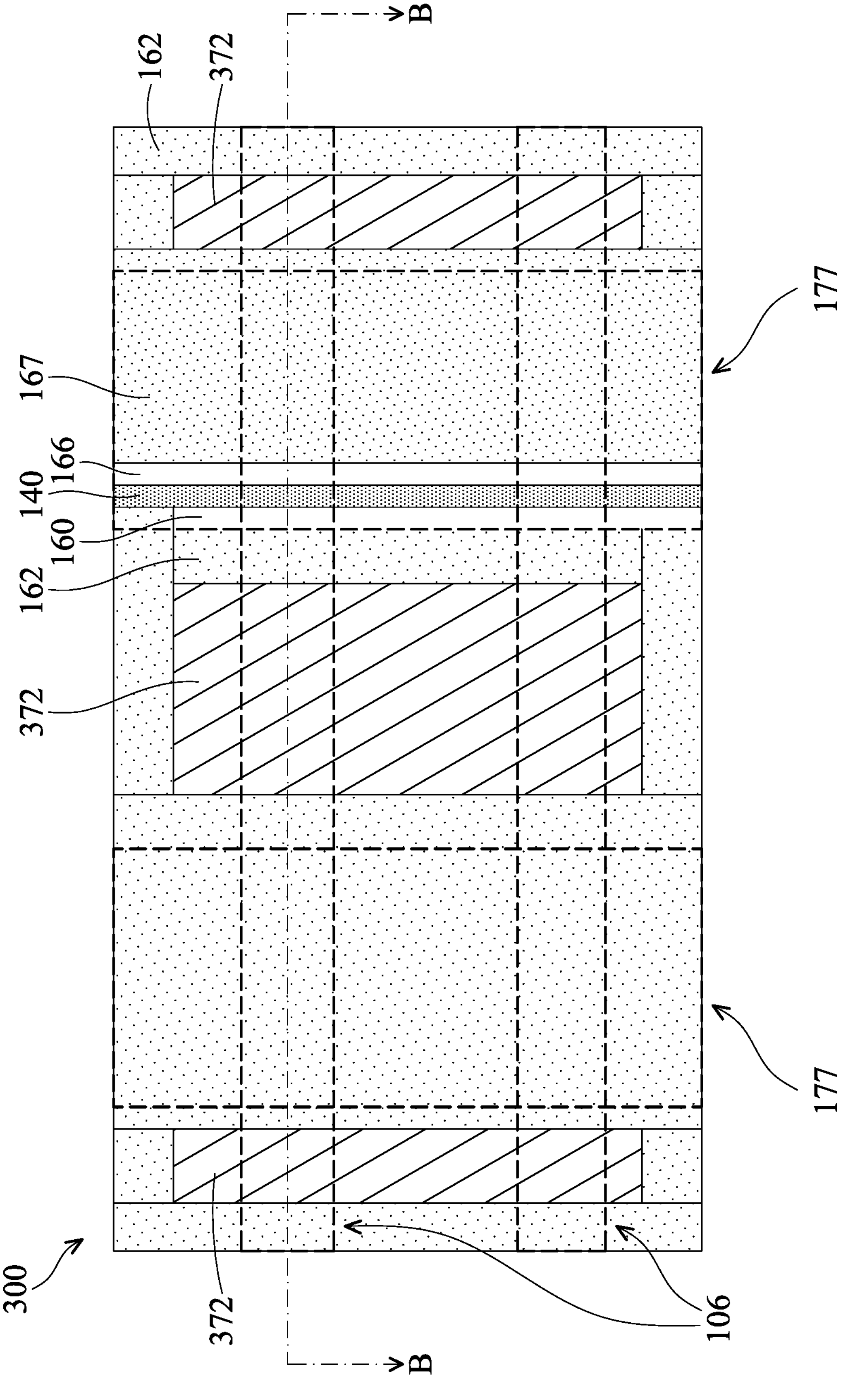

In FIGS. 20A-20C, an etch stop layer 145 and a third ILD 178 are sequentially formed over the semiconductor device structure 300 in a similar fashion as discussed above with respect to FIGS. 13A-13C. Thereafter, portions of the third ILD 178 and the etch stop layer 145 disposed over the conductive features 372 are removed. The removal of the portions of the third ILD 178 and the etch stop layer 145 forms via contact openings 349 exposing the conductive features 372. At regions where butted contacts are to be formed, the removal of the portions of the third ILD 178 and the etch stop layer 145 forms first half of butted contact openings 348-1, which have a width W9 greater than the width W10 of the via contact openings 349. In some embodiments, the width W9 is about 50% to about 70% of the width W12 of the final butted contacts 379 (FIG. 23B). The first half of butted contact openings 348-1 expose the conductive features 372, the first ILD 162, the CESL 160, and the gate spacer 140. In some embodiments, the first half of butted contact openings 348-1 expose the conductive features 372, the first ILD 162, the CESL 160, the gate spacer 140, and the gate electrode layer 167. The via contact openings 349 and the first half of butted contact openings 348-1 may be formed at once using any suitable lithography process.

Figure 21A:
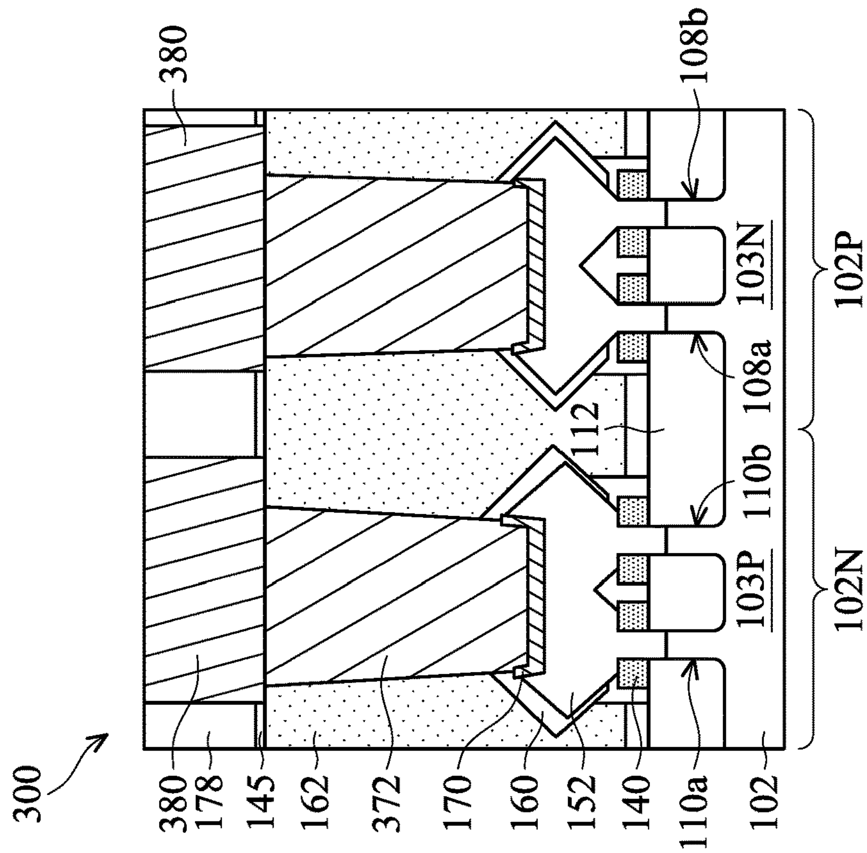
Figure 21B:
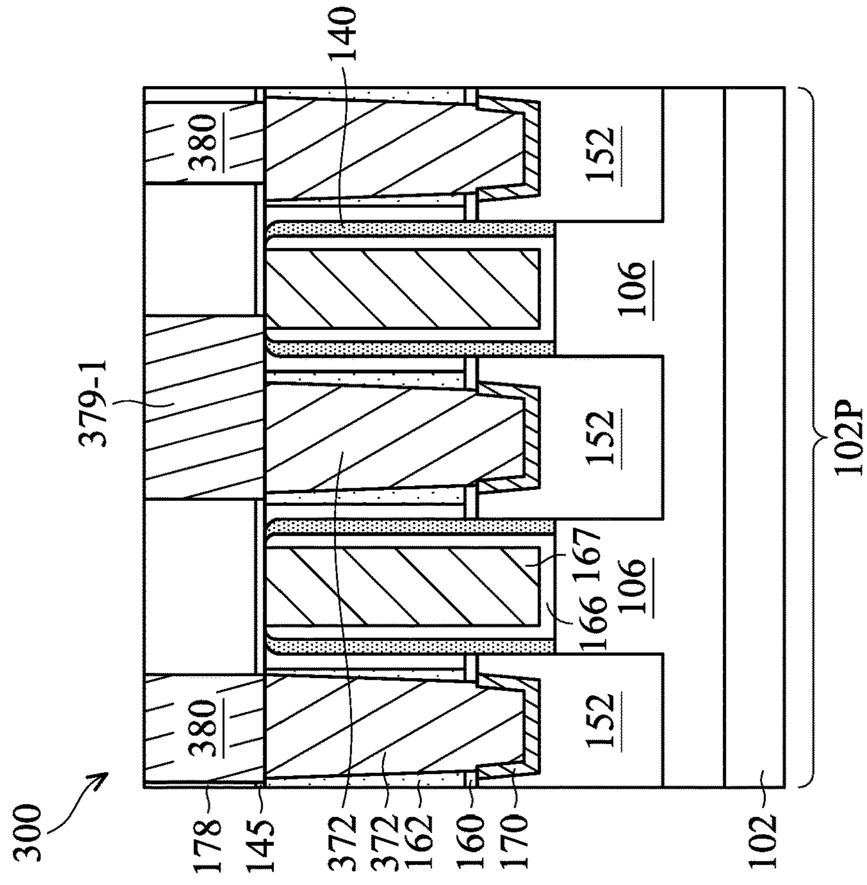
Figure 21C:
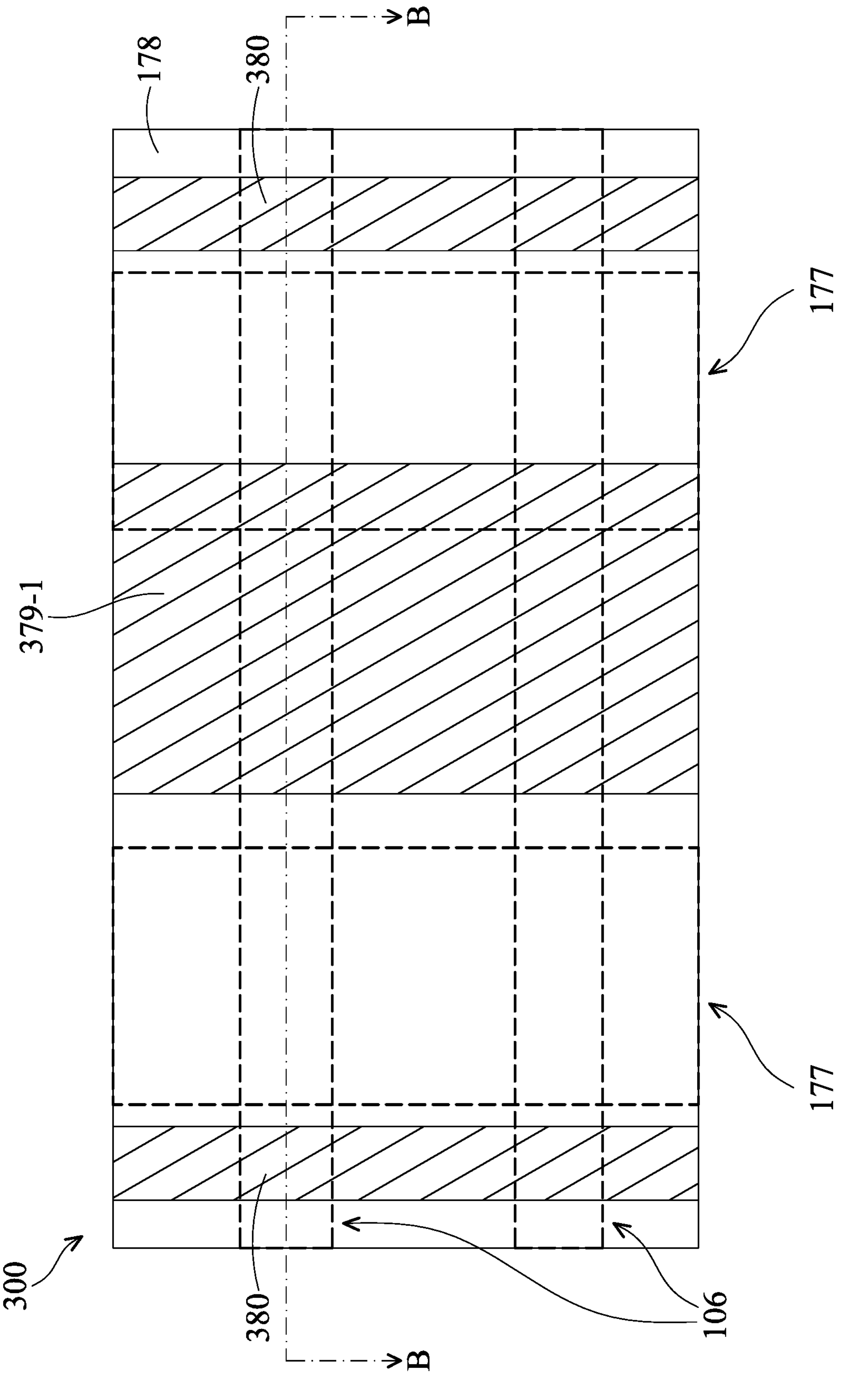

In FIGS. 21A-21C, first half of butted contacts 379-1 and via contact features 380 are formed in the first half of butted contact openings 348-1 and via contact openings 349 (FIG. 20B), respectively. Once the first half of butted contacts 379-1 and via contact features 380 are formed, a planarization process, such as CMP, is performed on the semiconductor device structure 300 until the top surface of the third ILD 178 is exposed. The first half of butted contacts 379-1 and the via contact features 380 may include the same material as the conductive features 172. The first half of butted contacts 379-1 and the via contact features 380 may include an electrically conductive material, such as one or more of Ru, Mo, Co, Ni. W, Ti, Ta, Cu, Al, TiN and TaN. In some embodiments, the first half of butted contacts 379-1 and the via contact features 380 include a material chemically different than the conductive features 172.

Figure 22A:
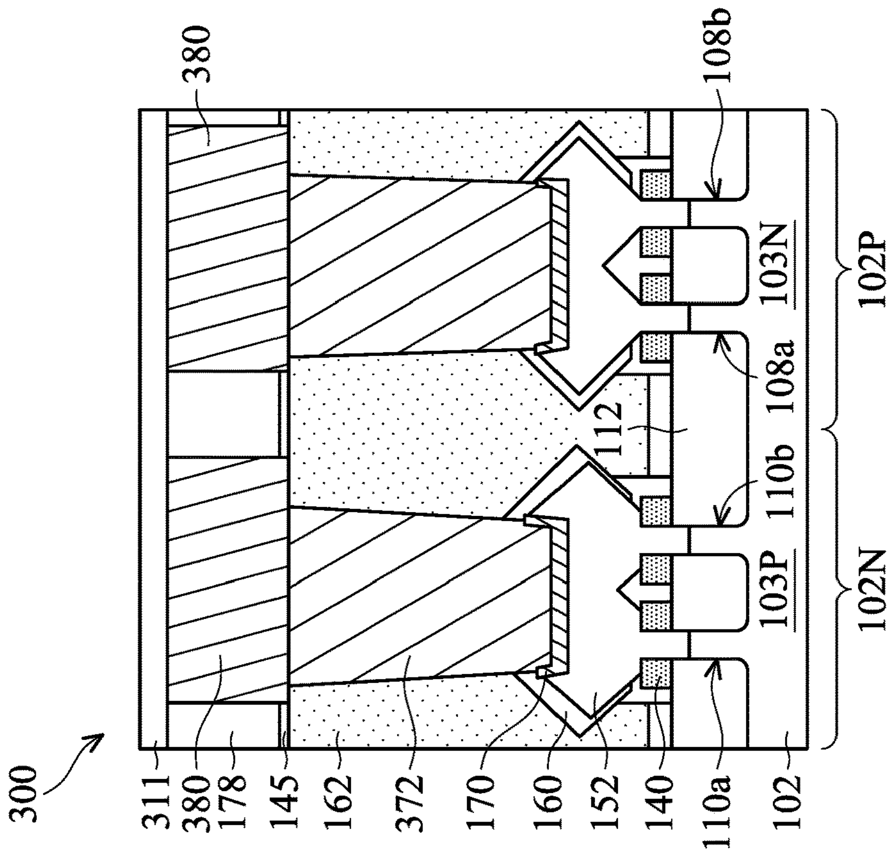
Figure 22B:
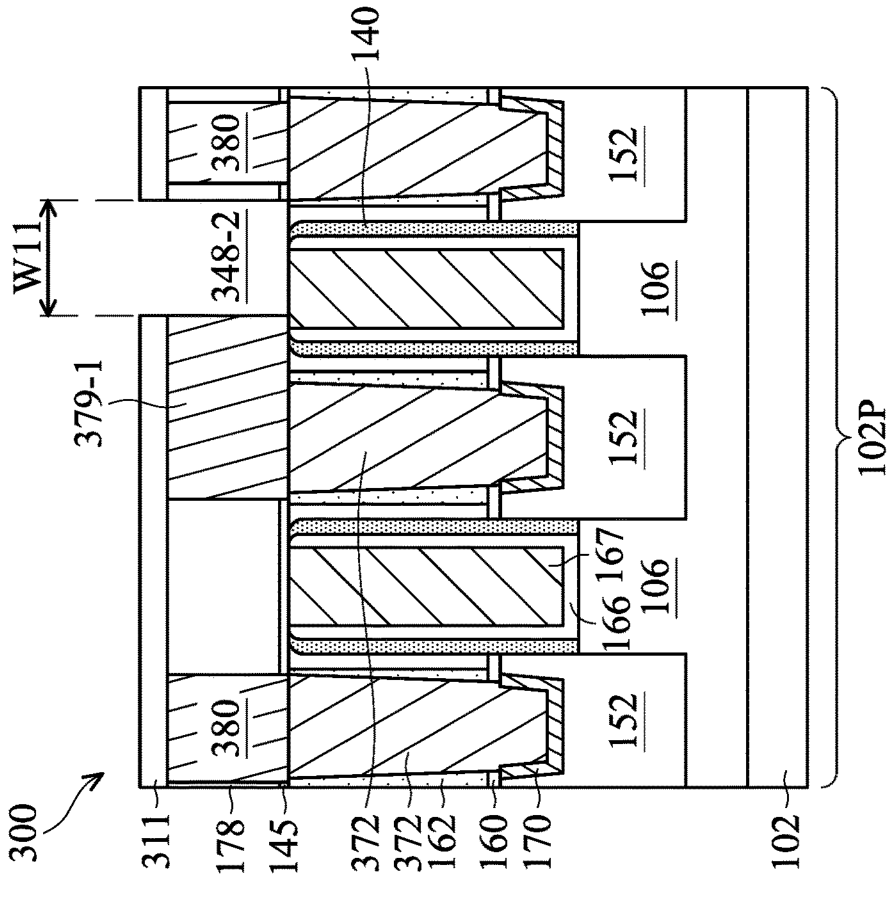
Figure 22C:
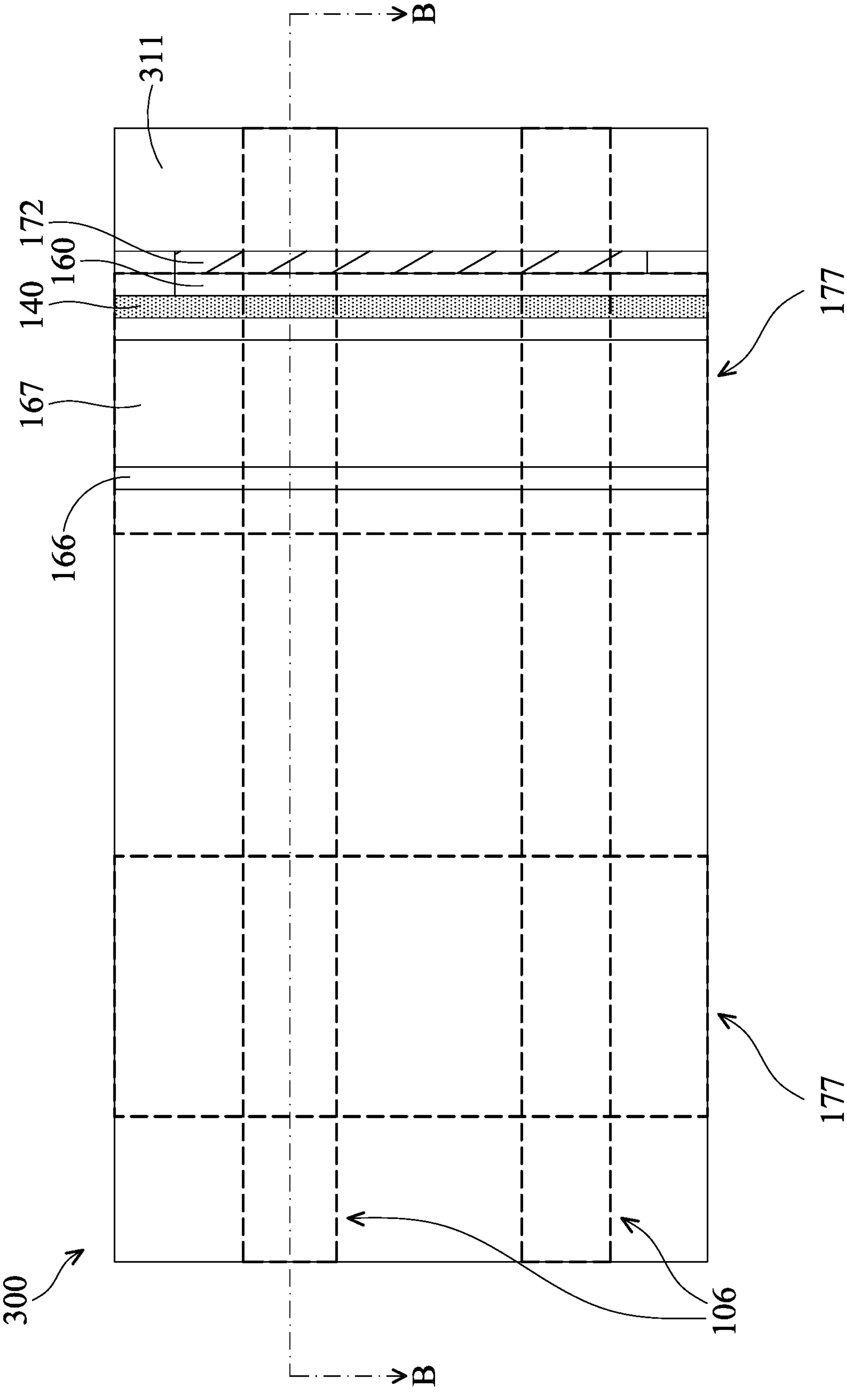

In FIGS. 22A-22C, a patterned layer 311 is formed on the semiconductor device structure 300. The patterned layer 311 has openings at locations aligned with the replacement gate structure 177 and adjacent the first half of butted contacts 379-1. An etch process is then performed, using the patterned layer 311 as a mask, to form second half of butted contact openings 348-2. The second half of butted contact openings 348-2 may have a width W11. The width W11 of the second half of butted contact openings 348-2 and the width W9 of the first half of butted contact openings 348-1 substantially equal to the width W12 of the final butted contacts 379 (FIG. 23B). The width W11 may vary depending on the width W9 of the first half of butted contact openings 348-1. In some embodiments, the width W11 is about 30% to about 50% of the width W12 of the final butted contacts 379 (FIG. 23B). The second half of butted contact openings 348-2 expose the top surfaces of the CESL 160, the gate spacer 140, the gate dielectric layer 166, and the gate electrode layer 167. In some embodiments, the second half of butted contact openings 348-2 expose the top surfaces of the first ILD 162, the CESL 160, the gate spacer 140, the gate dielectric layer 166, and the gate electrode layer 167. The second half of butted contact openings 348-2 may be formed using any suitable lithography process.

The etch process may be RIE or other suitable anisotropic etch process. The etchant is selective so that it removes portions of the third ILD 178 and the etch stop layer 145 without substantially removing the first half of butted contact 379-1. Upon formation of the second half of butted contact openings 348-2, the patterned layer may be removed using any suitable process, such as an ash process.

Figure 23A:
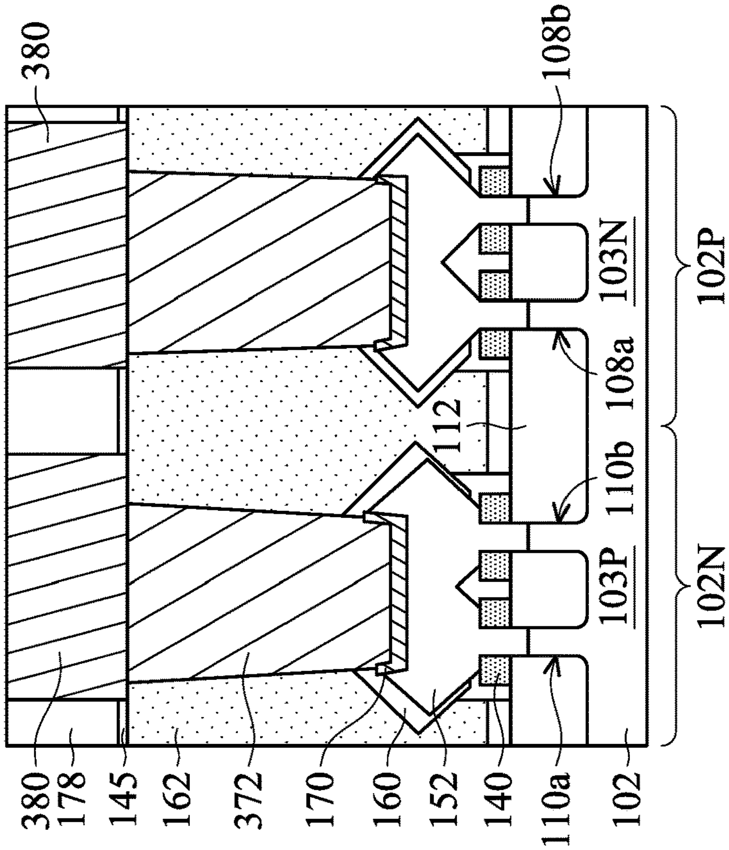
Figure 23B:
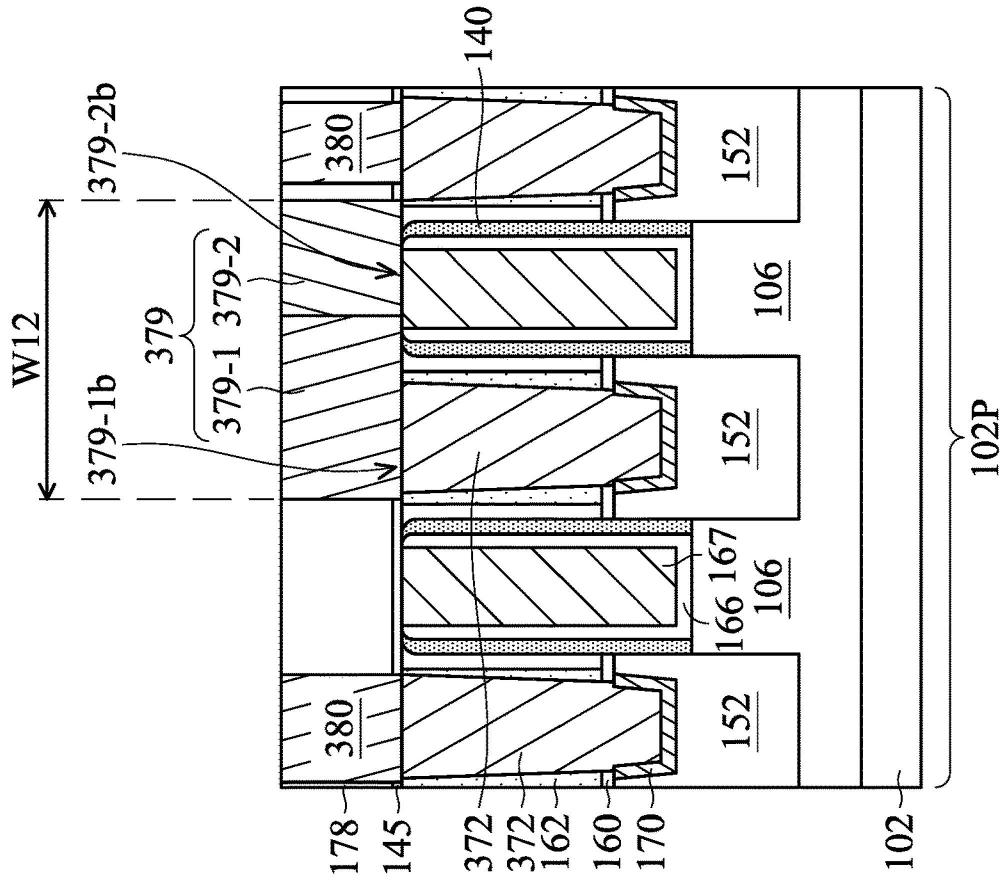
Figure 23C:
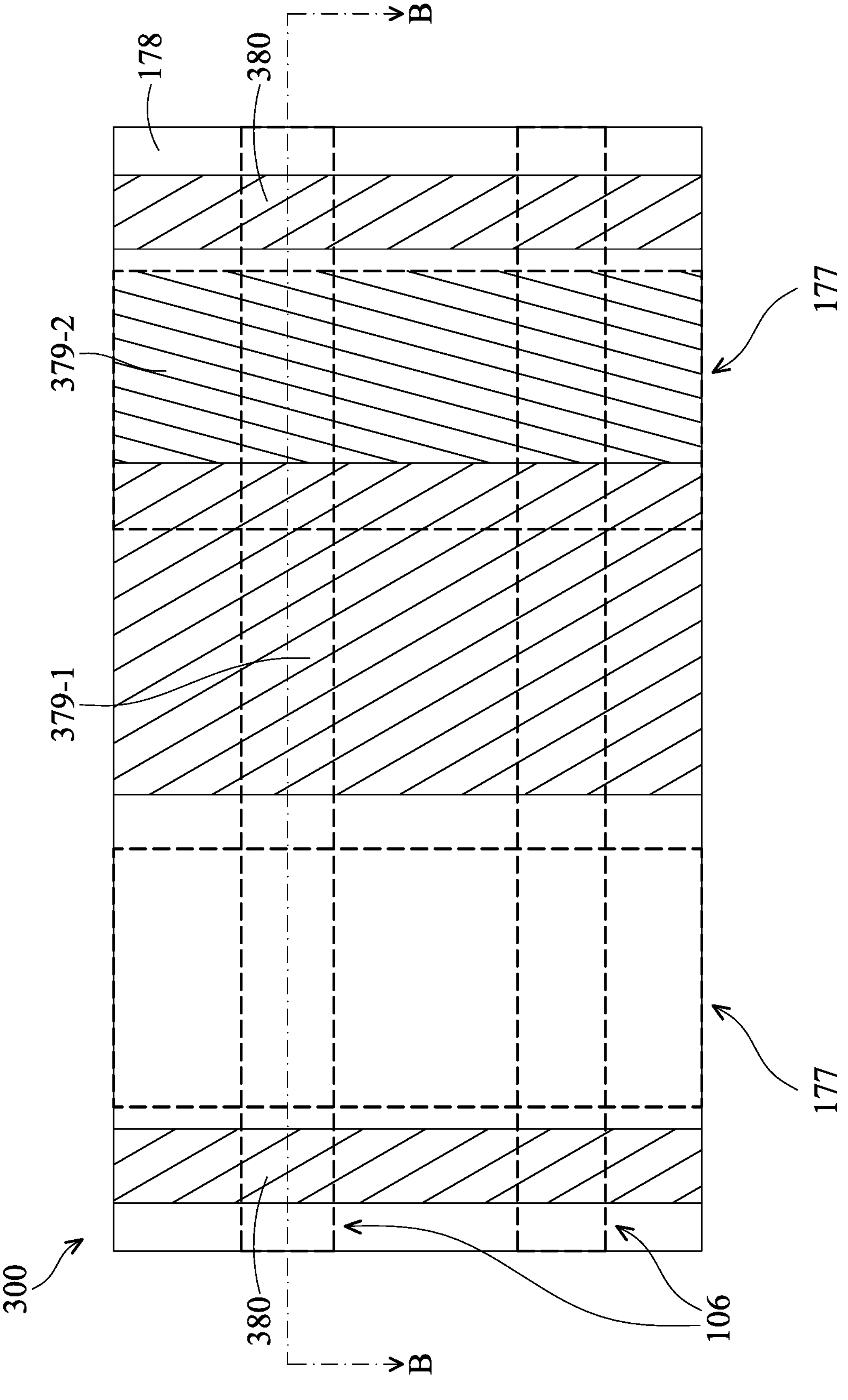

In FIGS. 23A-23C, second half of butted contacts 379-2 are formed in the second half of butted contact openings 348-2. Once the second half of butted contacts 379-2 are formed, a planarization process, such as CMP, is performed on the semiconductor device structure 300 until the top surface of the third ILD 178 is exposed. The second half of butted contacts 379-2 may include the same material as the conductive features 372. The second half of butted contacts 379-2 may include an electrically conductive material, such as one or more of W, Co, Al, Pt, Ni, Ag, Ru, Cu, Ti, Ta, TiN, TaN, RuCo, Ru-alloy, Cu-alloy, W-alloy, Mo-alloy, or any suitable low-R metal. In some embodiments, the first half of butted contacts 379-1 and the second half of butted contacts 379-2 include a material chemically different than the conductive features 372. In some embodiments, the first half of butted contacts 379-1 and the second half of butted contacts 379-2 include a material chemically different from each other, as the embodiment shown in FIG. 23B. In some embodiments, the first half of butted contacts 379-1 and the second half of butted contacts 379-2 include the same material, as the alternative embodiment shown in FIG. 25. In some exemplary embodiment, the first half of butted contacts 379-1 and the conductive features 372 include the same material, and the second half of butted contacts 379-2 include a material different than the first half of butted contacts 379-1. In some exemplary embodiment, the first half of butted contacts 379-1 and the conductive features 372 include different materials, and the second half of butted contacts 379-2 include a material different than the first half of butted contacts 379-1. In some exemplary embodiment, the first half of butted contacts 379-1 and the conductive features 372 include different materials, and the second half of butted contacts 379-2 include the same material as the conductive features 372. In some embodiments, a conductive barrier layer may be disposed prior to forming the butted contacts 379.

In any case, the butted contacts 379, which includes first and second half of butted contacts 379-1, 379-2, electrically connect the conductive features 372 (e.g., S/D contacts for the epitaxial S/D features 152) to the gate electrode layer 167. The via contact features 380 serve as metal contacts for connecting to the epitaxial S/D features 152 through S/D contacts (e.g., conductive features 372). The butted contacts 379 rides across two conductive regions of the semiconductor device structure 300, such as a source/drain region of a first transistor and a gate region of a second transistor. The butted contact 379 abuts two conductive regions and can significantly reduce the number of contacts needed.

The first half of butted contacts 379-1 has a bottom surface **379-1*b* landing on the top surfaces of the conductive features 372, the CESL 160, the first ILD 162, the gate spacer 140, and the gate dielectric layer 166. The second half of butted contacts 379-2 has a bottom surface 379-2*b* landing on the top surfaces of the gate electrode layer 167, the gate dielectric layer 166, the gate spacer 140, the CESL 160, and optionally the first ILD 162. The bottom surfaces 379-1*b*, 379-2*b* of the butted contact 379, the top surfaces of the conductive features 372, the CESL 160, the first ILD 162, the gate spacer 140, and the gate dielectric layer 166 are substantially co-planar. Likewise, the top surfaces of the via contact features 380, the first and second half of butted contacts 379-1, 379-2 are substantially co-planar. Therefore, the butted contacts 379 and the via contact features 380 are at same height. The butted contacts 379 enlarge contact surface area of the S/D contacts, which in turn reduces contact resistance for the transistor devices. In addition, since the top surface of the conductive features 372 and the top surface of the gate electrode layer 167 are co-planar, the parasitic capacitance between the conductive features 372 and the gate electrode layer 167** is reduced.

Figure 24A:
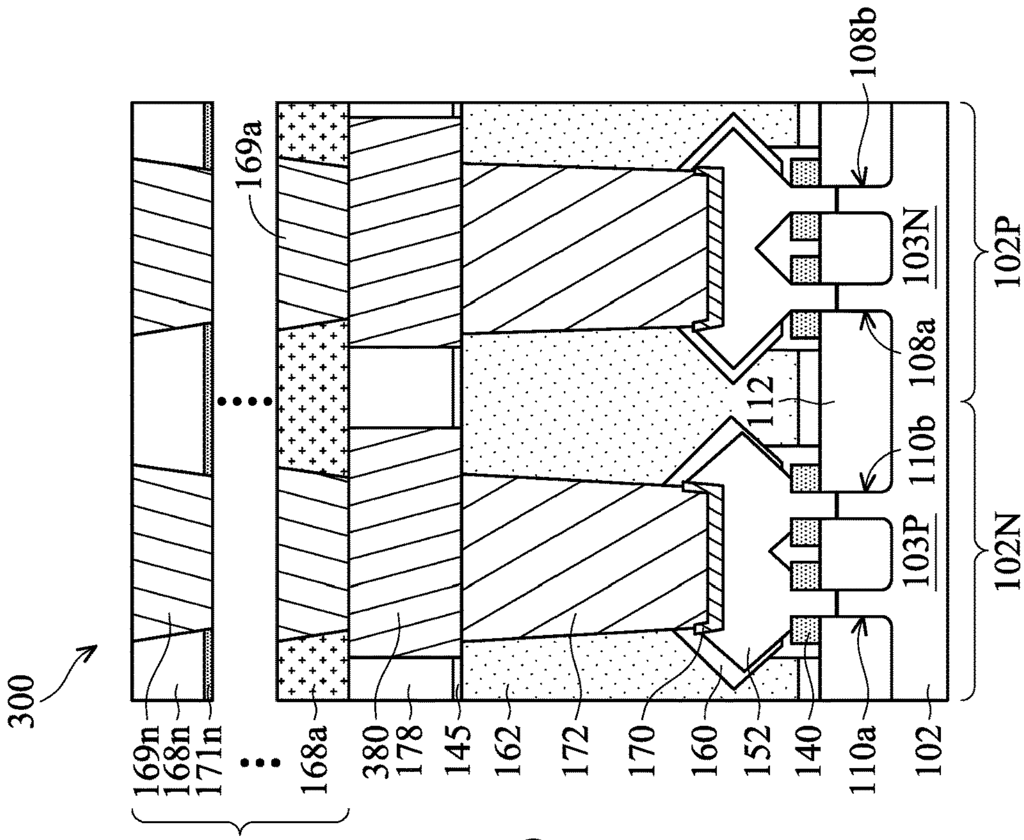
Figure 24B:
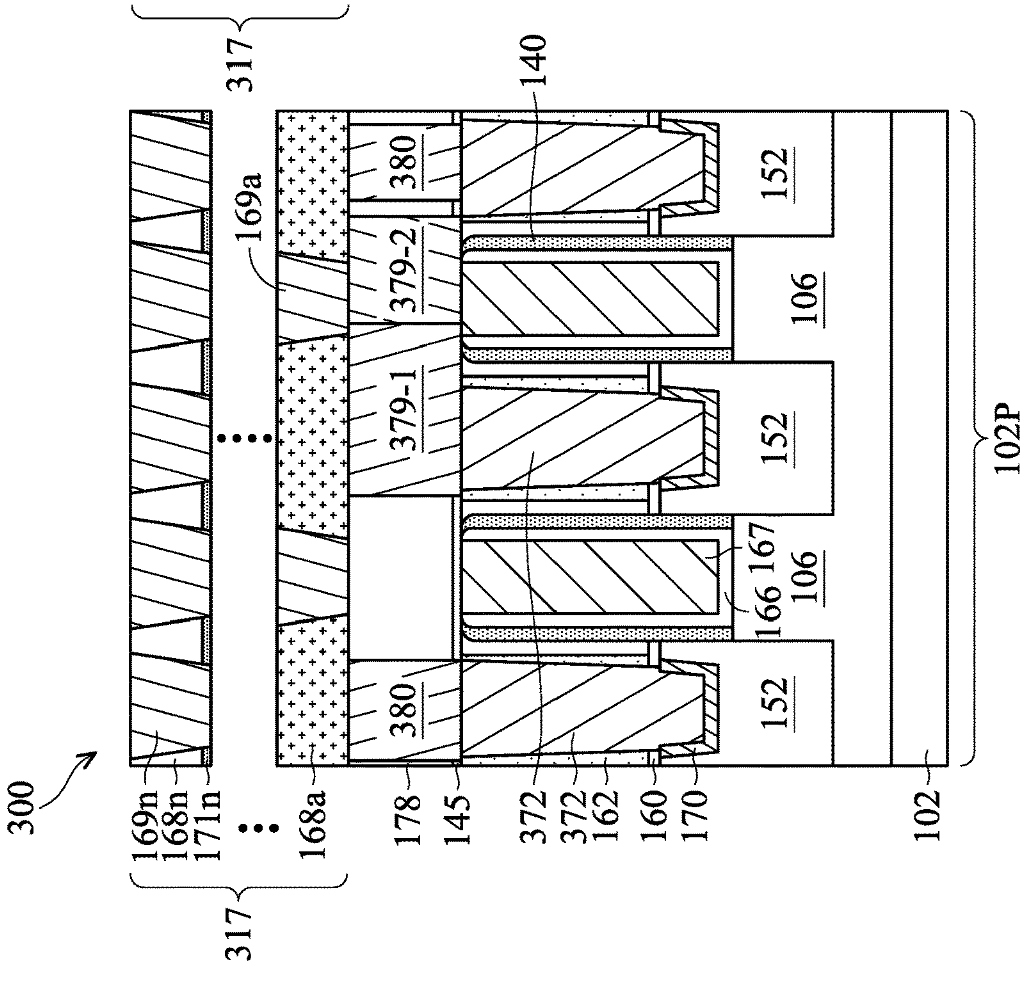

In FIGS. 24A-24B, an interconnect structure 317 is formed over the semiconductor device structure 300. The interconnect structure 317 may include the same features as the interconnect structure 117 and be deposited in a similar fashion as discussed above with respect to FIGS. 16A-16B.

Figure 25:
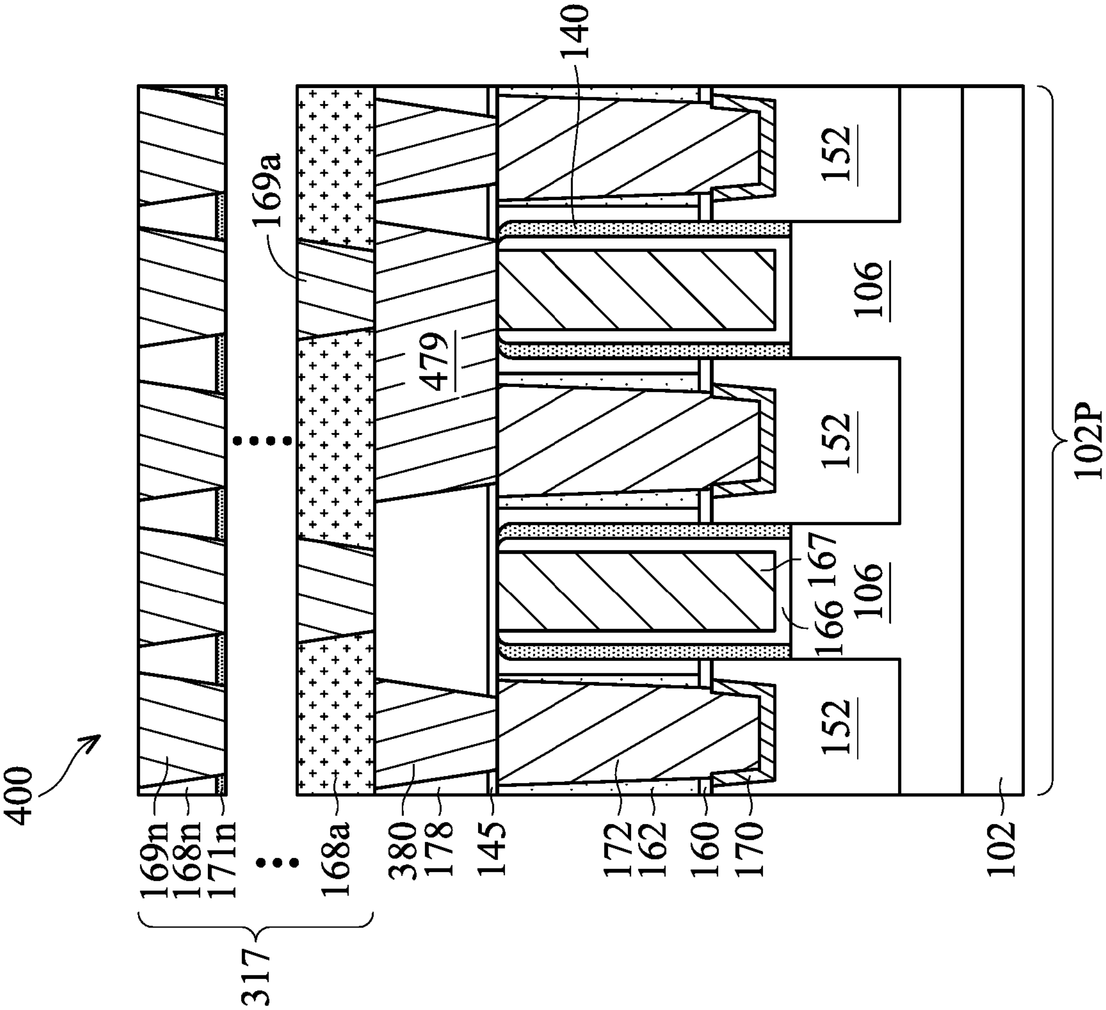
FIG. 25 illustrates a cross-sectional side view of a semiconductor device structure, in accordance with some alternative embodiments.

FIG. 25 illustrates a cross-sectional side view of a semiconductor device structure 400, in accordance with some alternative embodiments. The embodiment of FIG. 25 is substantially identical to the embodiment of FIG. 24B except that butted contacts 479 are formed of a single material different than the conductive features 372. The butted contact 479 may formed from the same material as the butted contact 379 as discussed above. The butted contact 479 may include a material chemically different than the material of the via contact feature 380.

Figure 26:
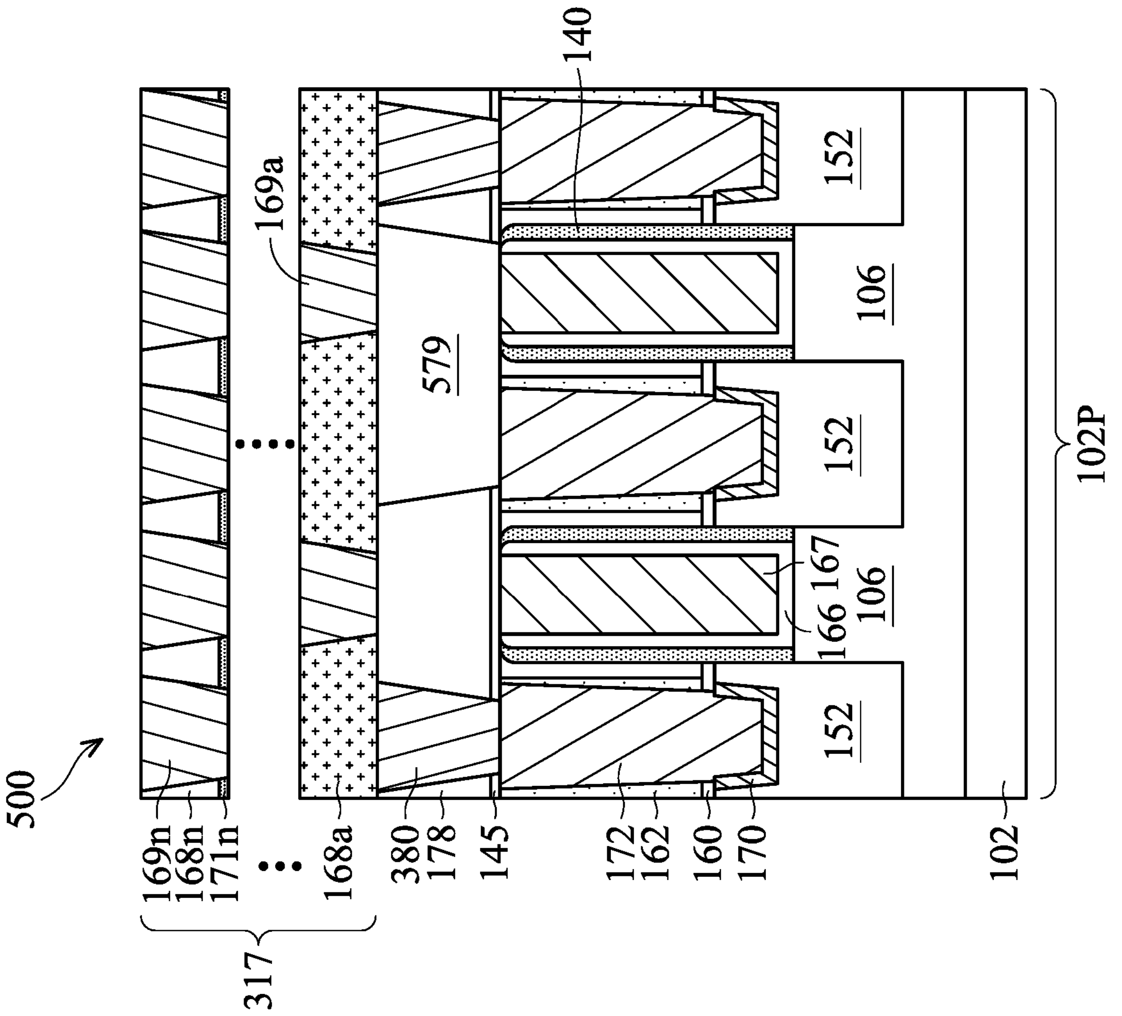
FIG. 26 illustrates a cross-sectional side view of a semiconductor device structure, in accordance with some alternative embodiments.

FIG. 26 illustrates a cross-sectional side view of a semiconductor device structure 500, in accordance with some alternative embodiments. The embodiment of FIG. 26 is substantially identical to the embodiment of FIG. 24B except that butted contacts 579 are formed of a single material different than the conductive features 372. The butted contact 579 may formed from the same material as the butted contact 379 as discussed above. In one embodiment, the butted contact 579 may include the same material as the via contact feature 380.

The present disclosure provides a semiconductor device structure with improved S/D contacts and butted contacts. The S/D contacts disposed between and in contact with epitaxial S/D features and the butted contacts have an L-shaped profile. The L-shaped S/D contacts and the butted contacts together increase contact surface area between two conductive regions of the semiconductor device structure, such as a source/drain region and a gate region. As a result, the S/D contact resistance of the semiconductor device structure is reduced. The butted contacts have the same height as via contacts which electrically connect to epitaxial S/D features through S/D contacts. Particularly, the butted contact has a bottom surface disposed in coplanar with top surfaces of the L-shaped conductive feature and the gate electrodes, thereby reducing parasitic capacitance between S/D contacts and gate contacts.

An embodiment is a semiconductor device structure. The structure includes a first source/drain feature, a first interlayer dielectric (ILD) disposed over the first source/drain feature, a first conductive feature extending through the first ILD and in electrical contact with the first source/drain feature, wherein the first conductive feature has an L-shaped profile with respect to a plain view of the semiconductor device structure. The structure further includes a gate electrode layer extending through the first ILD and disposed adjacent the first conductive feature, wherein a top surface of the first conductive feature and a top surface of the gate electrode layer are substantially co-planar.

Another embodiment is a semiconductor device structure. The structure includes a first source/drain feature disposed over a substrate, a butted contact disposed over the first source/drain feature. The butted contact includes a first portion comprising a first material, and a second portion comprising a second material. The structure also includes a first conductive feature disposed between the first source/drain feature and the first portion of the butted contact, and a gate electrode layer disposed adjacent the first conductive feature and in contact with the second portion of the butted contact.

A further embodiment is a method for forming a semiconductor device structure. The method includes providing first and second source/drain features on opposing sides of a gate structure, forming a first interlayer dielectric (ILD) over the first and second source/drain features, removing portions of the first ILD to form first and second contact openings, wherein the first contact opening has an L-shaped profile and is extended to expose portions of the first source/drain feature and the gate structure, and the second contact opening is extended to expose a portion of the second source/drain feature. The method also includes filling the first and second contact openings with a conductive material to form first and second conductive features, respectively, performing a planarization process so that top surfaces of the gate structure, the first conductive feature, and the second conductive feature are substantially co-planar. The method further includes forming a second ILD over the first ILD, removing portions of the second ILD to form a butted contact opening exposing the top surfaces of the first conductive feature and the gate structure, and filling the butted contact opening with one or more conductive materials to form a butted contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

providing first and second source/drain features on opposing sides of a gate structure;

forming a first interlayer dielectric (ILD) over the first and second source/drain features;

removing portions of the first ILD to form first and second contact openings, wherein the first contact opening has an L-shaped profile that exposes a portion of the first source/drain feature and a portion of a gate dielectric of the gate structure, and the second contact opening is extended to expose a portion of the second source/drain feature;

filling the first and second contact openings with a conductive material to form first and second conductive features, respectively, wherein the first conductive feature has a first portion in lateral contact with the gate dielectric and a second portion overlying the first source/drain feature;

performing a planarization process so that top surfaces of the gate structure, the first conductive feature, and the second conductive feature are substantially co-planar;

forming a second ILD over the first ILD;

removing portions of the second ILD to form a butted contact opening exposing the top surfaces of the first conductive feature and the gate structure; and filling the butted contact opening with one or more conductive materials to form a butted contact.

2. The method of claim 1, wherein the butted contact is formed by filling a first half of the butted contact opening with a first conductive material and filling a second half of the butted contact opening with a second conductive material.

3. The method of claim 2, further comprising:

removing portions of the second ILD to form a via contact opening exposing the top surface of the second conductive feature; and filling the via contact opening with a third conductive material.

4. A method of forming a semiconductor device structure, comprising:

forming a plurality of gate structures over a substrate;

forming a first contact etch stop layer and a first interlayer dielectric over the substrate and the gate structures;

forming contact openings through the first interlayer dielectric and the first contact etch stop layer to expose source/drain features, wherein the contact openings have an L-shaped profile that exposes a portion of the source/drain features and a portion of a gate dielectric of at least one gate structure;

filling the contact openings with a conductive material to form conductive features, wherein each conductive feature has a first portion in lateral contact with the gate dielectric and a second portion overlying the source/drain feature;

forming a third interlayer dielectric over the conductive features and the gate structures;

etching the third interlayer dielectric to form butted contact openings that concurrently expose a top surface of at least one conductive feature and a top surface of a gate electrode, wherein the butted contact openings are formed from an L-shaped opening defined by a single lithography and etching process; and forming a butted contact in the butted contact opening to electrically connect the conductive feature with the gate electrode.

5. The method of claim 4, wherein forming the butted contact comprises depositing a metal selected from W, Co, Al, Ru, or Cu.

6. The method of claim 4, wherein forming the contact openings comprises patterning the first interlayer dielectric to define an L-shaped contact profile.

7. The method of claim 4, further comprising:

forming a silicide layer between the conductive feature and the epitaxial source/drain feature.

8. The method of claim 4, wherein the butted contact and the conductive feature have coplanar upper surfaces.

9. The method of claim 4, wherein the butted contact extends across a source/drain region of a first transistor and a gate region of a second transistor.

10. The method of claim 4, wherein the contact openings have a first width (W1) at a top portion and a smaller width (W2) at a bottom portion, and W1:W2 is about 1.5:1 to 3:1.

11. The method of claim 4, wherein the butted contact and a via contact are formed to a same height above the third interlayer dielectric.

12. A method of manufacturing a semiconductor device structure, comprising:

forming a plurality of transistors each having a gate structure and a source/drain feature;

forming a first dielectric stack comprising a contact etch-stop layer and a first interlayer dielectric over the transistors;

etching the first dielectric stack to form L-shaped openings exposing portions of the source/drain features and a portion of a gate dielectric of an adjacent gate structure;

forming conductive features in the L-shaped openings such that each conductive feature comprises a first portion in lateral contact with the gate dielectric adjacent the gate structure and a second portion overlying the source/drain feature;

planarizing the conductive features and the first dielectric stack until top surfaces of the conductive features and gate electrodes are coplanar;

forming a second dielectric stack over the planarized structure;

etching the second dielectric stack to form butted-contact openings exposing both the top surfaces of the conductive features and the top surfaces of the gate electrodes; and filling the butted-contact openings with a conductive material to form butted contacts electrically coupling the conductive features and the gate electrodes.

13. The method of claim 12, wherein the conductive material of the butted contacts comprises W, Co, TiN, TaN, or a Ru—Co alloy.

14. The method of claim 12, wherein the first portion (153*a*) of each L-shaped opening has a first width (W3) and the second portion of each L-shaped opening has a second width (W4), and W3:W4 has a ratio of about 1.5:1 to 3:1.

15. The method of claim 12, further comprising:

forming a silicide interface between each conductive feature and its corresponding source/drain feature.

16. The method of claim 12, wherein a portion of the conductive feature laterally contacts the gate dielectric.

17. The method of claim 12, wherein forming the butted contacts and via contacts comprises performing a same metallization process followed by chemical-mechanical polishing.

18. The method of claim 12, wherein the butted contact overlaps both a gate electrode and a source/drain contact within a single lithography pattern.

19. The method of claim 12, wherein the butted contacts and the conductive features reduce parasitic capacitance between the source/drain regions and the gate electrodes.

20. The method of claim 12, further comprising:

forming an interconnect structure comprising inter-metal dielectric layers and conductive vias overlying the butted contacts.

* * * * *